US009954156B2

(12) United States Patent
Jogia

(10) Patent No.: US 9,954,156 B2
(45) Date of Patent: Apr. 24, 2018

(54) BODY HEAT POWERED WIRELESS TRANSMITTER

(71) Applicant: Paresh Jogia, Bedfordshire (GB)

(72) Inventor: Paresh Jogia, Bedfordshire (GB)

( * ) Notice: Subject to any disclaimer, the term of this patent is extended or adjusted under 35 U.S.C. 154(b) by 0 days.

(21) Appl. No.: 14/795,848

(22) Filed: Jul. 9, 2015

(65) Prior Publication Data

US 2017/0012193 A1 Jan. 12, 2017

(51) Int. Cl.

| | |
|---|---|
| ***H01Q 11/12*** | (2006.01) |
| ***H04B 1/04*** | (2006.01) |
| ***H01L 35/30*** | (2006.01) |
| ***H02J 7/02*** | (2016.01) |
| ***H02J 50/05*** | (2016.01) |
| ***H02J 50/00*** | (2016.01) |
| ***H02N 11/00*** | (2006.01) |
| ***H04B 1/3827*** | (2015.01) |
| *H02M 1/00* | (2006.01) |

(52) U.S. Cl.

CPC .............. *H01L 35/30* (2013.01); *H02J 7/025* (2013.01); *H02J 50/00* (2016.02); *H02J 50/05* (2016.02); *H02N 11/00* (2013.01); *H04B 1/385* (2013.01); *H02M 2001/0006* (2013.01)

(58) Field of Classification Search

CPC ......... H01L 35/30; H01L 35/28; H02N 11/00; H04B 1/385; H04B 5/0037

See application file for complete search history.

(56) References Cited

U.S. PATENT DOCUMENTS

| | | | | |
|---|---|---|---|---|
| 2008/0299904 A1* | 12/2008 | Yi | H01Q 7/06 | 455/41.1 |
| 2014/0103728 A1* | 4/2014 | Shrivastava | H02M 3/1582 | 307/80 |
| 2014/0299169 A1* | 10/2014 | Schneider | H01L 35/02 | 136/201 |
| 2015/0288179 A1* | 10/2015 | Pearson | B60R 16/033 | 307/9.1 |
| 2015/0365003 A1* | 12/2015 | Sadwick | H02M 3/28 | 363/21.01 |
| 2016/0211742 A1* | 7/2016 | Mohammad | H02J 1/10 | |

* cited by examiner

*Primary Examiner* — Nguyen Vo

(74) *Attorney, Agent, or Firm* — Invention To Patent Services; Alex Hobson

(57) ABSTRACT

A Body Heat Powered Portable Wireless Transmitter contains a Thermo Electric Generator, an energy Harvesting System, a Control System and a Wireless Transmitter. The Wireless transmission medium could include but not exhaustively, RF, Ultrasonic or Infrared. The application can range from a keyfob transmitter or a Remote Keyless Entry (RKE) System for a car, an infrared remote control for a TV or Hi-Fi or a person location device which can be worn around the wrist like a watch to allow hospital staff to track Alzheimer's patients, allow parents to track their children, detect trapped people from the effects of earthquakes and Tsunamis or an RF ID tag for security purposes. The device can also be used for sensor applications (Wireless Data Capture) such as a fitness tracker or health monitor such as a wireless ECG (Electrocardiogram) monitor to collect patient vitals and wirelessly transmit the data to hospital staff.

16 Claims, 45 Drawing Sheets

BODY HEAT POWERED WIRELESS TRANSMITTER

CROSS REFERENCE TO RELATED APPLICATIONS

This application claims the benefit of and priority to Great Britain patent application no. GB1412249.3, filed on Jul. 9, 2015; the entirety of which is incorporated by reference herein.

FIELD OF THE INVENTION

The present invention concerns, inter alia, improvements in and relating to the power supplies of wireless transmitters and improvements in and relating to portable energy harvesting systems for electrical appliances.

BACKGROUND

All modern portable electronic devices will drain their batteries at some point and either require replacing or re-charging. Attempts to utilize ambient energy by way of energy harvesting systems have not been completely successful. The reasons include the fact that the energy is not available all of the time, such as solar or kinetic. Also by the limitation of the minimum 'Turn On' voltage of Silicon transistors which are required for the mass production for use within these devices or the many thousands of transistors within the microprocessor integrated circuit which is limited to 0.7 Volts. Germanium transistors are an alternative as they have a 'Turn On' voltage of around 0.3 Volts. However, they are not so readily available and do not lend themselves easily to mass produced integrated circuits (IC) unlike Silicon which is widely used in today's world. The term Threshold Voltage is used to define the 'Turn On' or 'Turn Off' voltage of transistors.

There are several types of Silicon transistors, the Bipolar Junction Transistor (BJT) and the FET (Field Effect Transistor) being the popular ones. JFETs and MOSFETs (Metal Oxide Field Effect Transistor) are part of the FET family. FETs are different from bipolar transistors in that they have a very high input (Gate) impedance and hence are voltage controlled devices. That is they require a certain voltage to operate but negligible current to drive them rather than Bipolar transistors which require a relatively high current to drive them as they are current controlled devices. FETs are therefore ideal for low power or energy harvesting applications due to their high input impedance and negligible input (Gate) drive current.

Most popular electronic systems use Enhancement Mode MOSFETs due these factors for portable battery powered systems to high power switching applications as they can behave like almost an ideal switch and have a low RDS(On) (Drain Source Resistance) of less than 1 Ohm ranging to just a few micro ohms. In particular they are used in integrated circuits which have thousands or millions of these devices for analogue and digital logic circuits such as microprocessors. The latter of which use a combination of N Channel and P Channel Enhancement Mode MOSFETS. The difference between them is that an N Channel device requires a positive voltage to turn them on while P Channel device requires a negative voltage to turn them on. They are referred to CMOS or Complimentary MOS where they are used together to switch from between low and high logic levels in digital logic integrated circuits and microprocessors. However Enhancement Mode MOSFETs, just like bipolar transistors made from silicon, have a minimum 'Turn On' voltage of 0.7 Volts.

Recent attempts have been made to harness electrical energy from ambient energy below these voltages by way of the use of a Depletion Mode FET (Field Effect Transistor) in combination with a step up transformer to form an oscillator to boost the input voltage and charge a capacitor. The capacitor is then used as a power source for the energy harvested powered system. Due to the low IDSS (Drain Source Current) and the relatively high RDS (On), (Drain Source Resistance) of the Depletion Mode FET although outputs of several volts can be achieved, the output power is limited due to the limited current.

There are two types of Depletion Mode FETs: i) the JFET (Junction Field Effect Transistor); and II) the Depletion Mode MOSFET (Metal Oxide Semiconductor Field Effect Transistor). Depletion Mode devices are different from the common Enhancement Mode device as they are 'On' by default, acting like a resistor which limits current. In the case of an N Channel JFET, the current is increased by applying a positive voltage across the Gate and Source, or 'Turn Off' the device by applying a negative voltage across the Gate and Source of the device. The reverse is true for a P Channel device while the device is still 'On' by default. P Channel devices have holes as majority carriers compared to N Channel devices which have electrons hence N Channel Devices are twice as efficient. FIG. 1 shows the FET family free. A JFET is the simplest form of Field Effect Transistor and can be used as an electronically-controlled switch or as a voltage-controlled resistance. Here described is the behaviour based on an N Channel JFET as shown in FIG. 2.

When there is zero voltage applied across the Gate (G) and Source (S) of the N Channel JFET, some current flows through the Drain (D) and Source. However, the resistance across the Gate and Source is relatively high and some current flows. This is called the Zero Gate Voltage Drain Current IDSS. As a positive voltage is applied to the Gate, the resistance drops and allows more current to flow called 'RDS(On)'. If we reverse the voltage such that there is a negative voltage between the Gate and Source, then the N Channel JFET will stop current from flowing between the Drain and Source. The point at which this happens is called the Gate Source Cutoff Voltage 'VGS(Off)'. All JFETs therefore have some key operating specifications. For example a typical, cheap easily available N Channel JFET such as a J106 has the following specification: IDSS=200 mA (0.2 Amps) at a VDS of 15 Volts (Drain Source Voltage); RDS(On)=6 Ohms; VGS(Off)=−2 to −6 Volts.

It can be seen from the J106 JFET specification that when there is no Gate signal applied, the IDSS is very low, even with a Drain Source Voltage of 15 Volts. A Depletion Mode MOSFET has similar performance characteristics to the JFET.

Recent attempts have been made utilizing a Depletion Mode MOSFETs or JFETs in combination with a step up transformer to harness ambient energy that provides voltages below 0.7 Volts. Due to the low IDSS and the relatively high RDS (On) although outputs of several volts can be achieved, the output power is limited due to the limited current. One example is a prior art system comprising of an energy harvesting integrated circuit (IC) LTC1308 by Linear Technology Corporation of 1630 McCarthy Blvd. Milpitas, Calif. 95035-7417 as shown in FIG. 3. Here, the harvested energy from the ambient source is captured to charge a small capacitor to up to 3.3 Volts. Here, the ambient source is from a Thermo Electric Generator (TEG) in the form of a Peltier module. The key technology is the step up transformer of a ratio of 1:100 in combination with an N Channel Depletion Mode MOSFET within the LTC3108 integrated circuit which acts like an oscillator to charge a small capacitor which is then used as a power source.

The charger circuit is based on a Forward Converter design. Usually for a Forward Converter an external pulse stream is provided at the Gate of the FET. However, due to the low input voltage, as the N Channel Depletion Mode MOSFET is on at zero volts, when a low voltage is applied, the secondary steps it up by 100 to give around 2 Volts increasing the drain current until again there is an oscillation where the FET turns OFF and ON. The capacitor 'C2' is part of a resonant tank circuit between the inductance of the transformer secondary windings, and the input Gate Source capacitance of the FET. This is to allow the oscillating frequency to be towards the self-oscillating frequency of the transformer to allow it to perform at its optimum. The 2 volts or so is also then used as the output to charge the storage capacitor 'Court' via the de-coupling capacitor 'C1' and the rectifier circuits in the LTC3108 IC. The de-coupling capacitor 'C1' in combination with the internal diode across the 'C1' terminal and ground of the LTC3108 is used to bring the voltage from the secondary windings positive as the transformer output is an alternating sinusoid on a zero volt axis. The internal rectification and decision making circuits of the LTC3108 decide when to charge the capacitor 'Cout' and send a signal to an external microprocessor to inform it that the capacitor is charged and hence it can send data. The device is asserted to have an RDS (On) of 0.5 ohms. The application of the device is limited to remote wireless sensor systems as the charged capacitor is then used as a power source to capture data from sensors, process through a microprocessor and send the data.

FIG. 4 shows using the LTC3108 for a heat based energy harvesting system for a remote wireless sensor application. Here a TEG outputs a voltage of less than 0.1 Volts. The charge time of the capacitor terminated at 'VOUT' based on the step up transformer ratio is shown in FIG. 5, it can be seen that any data transmission is therefore not instantaneous as the capacitor requires some time to charge first before it can then be used as a power source for the wireless sensor system. The energy harvesting solution provided by Linear Technology Inc. in the LIC3108 is deemed to be the industries best and coined the phrase 'The Missing Link for Energy Harvesting Applications'. However, the charger circuit arrangement using a Depletion Mode MOSFET or a JFET in combination with a step up transformer is common. For a Depletion Mode FET, the output power is limited. This solution is impressive as the processing is done using a single IC device. However, the IC is expensive, requires a specific type of step up transformer and requires that the system developer use their device which in turn provides a limited output power that is not instantaneous. It therefore would take hours as a larger capacitor would be needed to be charged so as to send larger amounts of data over a longer range for example.

It is possible to build a discrete energy harvesting system using readily available cheap JFETs such as the J106 N Channel JFET and a step up transformer to perform the step up from less than 0.1 Volts to 3.3 Volts. Hence a LIC3108 would not be required. Any further decision making or power processing circuits to power a microprocessor can then be done using other ICs available on the market. However, the energy harvesting circuit power output would again be limited due to the low IDSS and relatively high RDS(On).

One such example is the ECT310 by Enocean GmbH of Kolpingrin 18a, D-82041 Oberhaching, Germany. This is a module containing discrete components and the same 1:100 ratio step up transformer, the LPR6235-752SMLB by Coilcraft Inc. of 1102 Silver Lake Road, Cary Ill. 60013, USA which is used for the LTC3108 example described in FIG. 4. It is used as a thermal energy powered energy harvester which works with a peltier module. The ECT310 can operate from 20 mV relating to a 2 Kelvin temperature difference provided by the Peltier module. The 20 mV operating voltage is also the same as the example described in the LTC3108 based system of FIG. 4. The ECT310 module is designed for use with wireless sensor networks and restricts use to only the Enocean radio protocol. To this end the ECT310 module can only be used with Enocean's own wireless sensor system such as the STM300 or STM 312 radio module. The Enocean radio module would wake up every 2 minutes to transmit a telegram which requires approximately 5 micro watts, (0.000005 watts) once the ECT310 module has charged a small capacitor between 3 to 5 Volts. Hence the power is limited for small bursts of data of only 5 microwatts every two minutes and not instantaneous data output which would require significantly greater power output.

It is also possible to use recently available Zero Threshold MOSFETs instead. They potentially have many advantages in energy harvesting applications due to their zero threshold voltage and hence can start operating without a need for a step up transformer. However, presently, they are depletion mode MOSFETS. Therefore they would serve the same purpose as the JFET or standard Depletion Mode MOSFET in terms of power output. Their output is significantly less than Enhancement Mode MOSFETs due to their higher RDS.

U.S.Pat. No. 2002074898 (A1) discloses a 'Self-powered wireless switch' powered by a piezo electric switch driving an RF transmitter. A paper written by Joseph A. Paradiso and Mark Feldmeier entitled 'A Compact, Wireless, Self-Powered Pushbutton Controller' shows the same circuit in more detail used for the application for an RF ID Tag. Here a piezo element is struck by way of a piezo electric switch which generates 2000 volts similar to a cigarette lighter. This is then stepped down through a step down transformer and charges a 4.4 μF (micro Farad) capacitor that is regulated to 3 Volts and then encoded by a 12-bit encoder IC, HT12E before being transmitted using an RF (Radio Frequency) transmitter. This is illustrated in FIG. 6. The output is instantaneous, however there are similar limitations for both patent US 2002074898 (A1)) and the paper entitled 'A Compact, Wireless, Self-Powered Pushbutton Controller'. Firstly it requires the pressing of a piezo electric switch to generate the electrical power which will wear over time. Secondly, the output power is limited in that it can only charge a 4.4 μF (micro Farad) Capacitor to power an encoder and a RF transmitter to 3 Volts, and transmit a 12-bit digital code sequence for a limited 30 ms (Milliseconds). Graphs of the capacitor voltage after striking the piezo electric switch and the transmission are illustrated in FIG. 7.

For the ID tag application it is aimed for, it has limitations due to the limited 12-bit digital code sequence (due to the frequency limitations and the 30 ms transmit time available) which means only 4096 codes can be obtained. These codes can only be programmed by hard wiring each of the encoders in 4096 separate units. The button also needs to be pressed to enable it to operate.

SUMMARY OF THE INVENTION

The summary of the invention is provided as a general introduction to some of the embodiments of the invention, and is not intended to be limiting. Additional example embodiments including variations and alternative configurations of the invention are provided herein.

According to a first aspect of the present invention there is provided a body heat powered wireless transmitter that comprises: a wireless transmitter; a Thermo Electric Generator (TEG) to harness a users body heat such as, for example, heat from the user's hand, wrist or palm and convert the body heat to electrical energy; and an energy harvesting system to process the electrical energy to power the wireless transmitter to send data via, RF, Infra-Red, Ultrasonic or other transmission medium, wherein the energy harvesting system comprises a low power energy harvesting circuit and a high power energy harvesting circuit.

The low power energy harvesting circuit is configured to operate at a lower power level than the high power energy harvesting circuit, driving or triggering the high power energy harvesting circuit for operation. In preferred embodiments the low power energy harvesting circuit is configured to operate at a power level that is at least ten times lower than that of the high power energy harvesting circuit and particularly preferably of the order of 100 times lower than that of the high power energy harvesting circuit. Each of the low power energy harvesting circuit and the high power energy harvesting circuit suitably comprise at least one Field Effect Transistor (FET) respectively and the power level of each energy harvesting circuit may be assessed by the RDSon (Source Drain Resistance when switched ON) for the Field Effect Transistor (FET) in the respective energy harvesting circuit. As an example, the RDSon for the FET of the low power energy harvesting circuit may be of the order of 1 Ohm while that of the high power energy harvesting circuit is of the order of 0.1 Ohms and below and preferably of the order of 0.005 Ohms or less. The electrical energy from the TEG is processed first via the low power energy harvesting circuit and then via the high power energy harvesting circuit.

The transmitter may for example be a car keyfob, a part of a Remote Keyless Entry (RKE) System, a 'keyless go' an RFID tag or a person location tracker or a remote control. The transmitter itself can be RF, Infra-Red or Ultrasonic for example. The device does not require any batteries or charging up over time and can enable instantaneous transmission of data by way of the energy harnessed by the user's body heat. The device can be a single switch transmitter or can self-start automatically when a heat source is present allowing electrical energy to already be stored to power a multifunction remote control or an automatically powering a transmitter for a person location device or an ID Tag. The device can also harness energy from power sources less than 20 mV as the users hand may be cold for example when handling a keyfob remote control for example.

The system preferably comprises a control system which is powered by the high power energy harvesting system. The system comprises a transmitter which is powered by the high power energy harvesting system. The system preferably comprises en Infra-Red, RF or Ultrasonic transducer.

The device preferably has one or more Peltier modules as Thermo Electric Generators (TEG). A Thermo Electric Generator (TEG) is suitably incorporated in an arm band or other wearable band to convert the heat from the user's body heat to electricity.

Particularly preferably the low power energy harvesting circuit comprises one or more Depletion Mode Field Effect Transistors, one or more Enhancement Mode Metal Oxide Semiconductor Field Effect Transistors and one or more step up transformers.

The low power energy harvesting circuit suitably has one or more Depletion Mode Field Effect Transistors or one or more Junction Field Effect Transistors and one or more step up transformers to form an oscillator. Preferably the low power energy harvesting circuit comprises a step up transformer whose core is of a high relative permeability between 5000 and 20,000.

Preferably the high power energy harvesting circuit comprises one or more Enhancement Mode Metal Oxide Semiconductor Field Effect Transistors. Furthermore preferably the high power energy harvesting circuit comprises one or more of: a step up transformer; a flyback transformer, and an inductor. The oscillator of the low power energy harvesting circuit suitably drives the Enhancement Mode Metal Oxide Semiconductor Field Effect Transistor of the high power energy harvesting circuit. In turn the Enhancement Mode Metal Oxide Semiconductor Field Effect Transistor can switch a said step up transformer to serve as a forward converter and/or said flyback transformer to serve as a flyback converter and/or said inductor to serve as a boost converter Preferably the high power energy harvesting circuit comprises a step up transformer whose core is of a high relative permeability between 5000 and 20,000. Preferably the high power energy harvesting circuit comprises a flyback transformer whose core is of a high relative permeability of at least 20,000. Preferably the high power energy harvesting circuit comprises an inductor whose core is of a high relative permeability of at least 80,000. Preferably the high relative permeability core used is Nanoperm® nanocrystalline magnetic alloy or Metglas® amorphous magnetic alloy.

The system preferably has a high power energy harvesting system comprising a step up transformer and an Enhancement Mode MOSFET configured as a 'Forward Converter' which is triggered by the either a switch or a low power energy harvesting system. Once triggered, the high power energy harvesting system then can function off its own accord without the need for the switch or the low power energy harvesting system.

Alternatively, the system has a high power energy harvesting system comprising a step up transformer and an Enhancement Mode MOSFET configured as a 'Forward Converter' or a 'Flyback Converter' with the gate of the Enhancement Mode MOSFET driven by the low power energy harvesting system.

Alternatively, the system has a high power energy harvesting system comprising an inductor and an Enhancement Mode MOSFET configured in as a 'Boost Converter' with the gate of the Enhancement Mode MOSFET driven by the low power energy harvesting system.

The Low Power Energy Harvesting circuit preferably also comprises one or more Enhancement Mode Metal Oxide Field Effect Transistors. A single one may be used to trigger the Enhancement Mode Metal Oxide Field Effect Transistor within the High Power Energy Harvesting circuit which switches a step up transformer for a forward converter.

One or more further Enhancement Mode Metal Oxide Field Effect Transistor(s) within the Low Power Energy Harvesting circuit is/are used to create a square wave oscillator. This may have adjustable pulse width and duty cycle above 50% with output voltages above 1 Volt peak to peak. In this arrangement the Low Power Energy Harvesting circuit, which may comprise a Depletion Mode Field Effect Transistor and step up transformer forming an oscillator, is suitably used as a forward converter. This may charge a small capacitor to voltages above Volt DC (Direct Current) to provide a power source for the square wave oscillator. The square wave oscillator within the Low Power Energy Harvesting circuit may then be used to drive an Enhancement Mode Metal Oxide Field Effect Transistor within the High Power Energy Harvesting circuit which switches a flyback transformer for a flyback converter or for an inductor for a boost converter.

The output may then be stored in a Storage Element. The Storage Element may be in the form of a capacitor. The storage element is chosen to meet the energy and voltage requirements of the application. This may then be regulated by a Power Regulation circuit to of the Energy Harvesting system to ensure the output voltage of the Energy Harvesting system is stable for the desired application.

The energy harvesting system itself has a number of unique features and is highly sensitive and efficient and may have applications other than as a wireless transmitter.

Presently a Thermo Electric Generator in the form of a Peltier module sized to fit in the arm band (typically 40 mm×40 mm by 3 mm) would only generate typically about 0.1 Volt based on the from the temperature difference created by the users body heat on one side. However, the TEG has very low resistance from less than 1 Ohm to a few Ohms. This means that although it can generate less than 0.1 volt, the output current is quite high. Using the enhanced energy harvesting system of the present invention, it is therefore possible to utilise this to generate enough power to directly power or charge the battery within an MP3 player or mobile phone. A mobile phone or mp3 player arm band may be used as the wearable band.

It could be also incorporated inside the housing of various portable electrical devices such as mobile phones, MP3 players. When housed within an MP3 player or mobile phone, using a Thermo Electric Generator, the electrical energy could also be drawn from the heat while in the users pocket or when held in their hand.

Another example use is to power a torch which could either be handheld type or a head worn type. Here the heat from the users head can be harvested. This type of head torch could be used by miners for example where a power point to charge a conventional rechargeable battery powered version would not be available underground for example.

The present invention addresses many of the afore-mentioned short-comings of the prior art. It has utility inter aim for RFID tags and personal location trackers and enhances the perceived ‘portability’ of portable electronic devices in general. The present invention makes use of zero carbon components that are easily and cheaply obtainable within its design and recyclable components that are easily and freely obtainable. The present invention still further provides significant improvements to an existing Integrated Circuit based energy harvesting system deemed the industries best and provides a new Energy Harvesting integrated Circuit. The present invention further provides improved Energy Harvesting Systems in general and can be used in applications for powering or charging batteries of portable products such as MP3 players and mobile phones by body heat.

According to a further aspect of the present invention there is provided a portable body heat powered energy harvesting device that comprises: a Thermo Electric Generator (TEG) to harness a user’s body heat such as, for example, heat from the user’s hand, wrist or palm and convert the body heat to electrical energy and an energy harvesting system to process the electrical energy to charge or directly power a portable electrical appliance, wherein the energy harvesting system comprises a low power energy harvesting circuit and a high power energy harvesting circuit.

A summary of some primary benefits of the system of the present invention include but are not limited to: i) Zero Carbon (no batteries required); ii) Zero maintenance (no moving parts for the energy harvesting system—only standard switches used and only if required, e.g. for RF and Infra-Red remote controllers); iii) Compensates for variations or intermittent availability of voltage of energy source (such as cold hands, or unit on table before user touches it); iv) High power output; v) Instantaneous power in <1 second from touch of users body, e.g. to switch remote controls from input voltages <0.1 Volt (a key fob or TV remote can be instantly energised sufficiently to transmit a signal just by the user’s hand holding it in the act of picking it up); vi) Highly efficient (Harnessing of voltages of less than 20 mV (0.02 Volts); vii) Key technology can be assembled of standard readily available mass produced cheap components (Peltiers usually used for heating and cooling applications, Enhancement Mode MOSFETs, Standard Depletion Mode MOSFETs and Standard low power JFETs, disposable camera photoflash transformers which can be obtained freely from photo developers); viii) Small Form Factor (complete electronics system can be housed within existing battery powered enclosures, such as car keyfob remote, Remote Keyless Entry (RKE) System, TV Infra-Red Remote Control or RF ID Tag); ix) Manufacturability (can be manufactured using either through hole or surface mount technology (SMT) and Proposal for an energy harvesting Integrated Circuit (IC) which can be mass produced on standard Silicon Process foundries; and x) Lifetime (Lasts the lifetime of the electronic components contained within the system).

BRIEF DESCRIPTION OF SEVERAL VIEWS OF THE DRAWINGS

The present invention will now be described in greater detail, in the following detailed description, with reference to the drawings, in which.

DETAILED DESCRIPTION OF THE ILLUSTRATED EMBODIMENTS

Figure 1:
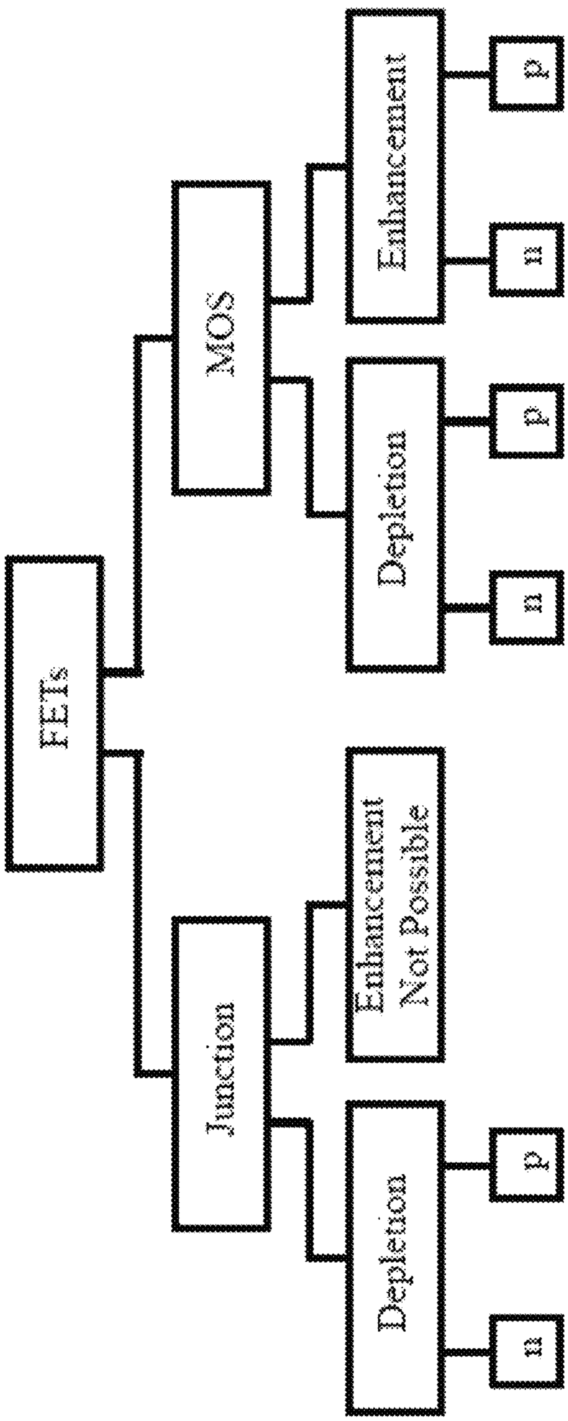
FIG. 1 illustrates the FET family tree.
Figure 2:
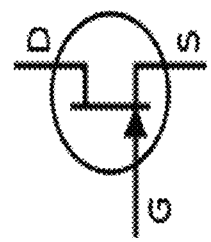
FIG. 2 illustrates an N Channel JFET.
Figure 3:
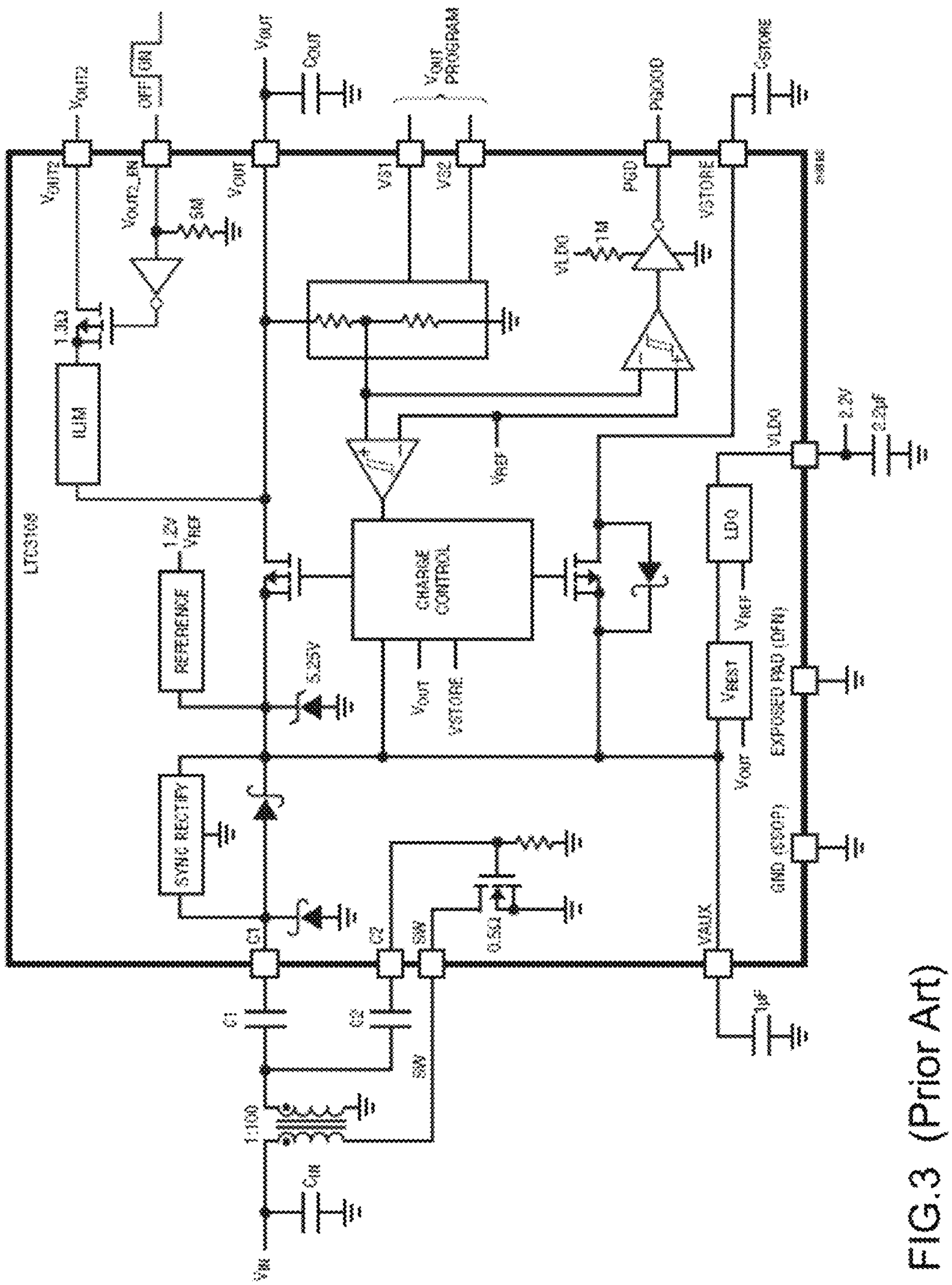
FIG. 3 illustrates a prior art energy harvesting system.
Figure 4:
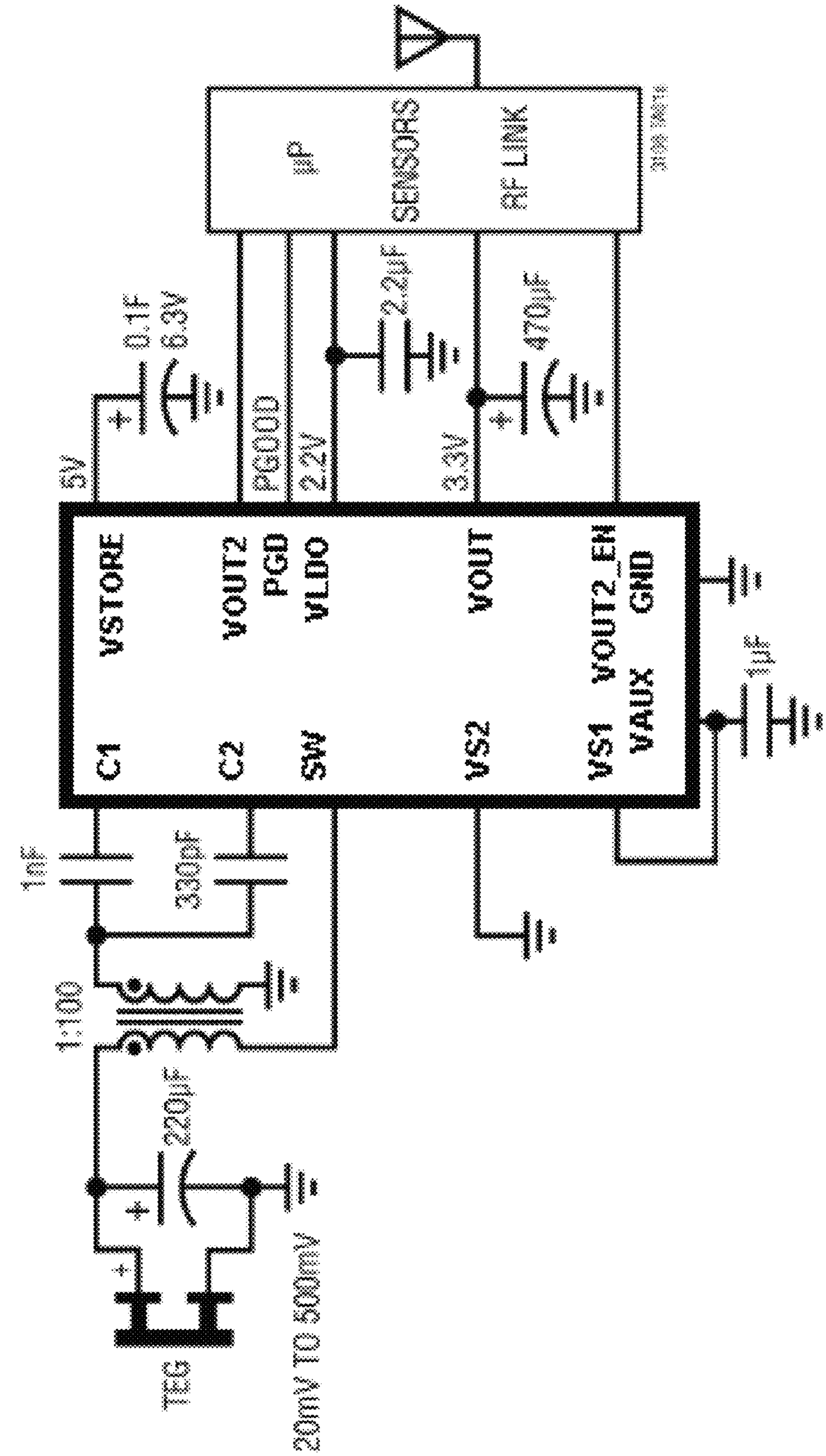
FIG. 4 illustrates a wireless sensor application utilizing the energy harvesting system of the prior art illustrated in FIG. 3.
Figure 5:
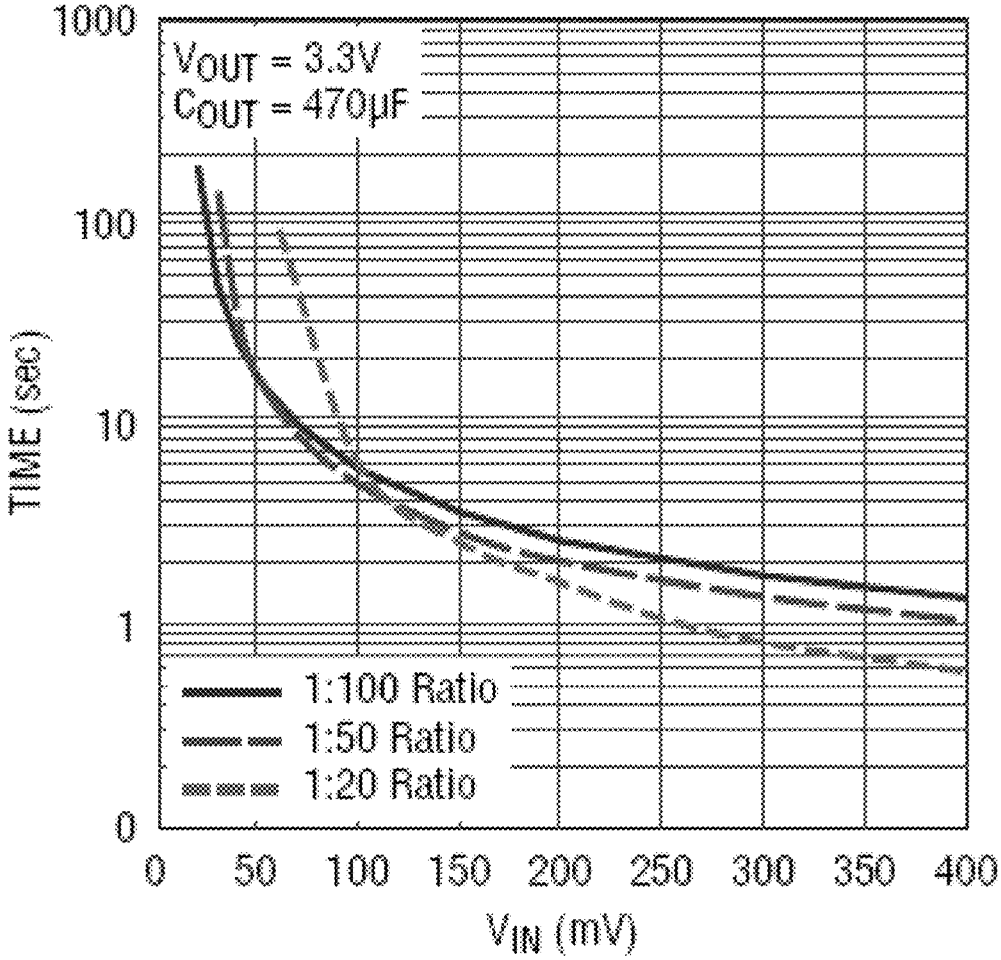
FIG. 5 illustrates the capacitor charge rate of the energy harvesting system illustrated in FIG. 4.

Certain exemplary embodiments of the present invention are described herein and are illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

Summary of the Problems

There are several issues that have obstructed development of practical portable electronic systems able to be reliably powered from body heat. These include 1) The system device needs to fit into the form factor of existing battery powered units. The best choice at present is to use a Peltier unit of between 20 mm square and 40 mm square. However, the available voltage is 100 mV maximum for the 40 mm square unit. For the smaller unit it is 40 mV maximum. This will go to less than 20 mV during warm ambient temperatures,
2) Power needs to be readily available for the user, for example, keyfob remote, Remote Keyless Entry (RKE) System, TV Infra-Red remote, person location unit or RF ID Tag.
3) The user may not have the unit in contact with their body all of the time.
4) Standard Silicon Transistors have can produce high power output but their Threshold voltage of >0.7 Volts
5) Depletion Mode Field Effect Transistors in combination with a step up transformer can allow voltages <0.1 volts but due to their high RDS(On) the output power is limited and may take minutes or hours to charge a capacitor which is later used as the power source for the unit.

I have examined what is available on the market in terms of a low voltage energy harvesting system and an alternative energy harvesting medium to the body powered one. Their performance can be adequate for limited purposes, however, they all have major flaws and drawbacks:

LTC3108 IC based Energy Harvesting System Problems

Requires key technologies to function—Requires use of specially developed low ROS (0.5 Ohms) Depletion Mode N channel MOSFET within the Integrated Circuit—Specially selected step up transformer—Non instantaneous power—Takes time to charge a capacitor to then use as a power supply. Power limitations—Limited to 20 mV input voltage Power is limited by the RDS(On) of the Depletion Mode N channel MOSFET—Application limited to remote wireless sensor data capture systems due to non-instantaneous power Expensive (several pounds sterling) and SMT technology only.

Piezo Powered Wireless Switch Problems

Requires the user to control a switch and not useful for a person location device. Size and Complexity—Even as a remote controller, an identical complete system (containing another piezo switch, encoder, rectifier etc.) would need to be produced for control of additional functions. Security limitations—as an RF ID tag, the system is limited to transmitting a 12 bit code for 30 ms, limiting the security of the code and also the number of combinations (limited to 2^12=4096). Lifetime—The piezo element is likely to become worn after time compared to standard switches and may need expensive replacement.

System Overview of the Present Invention

Figure 8:
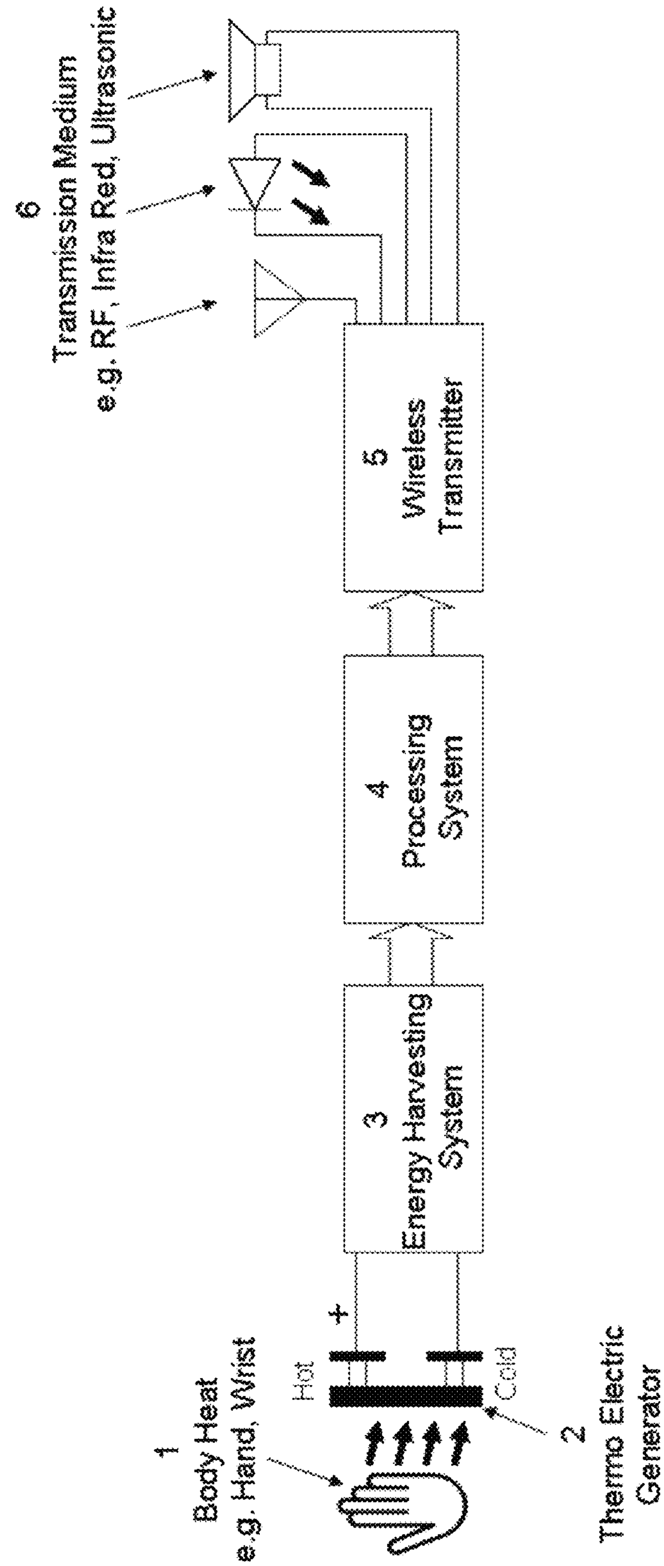
FIG. 8 is a simplified system overview of the Body Heat Powered Wireless Transmitter of the present invention.
Figure 9:
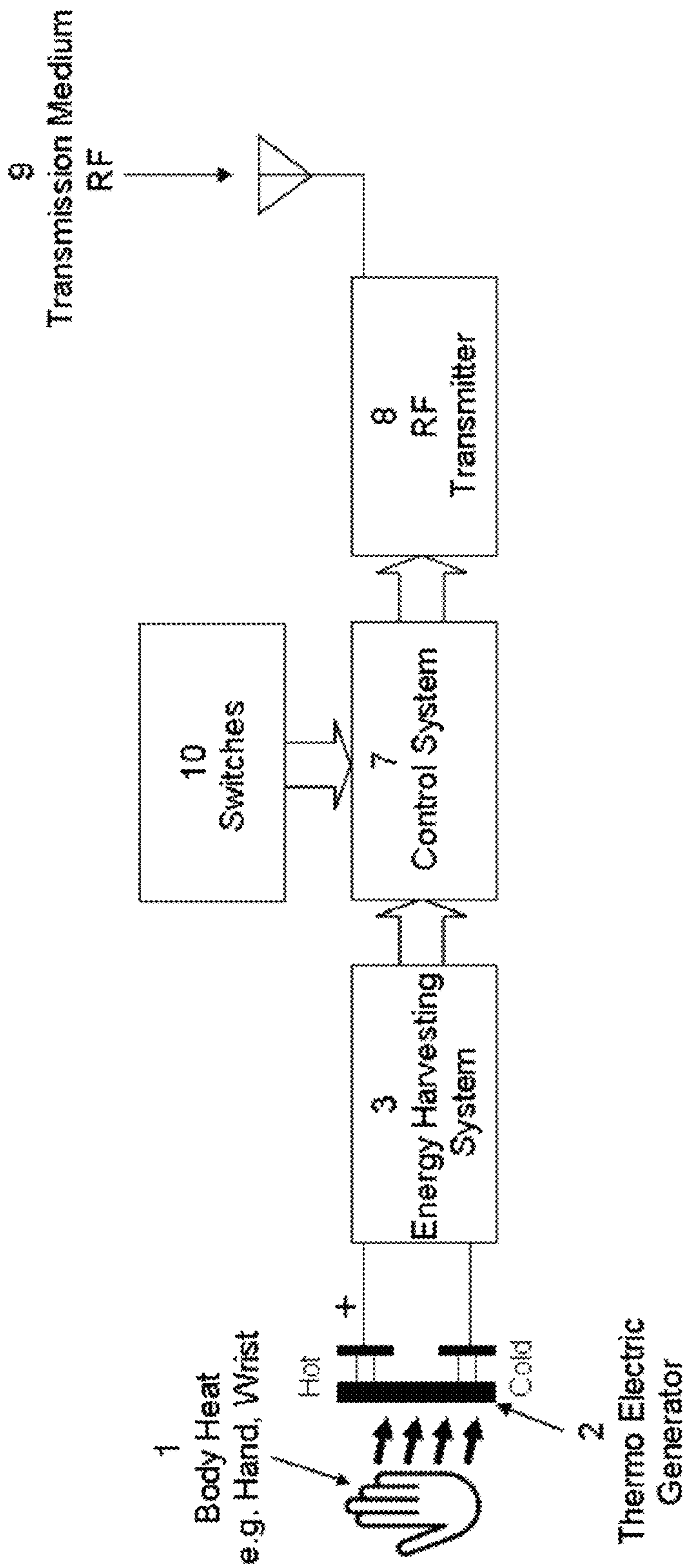
FIG. 9 is a simplified system overview of a Body Heat Powered Wireless RF Remote Control Transmitter.
Figure 10:
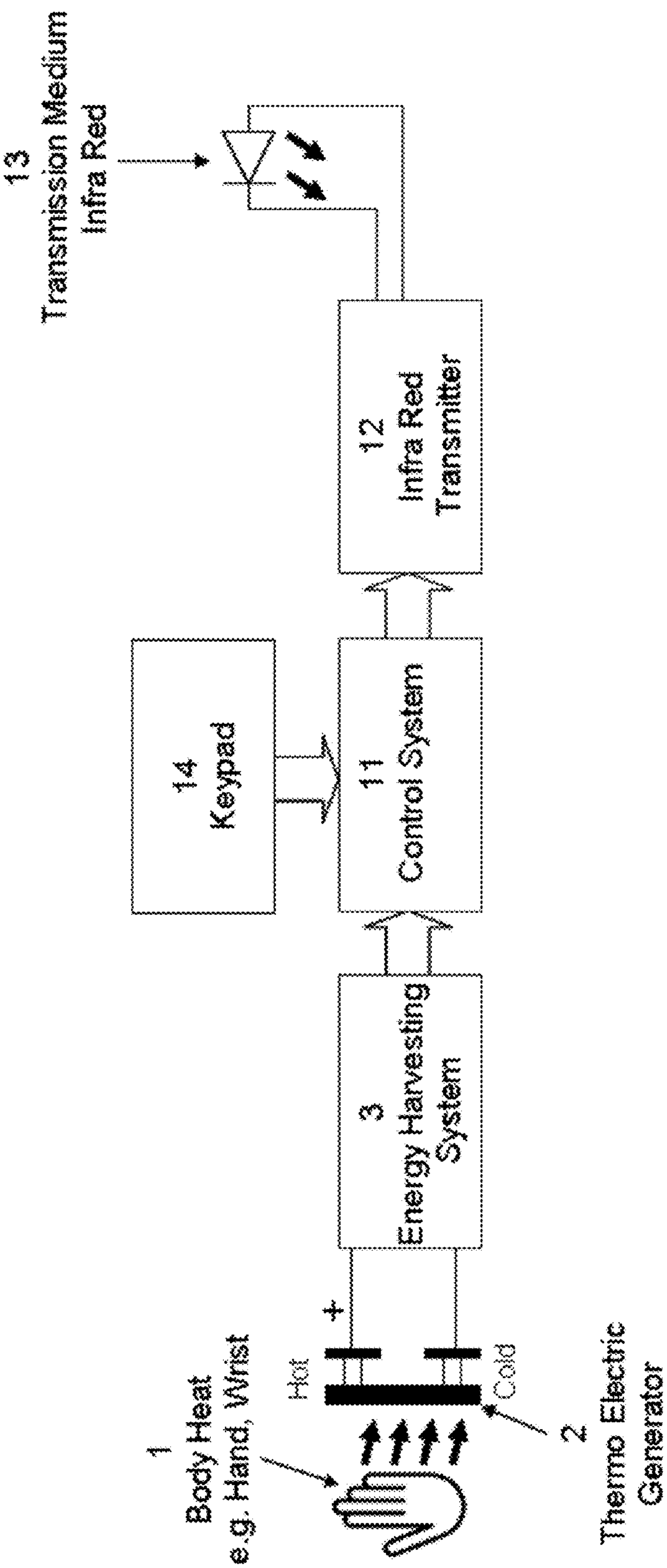
FIG. 10 is a simplified system overview of a Body Heat Powered Wireless infra-Red (IR) Remote Control.
Figure 11:
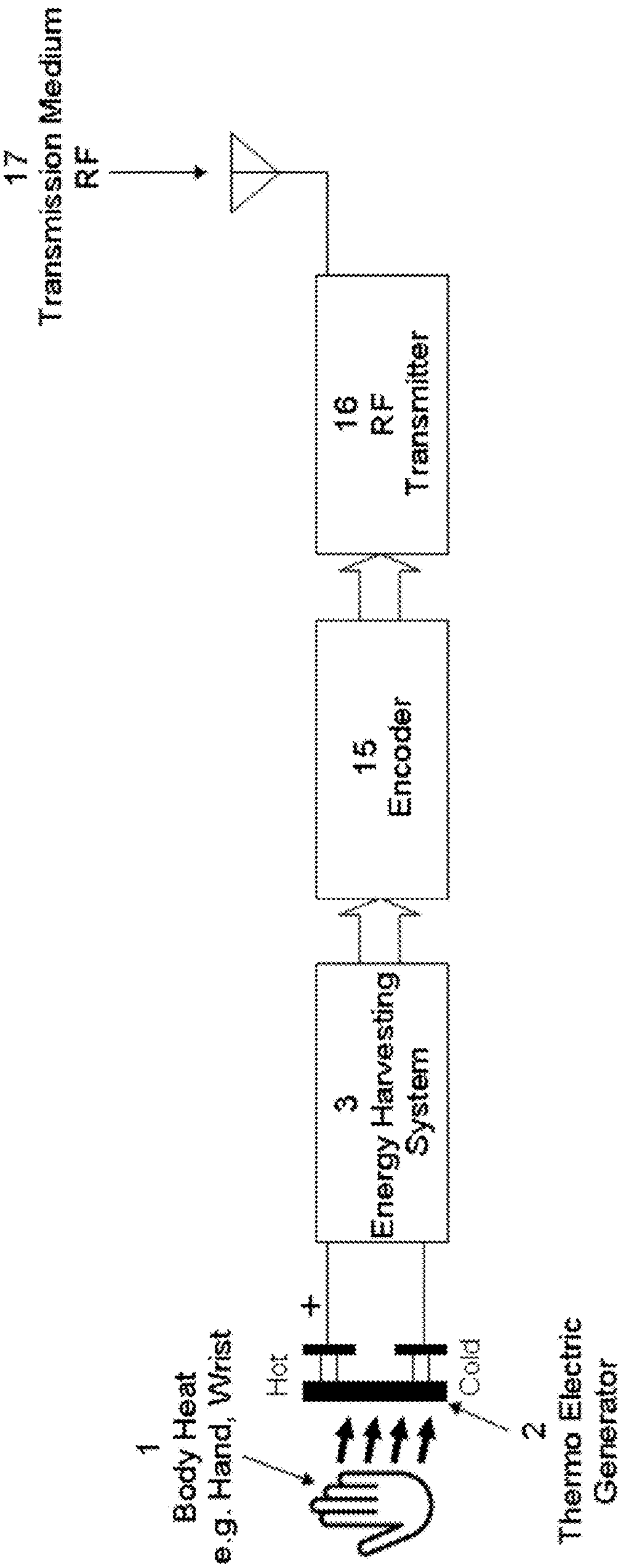
FIG. 11 is a simplified system overview of a Body Heat Powered RF ID Tag.
Figure 12:
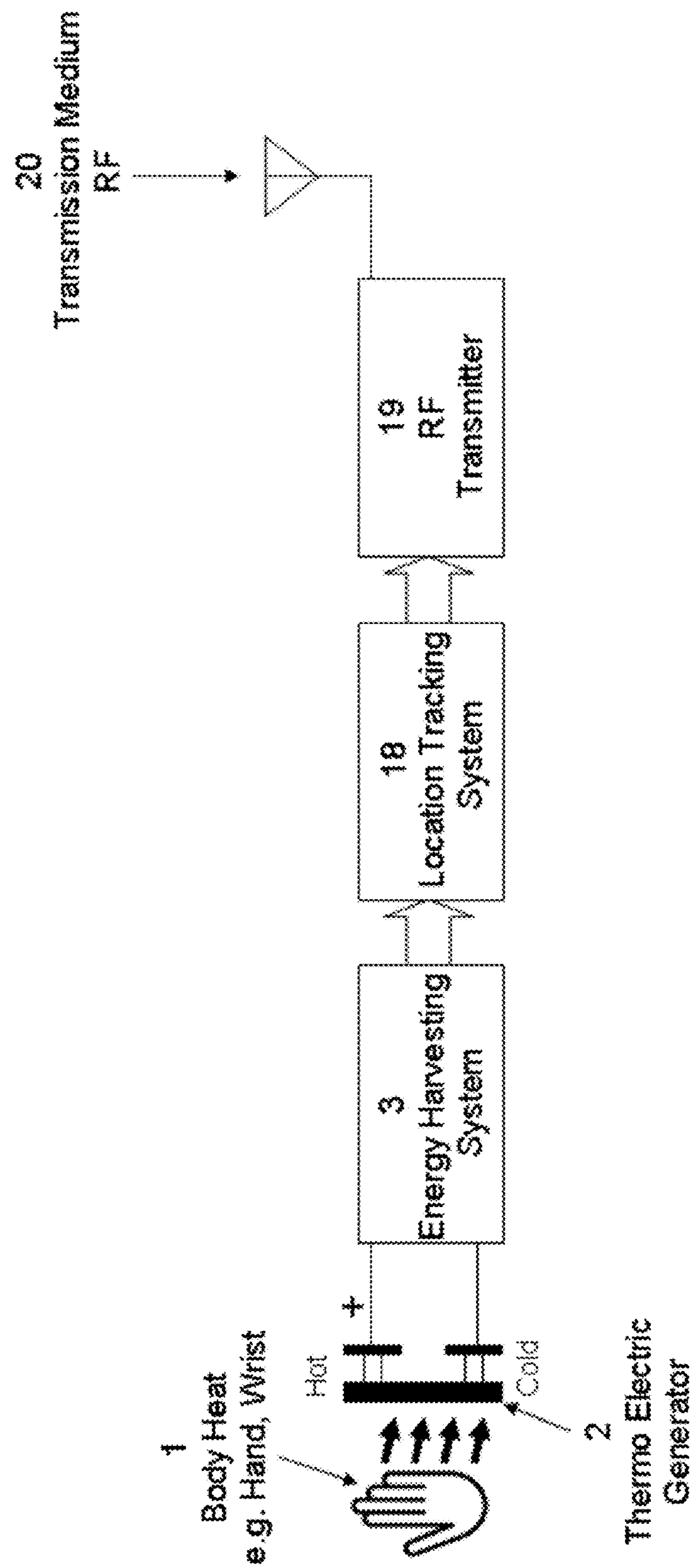
FIG. 12 is a simplified system overview of a Body Heat Powered RF Person Location Tracker.
Figure 13:
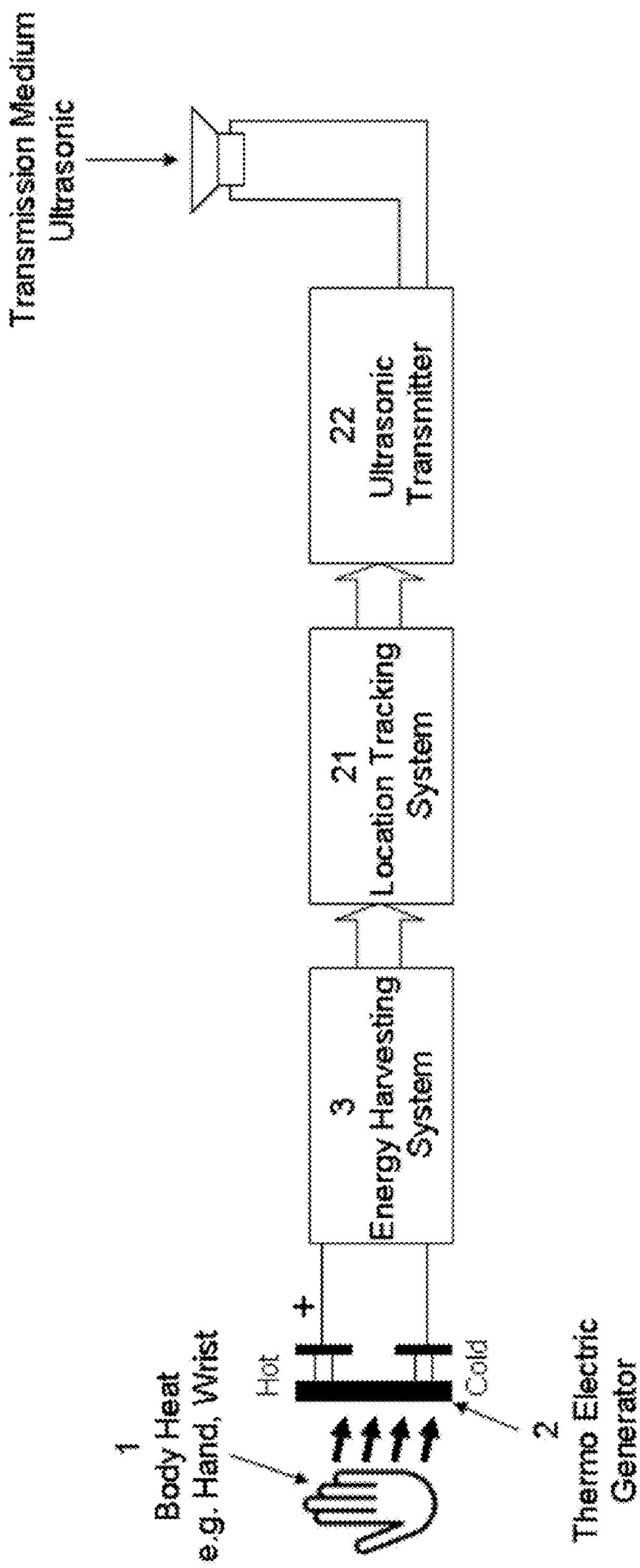
FIG. 13 is a simplified system overview of a Body Heat Powered Ultrasonic Person Location Tracker.
Figure 14:
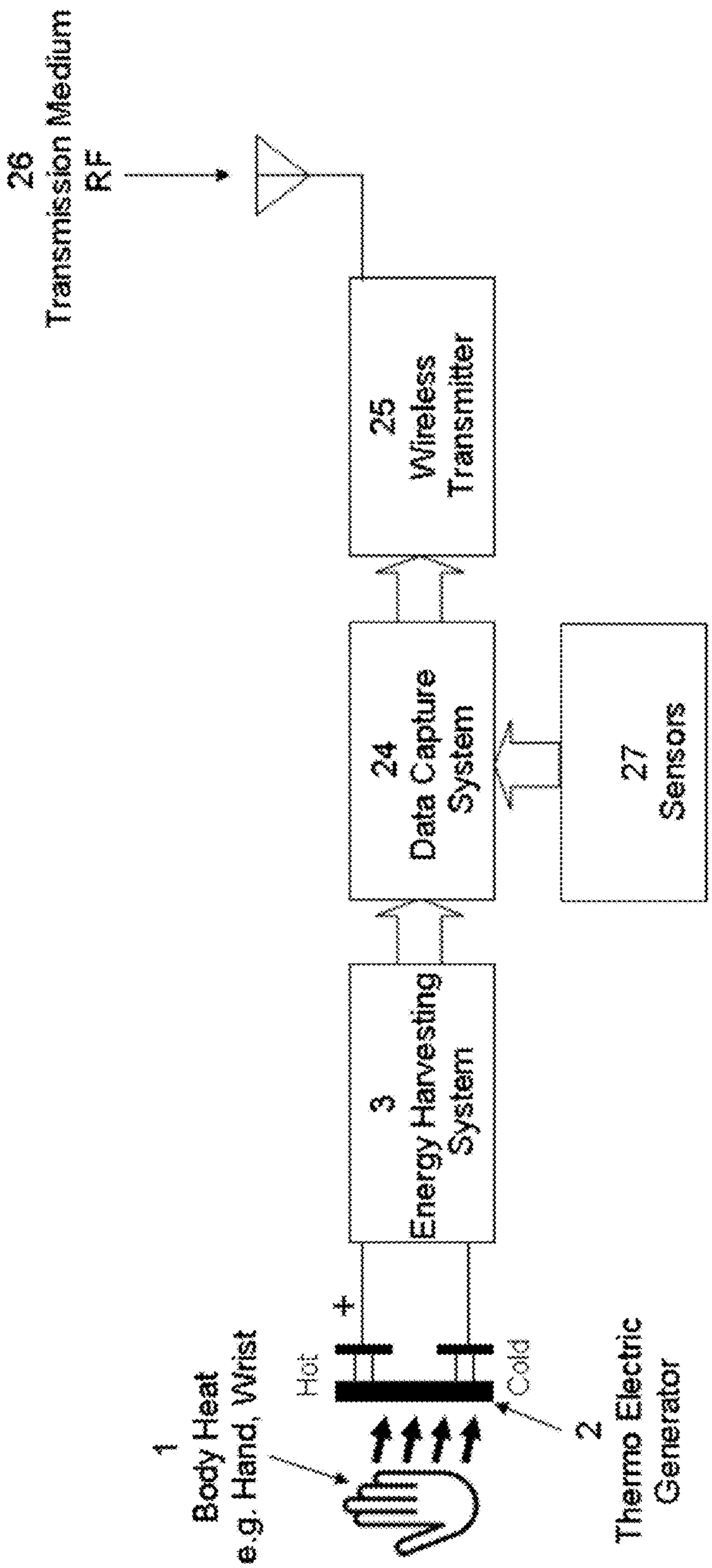
FIG. 14 is a simplified system overview of a Body Heat Powered RF Data Capture System, for example for a health monitor such as a wireless ECG Monitor.

FIG. 8 shows a simplified system overview of the Body Heat Powered Wireless Transmitter of the present invention. Here the user '1' may hold the unit, have it in their pocket or have it worn on their wrist or strapped to their arm. The heat is captured by the Thermo Electric Generator '2' by way of the 'Seebeck' effect. The preferred unit for the heat capture is a 'Peltier' unit. The Seebeck effect is the conversion of temperature differences into voltage. Here, one side of the Peltier unit is in contact with the human body, while the other is in contact with the system enclosure. The temperature difference between the body heat (37 C) and the other side will then produce a voltage. Higher voltages are obtained if the other side is a metal enclosure or heatsink. This is then processed via the energy harvesting system '3' to power the desired processing system '4'. This essentially is a controller or decision making system which takes an input, processes it and gives an output. The term 'Processing System' in the context of this document can therefore be any but not limited to the control system part of a keyfob remote controller, a Remote Keyless Entry (RKE) System or an Infra-Red remote controller for example. This 'data' is then transmitted via the wireless transmitter '5' which converts the 'data' steam to a useable format to transmit using the desired transmission medium '6'. For example if '4' was en encoder for an ID tagging system. The frequency of the data may be 3 KHz. '5' would then turn that to a 433 MHz frequency in order for it to the carried using an RF medium in '6'. If '4' was the control system of an Infra-Red TV remote controller, the data in '4' would be converted to a frequency of 38 MHz for it to be transmitted using the Infra-Red diode in '8', If '4' was for a person location system using ultrasonics, then data would be converted to a 40 KHz frequency '5' so that it could be transmitted using the ultrasonic transducer in '6'. FIGS. '9' through to '14' show these various embodiments in more detail Here, the key input control could be a switch for a RF keyfob remote or Remote Keyless Entry (RKE) System, a keypad (Infra-Red remote), an encoded code (RF ID Tag). A co-ordinate (Person Location System), or a sensor (Wireless Data Capture System).

Energy Harvesting System

Electrical power is determined by the following equation:

$$P=V\times I \quad \text{(Eq.1)}$$

Where P=Power in Watts, V=Voltage in Volts and I=Current in Amps.

Figure 15A:
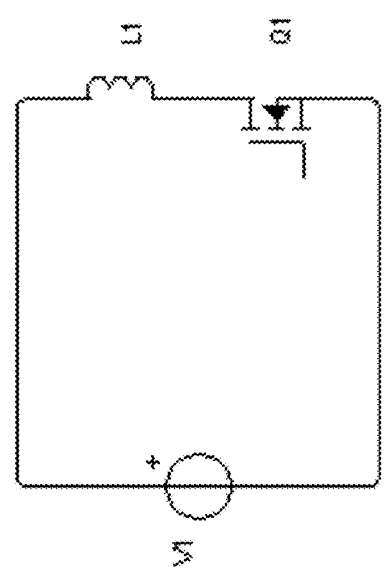
FIG. 15A is a simple charger circuit represented by the primary of a transformer or inductor in series with a FET.
Figure 15B:
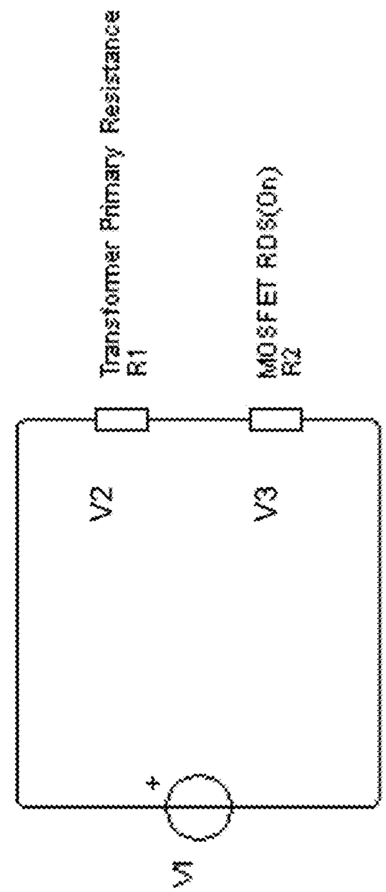
FIG. 15B is a resistor model of the charger circuit of FIG. 5A showing the effects of RDS(On) of a FET.

For an energy harvesting system to therefore have high power output, both the voltage and current needs to be high. In the background to this invention we have seen the limitation of such a system due to the RDS(On) of a FET. To explain this in more detail, FIG. 15A shows a simplified representation of a charger circuit showing the voltage source, V1 an inductor, the primary side of a step up transformer, 'L1', and a FET, 'Q1'. To explain the effect of RDS(On) of the FET, this can be modelled as shown in FIG. 15B. Here, the voltage source 'V1' is of a Themo Electric Generator (TEG). 'R2' is represented as the DC resistance of an inductor or the primary side of a step up transformer. 'R3' represents the On resistance of the FET, RDS(On).

The current is given by Ohm's law by the following equation:

$$I=V/R \quad \text{(Eq. 2)}$$

Example based on the LTC3108 Energy Harvesting IC, Depletion Mode N Channel MOSFET RDS (On)=0.5 Ohms. With a low DC resistance of the primary of the transformer or inductor, R2=0.1 Ohms and a low RDS FET, R3=0.5 Ohms such as the one in the LTC3108 Energy Harvesting IC. With a TEG voltage, 'V1' of 0.02 Volts (20 Milli Volts). Then the maximum current is: I=0.02/(R1+R2)=0.02/(0.1+0.5)=0.033 Amps However, to determine the voltage across the primary side of the transformer or inductor. We get: V2=0.033×0.1=0.0033 Volts The voltage across or loss of is then accounted by the FET as: V3=0.033×0.5=0.0165 Volts This means that a higher number of turns would be required on the secondary side to boost the voltage to above 1 Volt. Note that tuning the secondary side of the transformer by the effect of resonance frequency can give higher output voltages and thus reduce the number of secondary turns required. However, there is a limit to this and hence the voltage and current on the primary side pay a large factor in determining it. Even with the high output voltage under a resonance tuned circuit, the system is still limited by the current which has been reduced due to the RDS(On) of the FET. Note also, as the secondary turns are increased to step up the voltage, the current is reduced by the same factor. For example, if it had a turns ratio of 1750/6 to boost the output voltage 291.66 times, the output current will be 291.66 times lower than the input current. The current is further reduced by the DC resistance caused by the length of wire for the turns for the secondary windings.

Example—Effect of significantly low RDS(On) Enhancement Mode N Channel MOSFET–RDS(On)=0.005 Ohms. With the same TEG voltage 'V1' of 0.02 Volts:

$$I=0.02/(R1+R2)=0.02/(0.1+0.005)=0.19 \text{ Amps}$$

To determine the voltage across the primary side of the transformer or inductor, we get:

$$V2=0.19\times 0.1=0.019 \text{ Volts}$$

The voltage across or 'loss' is then accounted by the FET as: V3=0.10×0. 0.005=0.0165 Volts.

It can therefore be observed that both the current and the voltage to the primary side of the transformer or inductor are increased by a factor of 5.75. Using Eq. 1 we get the following power increase with this example: Power increase=5.75×5.75=33 times.

Therefore there are significant advantages in the use of the present invention in the charging circuit applications for an energy harvesting system including: i) Forward Converter; ii) Flyback Converter; and iii) Boost Converter However significantly low RDS(On) of 0.005 Ohms is only achievable with Enhancement Mode MOSFETs which have a 'Turn On' voltage of greater than 0.7 Volts typically unlike Depletion Mode FETs which are always On at zero gate voltage and achieve their optimum RDS(On) at their threshold voltage. The next section describes how both of these issues are overcome together with an automatically starting energy harvesting system at ultra-low voltages, typically 20 mV or less.

Forward Converter

Figure 16A:
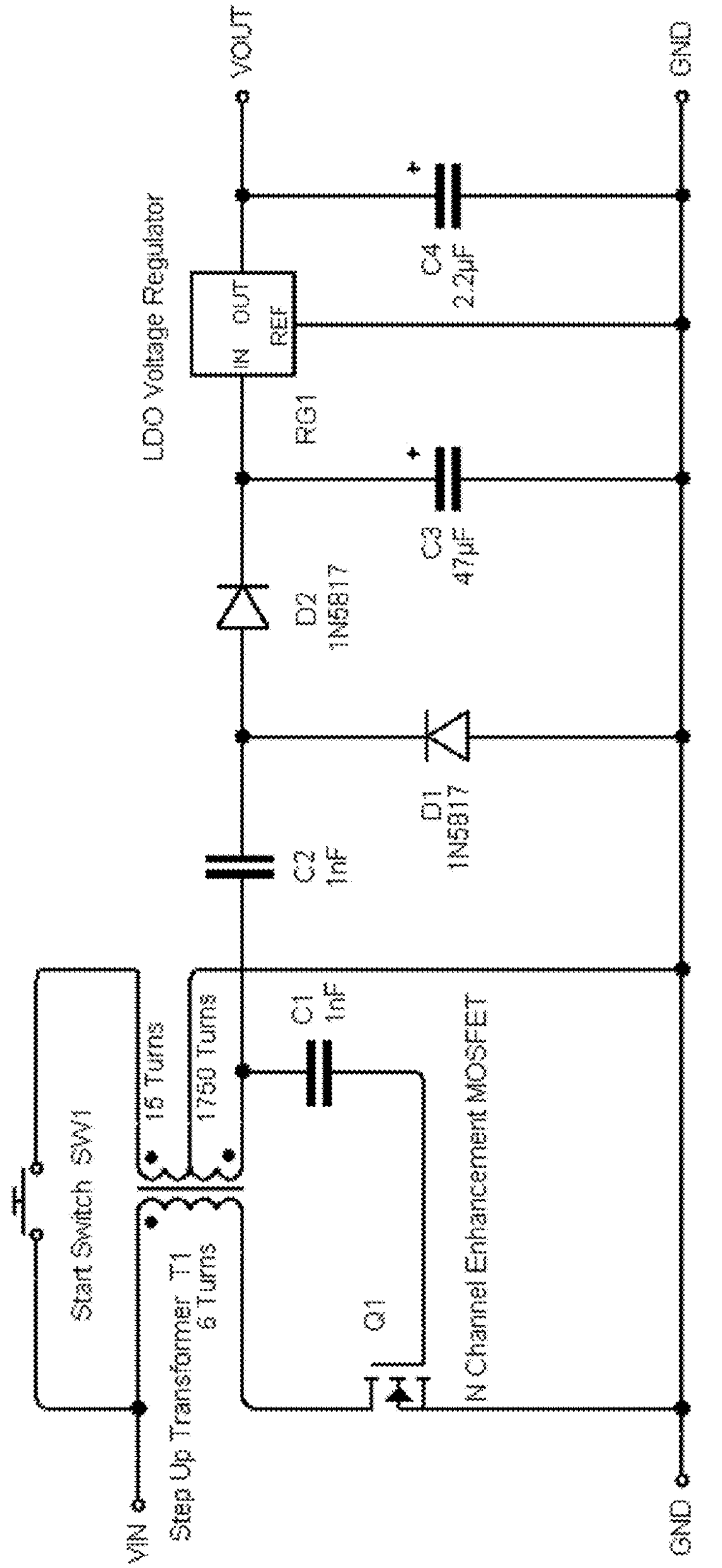
FIG. 16A shows an energy harvesting system whereby the input voltage s less than the transistors threshold voltage and the circuit is started by a switch.
Figure 16B:
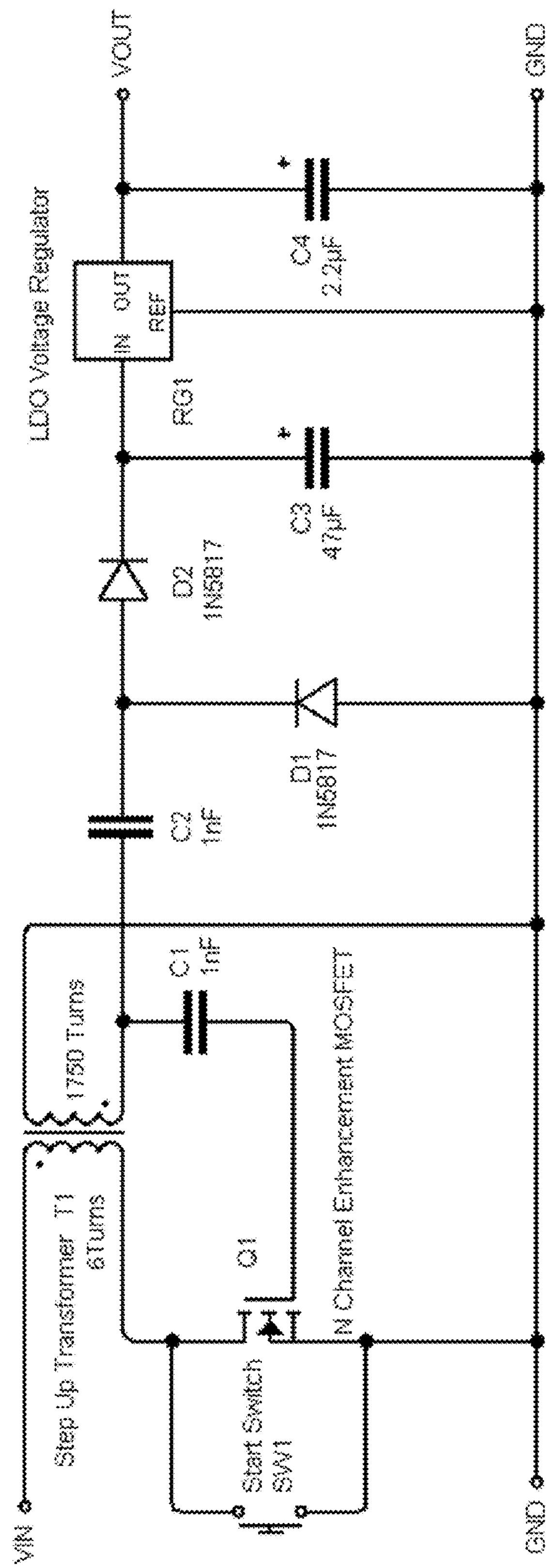
FIG. 16B shows an alternative energy harvesting system using whereby the input voltage is less than the transistors threshold voltage and the circuit is started by a switch.

This is a traditional step up energy harvesting circuit as described in the LTC3108 example. Here, the output voltage is stepped up using a step up transformer to boost the low 20 mV to 2 Volts using a 1:100 turn step up transformer in combination with a Depletion Mode N Channel MOSFET. In this example this had an RDS(On) of 0.5 Ohms. We have seen the power limitations of this by way of a resistor model. However, this invention proposes that it is possible to operate a charger circuit consisting of an Enhancement Mode MOSFET which has a very low RDS(On) (typically 0.005 Ohms) and a threshold far higher (typically 2 Volts) than the input source voltage (typically 20 mV). By the present invention significant power gains can be achieved where a factor of 33 power gain is achievable compared to the FET with RDS(On) of 0.5 Ohms. FIGS. 16*a* and 16*b* both are such examples using an N Channel Enhancement Mode MOSFET with an RDS(On) of 0.005 Ohms together with a step up transformer. The step up transformers have been taken from a popular disposable photoflash camera.

The principle operation of a photoflash camera, in particularly a disposable one is such that a 1.5 Volt AA or AAA battery is used to charge a typically 100 μF (Micro Farad) capacitor to 300 Volts. This is then discharged into a high voltage Xenon Flash Tube to create the high intensity light for the flash. The step up transformer has a turns ratio of approximately 1:300 and serves to boost the voltage from approximately 1 volt to 300 volts to charge the capacitor in a forward converter configuration. They are compact in size in that they or less than 1 square cm and can therefore be housed within a keyfob transmitter enclosure together with an encoder and transmitter.

FIG. 16A comprises of a disposable photoflash camera transformer with two primary windings and one secondary winding. Closing the switch 'SW1' will boost the secondary voltage of the transformer momentarily by '116' by the turns ratio 1750/15. This in turn will allow the voltage at the gate of the N Channel Enhancement Mode MOSFET to be greater than 2 Volts allow the input source voltage to be presented across the other primary winding (6 Turns). This in turn will be boosted by 291.66 (1750/6) times and switch the gate of the MOSFET again. The circuit will then oscillate once the switch is released. The capacitor 'C1' forms part of a resonant tank circuit between the inductance of the transformer secondary windings, and the input Gate Source capacitance of the N Channel Enhancement Mode MOSFET. This is to allow the oscillating frequency to be towards the self-oscillating frequency of the transformer to allow it to perform at its optimum. This is called the resonant frequency and given by:

$$F=1/(2\pi(\sqrt{LC})) \quad \text{(Eq. 3)}$$

Where F=Frequency in Hz, L=Inductance (of the secondary windings of the transformer) in Henries; and Where C=Total series capacitance of the tank capacitor 'C1' and MOSFET input capacitance in Farads.

At the resonant frequency, higher voltages are achieved. As the RDS(On) of the N Channel Enhancement. Mode MOSFET is very low, the primary current, the transformer is also high, hence the output power is high.

'C2' is a de-coupling capacitor and together with 'D1' make the sinusoidal waveform from being centered on the zero volts axis to make the waveform positive only. 'D2' then acts as a rectifier charging the capacitor 'C3' on the positive peaks of the waveform. 'RG1' is a low dropout regulator to provide a constant supply voltage and 'C4' is used to remove any ripples in the DC supply out voltage.

FIG. 16B is another example. Here it comprises of a disposable photoflash camera transformer with one primary winding and one secondary winding. Closing the switch SW1 will allow the input source voltage to be presented across the primary winding (6 Turns). This in turn will be boosted by 291.66 (1750/6) times and switch the gate of the N Channel Enhancement Mode MOSFET again. The circuit will then oscillate once the switch is released. The resonant tank circuit operates in the same manner as the one described in FIG. 16A together with the rectification and voltage regulation circuits.

Self-Triggering Forward Converter

Figure 17A:
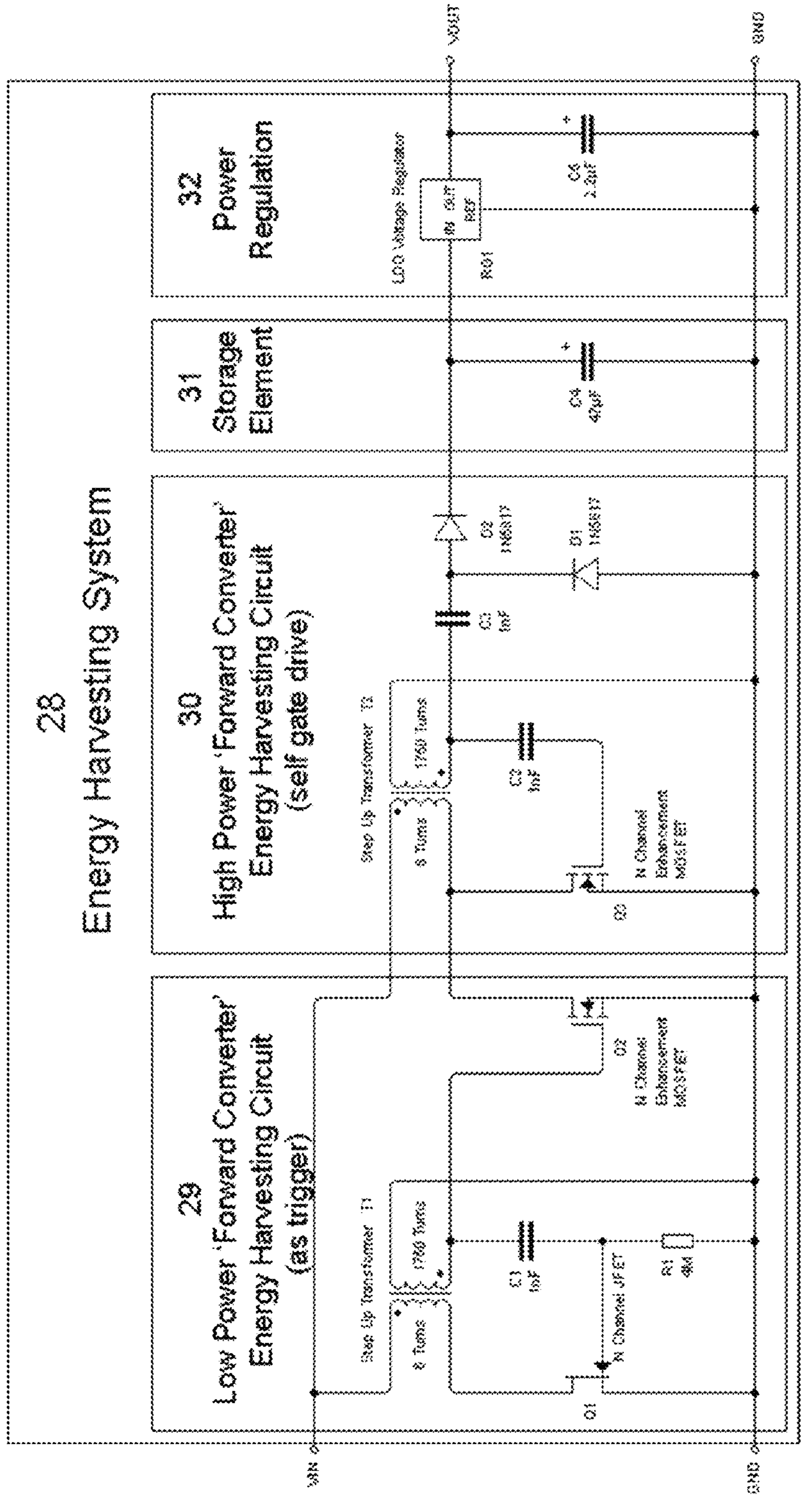
FIG. 17A shows an energy harvesting system comprising of a low power and high power circuit, each comprising a step up transformer, where the high power circuit is automatically started by the low power circuit.

We have seen how we can achieve high powers with very low input voltages using an N Channel Enhancement Mode MOSFET with low RDS(On) and a threshold voltage higher than the input voltage of the system that is started by a switch. However, this can be impractical as the available power is not always available. Therefore an automatic starting circuit is proposed as shown in FIG. 17A. The system '28' comprises of a Low Power '29' and a High Power Energy Harvesting circuit '30'. The low power energy harvesting circuit '29' takes advantage of a Depletion Mode FET (always 'ON') together with the advantages of high input impedance of FETs in general.

'Q1' is a N Channel JFET. Part of the Depletion Mode FET family. At zero volts it is 'ON' and allows a small amount of current through its Drain and Source terminals causing the input source voltage to be presented across the primary winding (6 Turns). This in turn will be boosted by 291.66 (1750/6) times and switch the gate of the JFET 'Q1' 'OFF' by a negative voltage swing equaling its Turn Off voltage of −2 Volts to −6 Volts.

The circuit will then oscillate by way of a sinusoidal waveform swing of +/−6 Volts. The capacitor 'C1' forms part of a resonant tank circuit between the inductance of the transformer secondary windings, and the input Gate Source capacitance of the JFET. This is to allow the oscillating frequency to be towards the self-oscillating frequency of the transformer to allow it to perform at its optimum.

This is a low power circuit as the N Channel JFET 'Q1' used is a J106 which has an RDS(On) of 6 Ohms and hence although the voltage swings between −6 and 6 Volts, it is of a low current. However, this will be sufficient to turn on the high power circuit by way of the N Channel Enhancement Mode MOSFET, 'Q2' which has an RDS(On) of 0.005 Ohms and a Turn On voltage of 2 Volts but a very high impedance of tens of millions of ohms which makes it very easy to drive. This will be done instantaneously, which is the moment the voltage to the gate of Q2 is above 2 Volts. At this point the input voltage will be presented at the primary of transformer 'T2' and boosted by 291.66 (175016) times and switch MOSFET 'Q3' on which is the same specification as 'Q2'. The transformer 'T2' and MOSFET 'Q3' then form a self-oscillating circuit operating at resonant frequency similar to FIGS. 16A and 16B. As the RDS(On) of 'Q3' is very low at 0.005 Ohms (5 milli Ohms) and the JFET 'Q1' has high RDS(On) of 6 Ohms, once 'Q3' turns on, it forms a short circuit effect across JFET 'Q1'. Therefore, the power will now be transferred to the high power energy harvesting circuit from the input voltage source and charge the storage element very quickly, in this case less than 1 second to charge the capacitor 'C4'.

Figure 17B:
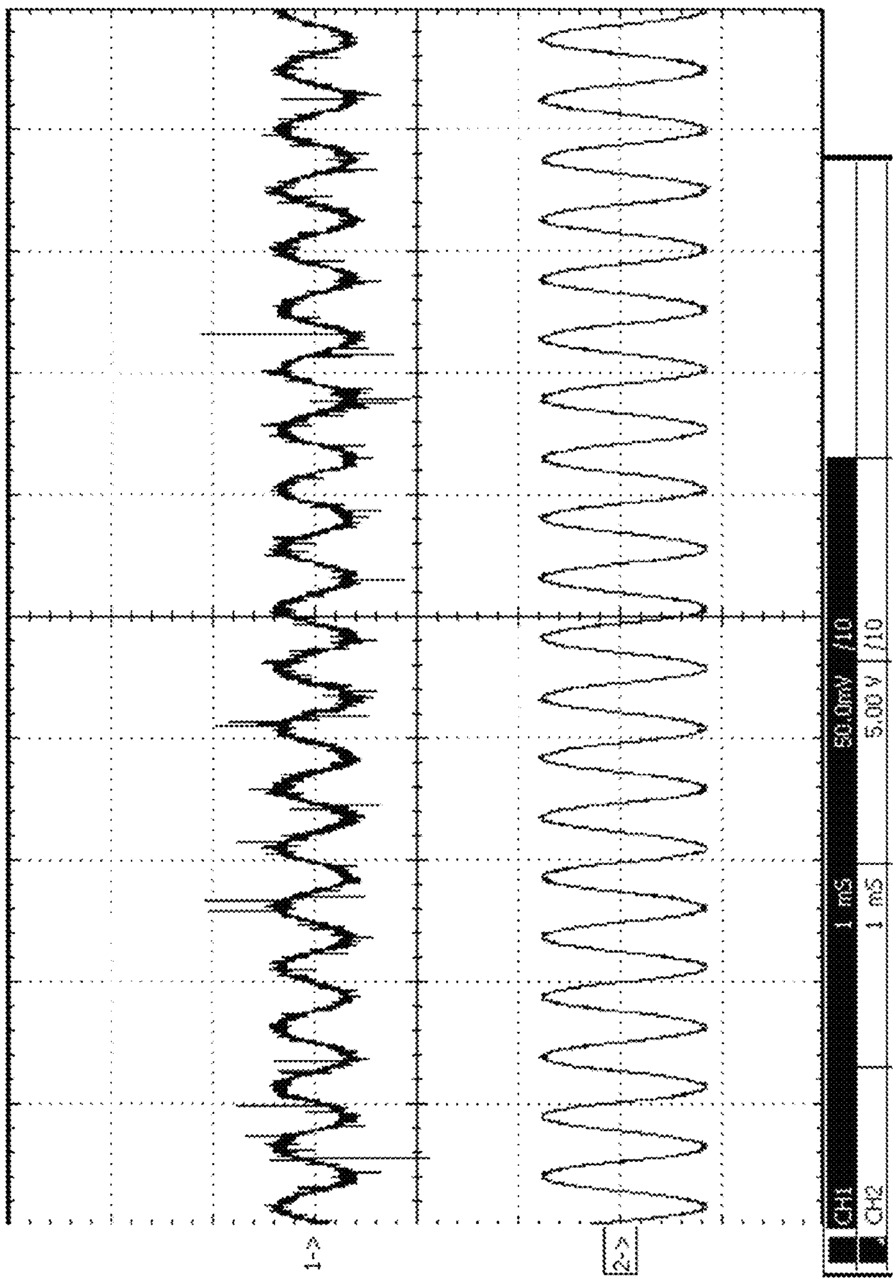
FIG. 17B shows the oscilloscope waveforms of the High Power Energy Harvesting Circuit of FIG. 17A once started by the Low Power Circuit. Comparing the Drain Voltage of the N Channel Enhancement Mode MOSFET 'Q3' with the output across the step up transformer 'T2'.

The waveforms of this circuit are shown in FIG. 17B. Waveform '1' is across the Drain and Source of a High Power (100 Amp) N Channel Enhancement Mode MOSFET whose RDS (ON) is 0.005 Ohms (5 milli Ohms). Waveform '2' is across the output of a photoflash transformer 'T2' showing a stepped up voltage sinewave. This re-triggers the MOSFET 'Q3' and charges the capacitor 'C4' of the storage element '31'.

External Gate Driven Forward Converter

Figure 18:
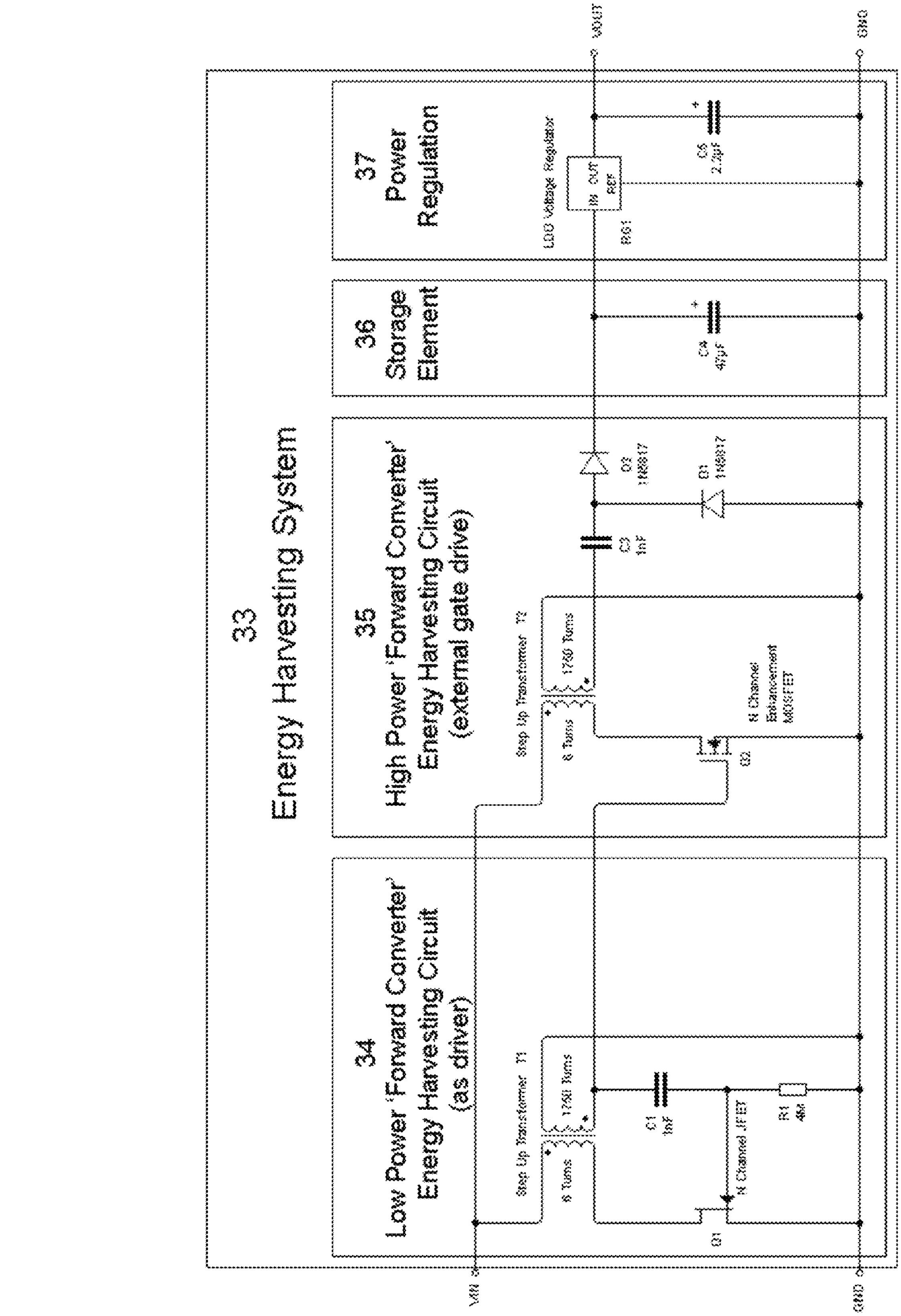
FIG. 18 shows an energy harvesting system comprising of a low power circuit comprising of a step up transformer and a high power circuit comprising of a step up transformer where the gate of the transistor in the high power circuit is driven by the low power circuit.

It is possible to create a forward converter that is not self-triggered by like FIG. 17A. FIG. 18 shows an arrangement using the same photoflash disposable camera transformers and operation is the same as that described in FIG. 17A.

However, the Low Power Forward Converter '34' creates pulses to switch the N Channel Enhancement Mode MOSFET 'Q2' ON and OFF in the High Power Forward Converter Circuit '35'. The secondary windings of transformer 'T2' step the input voltage 'Vin' up by 291.66 (1750/6) and charges the capacitor 'C4' of the storage element '36'. Here there is no resonant tank circuit between the secondary of the transformer 'T2' and the Gate Source of the N Channel Enhancement Mode MOSFET (unlike FIGS. 16A, 16*b* and 17), in the high power forward converter '35'. Instead, the Low Power Forward Converter '34' frequency output is set to that of the resonant frequency of the transformer 'T2' in the High Power Forward Converter '35'. This is to allow the use of a very wide range of MOSFETs and transformers to be used in the High Power Forward Converter '35'. This is because some MOSFETs with very low RDS(On) may have a high input Gate Source capacitance hence the system can still operate at the transformer 'T2' resonant frequency for optimum power output.

Coupling is the factor of which how much the energy is transferred from the primary to the secondary side of the transformer windings and is a maximum of 1 (unity). The photoflash camera transformer used in the forward converters '29' and '30' in FIG. 17A as well as '34' and '35' in FIG. 18 use a ferrite core transformer and required 6 primary turns and therefore 1750 secondary turns to achieve a strong coupling to provide a 291.66 factor voltage boost. The 6 primary turns therefore provide sufficient inductance and therefore magnetic flux. The higher the inductance, the lower the frequency of operation. Having less turns would therefore increase the frequency and may increase losses and cause core saturation at high currents using the ferrite core. Ferrite cores have a relative permeability '$\mu_r$' of around 640 which is useful for a step up transformer. This is the ability of a material to support the formation of a magnetic field within itself. In other words, it is the degree of magnetization that a material obtains in response to an applied magnetic field. Therefore a good magnetic core material must have high relative permeability. However, the primary inductance per turn can be increased using a core material of higher relative permeability.

For the purposes of the present invention, the terms high relative permeability can be referred to a value that is 10 or 100 times or greater than that of Ferrite and is achieved by using such materials as Nanoperm® nanocrystalline magnetic alloy or Metglas® amorphous magnetic alloy. The inductance will accordingly increase by 10 to 100 times and also allow smaller cores to be used. Nanoperm® nanocrystalline or Metglas® amorphous magnetic alloy in particular also reduce core losses and core saturation at high currents.

A single turn can be used for the primary rather than 6 and hence the secondary turns can be reduced by the same factor to give the same voltage boost while achieving greater power and efficiency due to the reduced DC (Direct Current) resistance and therefore greater output current.

If the primary turns are reduced from 6 to 1, the inductance is reduced by 36. Similarly, the reducing the secondary windings by the same factor, by 6, will therefore reduce the inductance by the same factor (36). This is because the inductance is a factor of the number of turns (N) squared (6×6). However, the relative permeability of a core material is a constant and hence increasing it will increase the primary and secondary inductances by the same factor. Therefore a core material of 20,000 is chosen, approximately 36 times that of ferrite (36×640=23,040) to maintain the original inductances. This will therefore maintain the same frequency of operation as before for the 'External Gate Triggered' High Power Energy Harvesting Circuit '35' of FIG. 18.

For the Low Power Energy Harvesting Circuits '29' in FIG. 17A, '34' in FIG. 18 and the 'Self Triggered' High Power Energy Harvesting Circuit '30' of FIG. 17A. The same frequency of operation is maintained as before and operation will be at the resonant frequency of the transformers. Hence the systems will operate optimally. This is based on using the N Channel Enhancement Mode MOSFET which has an RDS of 0.005 mill Ohms and an input gate capacitance of typically 2 nF ($2\times10^{-9}$ Farads) giving a resonant frequency based on the resonant tank circuit equation, quoted previously:

$$F=1/(2\pi(\sqrt{LC})) \quad \text{(Eq. 3)}$$

These devices are available with even smaller RDS values to below 0.001 milli Ohms. However, their input gate capacitance can increase to around 10 nF. It is therefore proposed in this invention that the relative permeability of the core material is adjusted to compensate. This will maintain operation at resonance for the step up transformers in the Low Power Energy Harvesting Circuits '29' in FIG. 17A, '34' in FIG. 18 and the 'Self Triggered' High Power Energy Harvesting Circuit '30' of FIG. 17A. Therefore a lower limit for the core material of 5,000 is chosen, to maintain the original inductances while maintaining the original size. A value reduced by a factor of 5 times (10 nF/2 nF=5, giving 23,040/5=4,600).

Alternatively, the following can be considered: i) The transformer core size can be reduced accordingly while still allowing thicker wires for the windings for higher currents therefore and power output than the original core; ii) High Power RF (Radio Frequency) N Channel Enhancement Mode MOSFETs can be used. They have a very low RDS(ON) and also a very low input source drain capacitance. However, presently, they are more expensive. Hence they have not been chosen as the preferred standard devices as part of the objective of this invention is low cost.

In the present invention it is therefore particularly preferred that the step up transformer cores in these forward converter circuits are of high relative permeability. A high relative permeability of between 5000 and 20,000 is particularly preferred for the Low Power Energy Harvesting Circuits '29' in FIG. 17A, '34' in FIG. 18 and the 'Self Triggered' High Power Energy Harvesting Circuit '30' of FIG. 17A. A high relative permeability of 20,000 is particularly preferred for the 'External Gate Triggered' High Power Energy Harvesting Circuit '35' of FIG. 18. Preferred examples of high permeability materials are Nanoperm® nanocrystailine magnetic alloy or Metglas® amorphous magnetic ahoy. These transformers may still be the same size as the disposible camera transforner allowing a versatile small form factor while giving significant power and efficiency gains and enabling the circuit of the present invention to operate effectively for the proposed applications. This is described in more detail in the boost converter design proposal of FIG. 20A described in this document.

Flyback Converter

This type of converter involves using a flyback transformer. Unlike mains transformers and audio transformers, a flyback transformer is designed not just to transfer energy, but also to store it for a significant fraction of the switching period. The current does not flow simultaneously in primary and secondary (output) windings of the transformer. Because of this the flyback transformer is really a coupled inductor rather than a classical transformer, in which currents do flow simultaneously in all magnetically coupled windings. Essentially a flyback transformer was invented as a means to control the horizontal movement of the electron beam in a television cathode ray tube (CRT) and generates very high voltages in the order of 50 KV (Thousand Volts). Here it is referred to as the Line Output Transformer (LOPT). However, miniature ones are used for SMPs (Switched Mode Power supplies).

Essentially, the primary side of the transformer is used as an inductor. To this end, a transformer with a core such as ferrite is used which has a higher relative permeability than the laminations of a conventional transformer such as a mains or audio one. This way it is possible to get high inductance on the primary side with a lower number of windings. The secondary is then used to step the voltage up and it is possible to have additional windings for applications such as TV sets. The flyback converter works on the principle of charging the primary side of the transformer to store energy within the transformer core. Then the energy released when power is removed from the primary side of the transformer and the magnetic field within the core collapses. This is referred to as Back-EMF (Electro Motive Force) and is given by the following equation:

$$V=LdI/dt \quad \text{(Eq. 4)}$$

Where V=the Back-EMF generated in Volts, L=inductance, I=Current, t=duration of time when power is removed from the inductor.

Figure 19A:
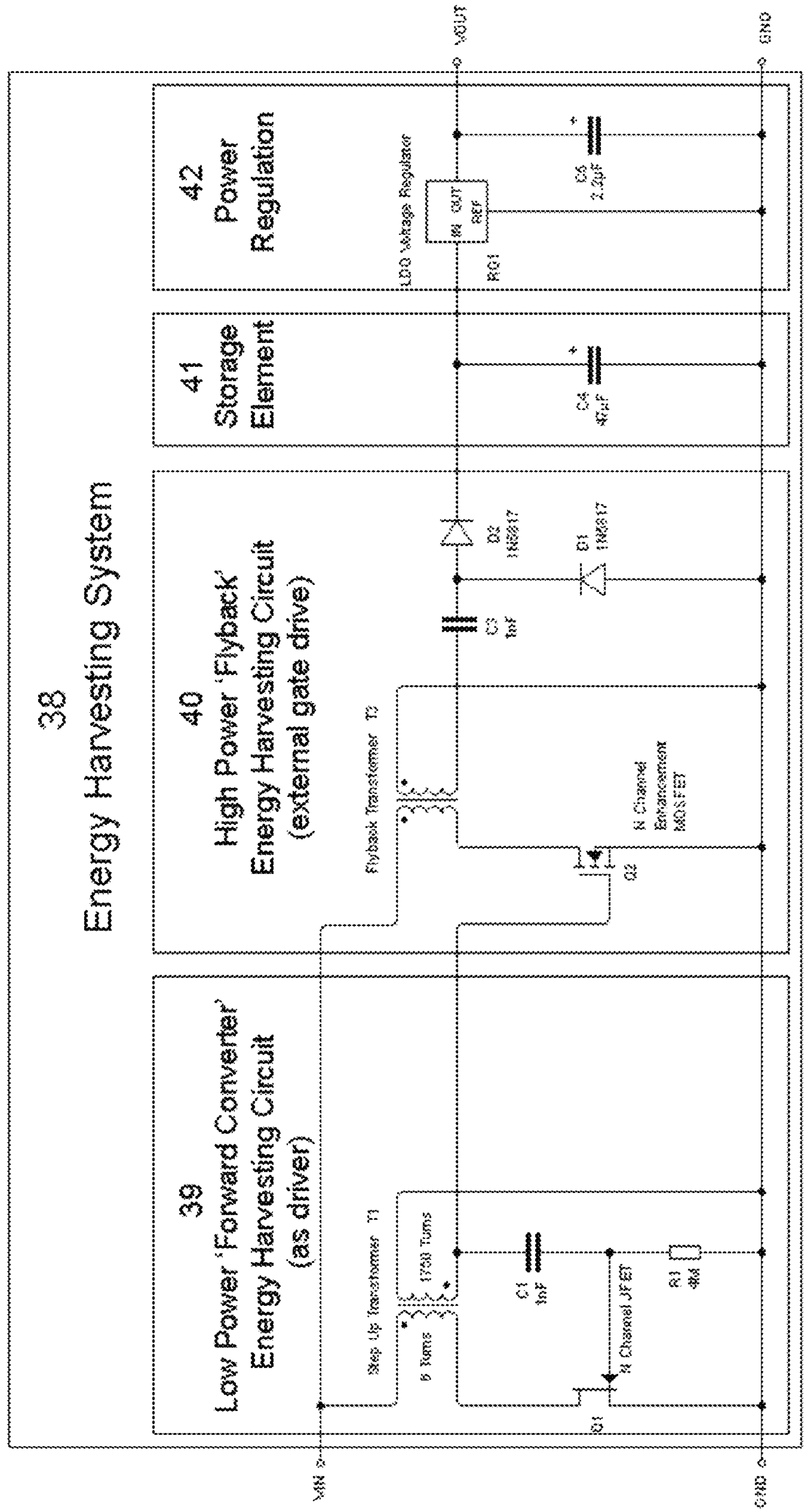
FIG. 19A shows an energy harvesting system comprising of a low power circuit comprising of a step up transformer and a high power circuit comprising of a flyback transformer where the gate of the transistor in the high power circuit is driven by the low power circuit.

FIG. 19A shows an arrangement using the same photoflash disposable camera transformers. The Low Power Forward Converter '39', creates pulses to switch the N Channel Enhancement Mode MOSFET 'Q2' in the High Power Flyback Circuit '40'. The black dots on the transformer shows the starting of the windings. Here you will notice the actual polarities between primary and secondary are reversed relative to 'GND'. When the gate to 'Q2' is high, the primary side of the transformer 'T3' is charged. When it goes low, the energy from the primary side is released. At this point, the secondary windings step this voltage up and charge the capacitor 'C4' of the storage element '41'.

The Low Power Forward Converter '39' serves as an oscillator whose frequency is optimised to meet the charge and discharge times of the inductance of the primary winding of flyback transformer 'T3' of the High Power Flyback Circuit '40'.

The following observations can be made: i) The output of the Low Power Forward Converter '39' and the High Power Flyback circuit '40' are not 'High' at the same time but rather during opposite times hence less drain on the input power supply; ii) The Back-EMF generated is a factor of the current as well as the inductance of the primary side of the flyback transformer 'T3', hence a low voltage high current source such as a TEG together with a low RDS(On) of 0.005 Ohms N Channel Enhancement Mode MOSFET 'Q2' are advantageous even at very low voltages; iii) Due to the high primary current, high voltage peaks are possible with a low number of secondary transformer windings for the flyback transformer 'T3'; iv) A reduced number of secondary windings of 'T3' means the output current will be high and hence a high output power is possible.

Figure 19B:
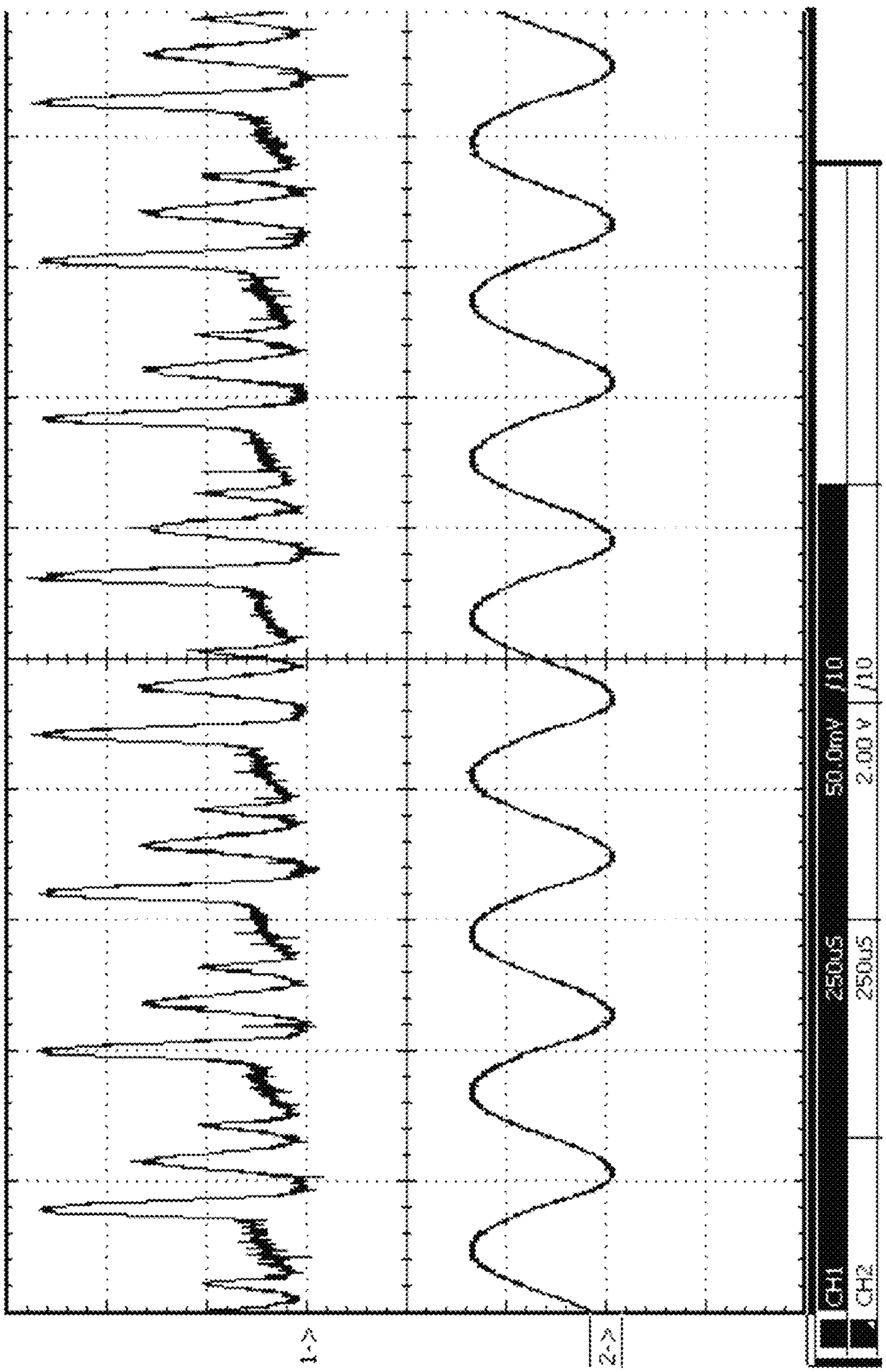
FIG. 19B shows the oscilloscope waveforms of the Energy Harvesting Circuit of FIG. 19A. Comparing the behavior across the primary windings of the flyback transformer 'T3' with the 'Gate' drive of the N Channel Enhancement Mode MOSFET 'Q2'.

FIG. 19B shows the behaviour of this circuit comparing the behaviour across the primary windings of the flyback transformer 'T3' with the 'Gate' drive of the N Channel Enhancement Mode MOSFET 'Q2'. Waveform '2' shows the output of the Low Power Energy Harvesting Circuit Driving the 'Gate' of 'Q2' which is also a High Power (100 Amp) N Channel Enhancement Mode MOSFET whose RDS (ON) is of 0.005 Ohms (5 milli Ohms). Waveform '1' shows the primary windings of the Flyback Transformer 'T3' which releases its stored energy once the Gate signal is low. You will notice that although the supply voltage is less than 50 mV, the released energy voltage is 3 times the amount. This means less turns are required for the step up and hence higher power output.

Figure 19C:
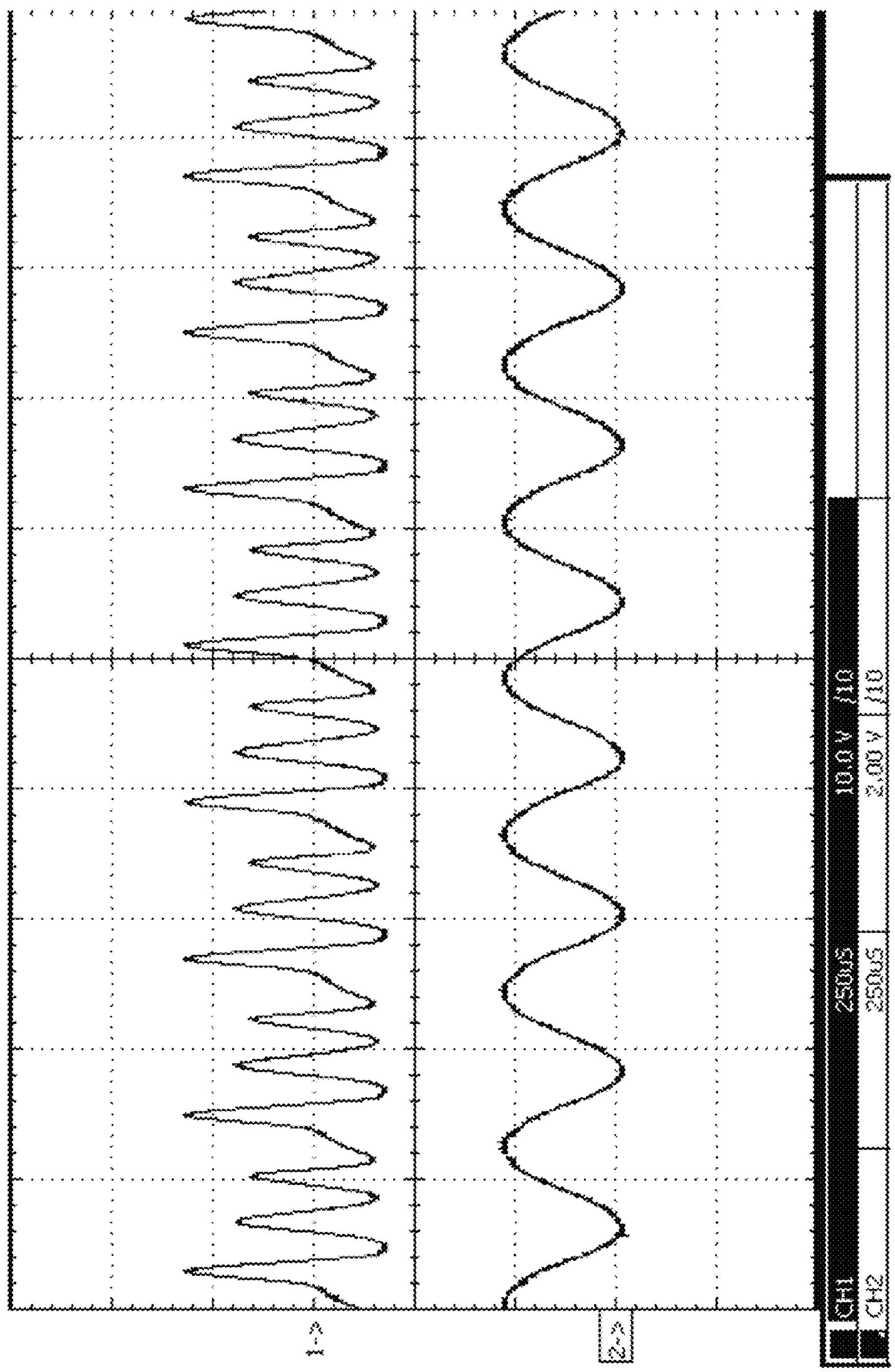
FIG. 19C shows the oscilloscope waveforms of the Energy Harvesting Circuit of FIG. 19A. Comparing the behavior across the secondary windings of the flyback transformer 'T3' with the 'Gate' drive of the N Channel Enhancement Mode MOSFET 'Q2'.

FIG. 19C compares the behaviour across the secondary windings of the flyback transformer 'T3', waveform 1' with the 'Gate' drive of the N Channel Enhancement Mode MOSFET 'Q2', waveform '2'. It can be seen that the secondary winding of 'T3' show a peak voltage of almost 20 Volts.

Note that it is possible to use a dedicated Flyback transformer with a high relative permeability core to give a much higher inductance for the primary windings. The secondary windings will then multiply the Back-EMF voltage depending on its number of turns. Using a flyback transformer which is essentially a coupled inductor that is wound on a much higher relative permeability core than ferrite will give higher performance still.

It was observed that the Back-EMF generated is a factor of the current as well as the inductance of the primary side of the flyback transformer 'T3', in the flyback converter '40' in FIG. 19A. Looking at the following equation again:

$$V = L\,dI/dt \qquad \text{(Eq. 4)}$$

Where V=the Back-EMF generated in Volts, L=Inductance, I=Current, t=duration of time when power is removed from the inductor.

Ferrite cores have a relative permeability '$\mu_r$' of around 640 which is useful for a step up transformer. This is the ability of a material to support the formation of a magnetic field within itself. In other words, it is the degree of magnetization that a material obtains in response to an applied magnetic field. Therefore a good magnetic core material must have high relative permeability. However, the primary inductance per turn can be increased using a core material of higher relative permeability. For the purposes of the present invention, the term high relative permeability can be referred to a value that is 10 or 100 times or greater than that of Ferrite and is achieved by using such materials as Nanoperm® nanocrystalline magnetic alloy or Metglas® amorphous magnetic alloy. The inductance will accordingly increase by 10 to 100 times and also allow smaller cores to be used. This also means that the number of turns is reduced for the same inductance and hence reducing DC resistance of the wire. In turn, thicker wire could be used to reduce DC resistance further. This will give rise to higher currents hence greater Back-EMF as well. It is also possible to have multiple wires connected and wound in parallel for high frequency due to the 'skin effect' due to the extra space available now. High permeability cores also saturate at higher currents. Saturation is when the magnetic flux drops and causes a decrease in the inductance. This particularly prevalent at high frequencies and hence larger sized cores are needed. However, using high relative permeability cores such as Nanoperm® nanocrystailine magnetic alloy or Metglas® amorphous magnetic alloy can prevent high current saturation and decrease losses.

We can therefore make the following changes to the flyback transformer 'T3', in the flyback converter '40' in FIG. 19A to achieve higher performance. As mentioned in the 'External Forward Converter' section, we can firstly reduce the number of primary turns from 6 to 1. Secondly, we can maintain the same primary inductance for our flyback transformer 'T3' as for the ferrite transformer by choosing a high relative permeability of the core material of 20,000, approximately 36 times that of ferrite (36×640=23, 040) to maintain the original inductances. However, the reduction of the number of primary windings will reduce the primary resistance by 6 and therefore increase the primary current by 6. We would therefore have space to thicken the primary windings by a factor of 6 to also or use 6 strands connected and wound in parallel to reduce the 'skin effect' at high frequencies. Thus the total increase in primary winding current will be 6×6=36 while maintaining the same primary inductance. Applying this to Eq. 4 above results in an output back emf voltage 36 times greater. This means that the secondary winding of our flyback transformer 'T3' of the High Power Flyback Circuit '40' may be reduced by 36 to maintain the same output voltage that was observed from the waveform in FIG. 19C of approximately 20 Volts Presently the number of secondary windings is 1750. Therefore a secondary winding of only 1750/360=48.6 turns would be required and therefore the wire thickness can be increased by 360 or arranged with multiple wires connected and wound in parallel for due to the 'skin effect' at high frequencies for increased current and therefore power output. For our intended invention, an output waveform of 2 Volts is sufficient. Therefore, the secondary windings can be reduced by a further factor of 10. To this end the secondary windings can be reduced by a factor totaling 360, giving 1750/360=4.86 turns.

Thus with a suitably low resistance, high current Thermo Electric Generator (TEG), the secondary winding wire thickness can also be increased by 360 and therefore the 1750/6 turns ratio flyback transformer 'T3' of the High Power Flyback Circuit '40' can therefore be replaced with that of a high relative permeability core material of 20,000 with only a 1 turn primary and 5 turn secondary winding providing 2 Volts output with high current.

Using presently available Thermo Electric Generators (TEG), a realistic design for the flyback transformer is proposed as follows: 1) 3 turns primary and 30 turns secondary; ii) The 3 turns primary winding consists of 2 parallel wires of the thickness of the original photoflash camera transformer; and iii) The 30 turns secondary winding consists of 5 parallel wires of 10 times the thickness of the original photoflash camera transformer (as 1750/30=58.33)

The 3 turns primary is proposed instead of 1 to create a large proportion of the Back-EMF from the inductance as well as the current as observed in Eq. 4. This is to compensate for variation of the available current from the range of TEGs presently available on the market as well as variation of the available body heat from the user. Note that core materials of a higher relative permeability than 20,000 are possible for the transformer in the flyback converter configuration as it does not operate at a resonant frequency but rather it is based on the charge and discharge times of the primary winding inductance which is a factor of the input current. Using Nanoperm® nanocrystalline magnetic alloy or Metglas® amorphous magnetic alloy will also prevent high frequency saturation at high currents. In the present invention it is therefore particularly preferred that the flyback transformer core be of high relative permeability, i.e. at least 20,000. Preferred examples are Nanoperm® nanocrystalline magnetic alloy or Metglas® amorphous magnetic alloy. These transformers may still be the same size as the disposable camera transformer allowing a versatile small form factor while giving significant power and efficiency gains and enabling the circuit of the present invention to operate effectively for the proposed applications.

Boost Converter

A boost converter is a simplified flyback converter whereby only an inductor is used and there is not step up of the voltage. So the behaviour of operation is the same. The first three observation points for the flyback topology also apply here. As there is no secondary winding, the current remains the same (that is, it is not stepped down).

It is possible to get high current and reasonable voltages without a step up transformer or flyback transformer in the proposed invention by using a high inductance inductor with low DC resistance. This is possible by using the following:

The Back-EMF generated is a factor of the current as well as the inductance of the inductor, hence a low voltage high current source such as a TEG together with a low RDS(On) of 0.005 Ohms N Channel Enhancement. Mode MOSFET are advantageous even at very low voltages. A high relative permeability core will provide: i) High inductance with a low number of turns and therefore high back EMF; ii) Lower saturation at high current; and iii) Lower saturation at high frequency. Thick wires for the windings can be used due to the reduced number of turns to reduce DC resistance or multiple wires in parallel for high frequency due to 'skin effect'. Output power is high due to higher frequency capability, high current and voltages above the threshold voltage (0.7 Volts or more) of conventional semiconductor devices It was observed that the Back-EMF generated is a factor of the current as well as the inductance of the primary side of the flyback transformer 'T3', in the flyback converter '40' in FIG. 19A. This also holds true for an inductor. Looking at the following equation again:

$$V=LdI/dt \quad \text{(Eq. 4)}$$

Where V=the Back-EMF generated in Volts, L=Inductance, I=Current, t=duration of time when power is removed from the inductor.

Ferrite cores have a relative permeability 'μ' of around 640 and are useful in inductors and for the application of boost converter configurations. A good magnetic core material must have high relative permeability. This is the ability of a material to support the formation of a magnetic field within itself. In other words, it is the degree of magnetization that a material obtains in response to an applied magnetic field. However, the primary inductance per turn can be increased using a core material of higher relative permeability. For the purposes of the present invention, the term high relative permeability can be referred to a value that is 10 or 100 times or greater than that of Ferrite and is achieved by using such materials as Nanoperm® nanocrystalline magnetic alloy or Metglas® amorphous magnetic alloy. The inductance will accordingly increase by 10 to 100 times and also allow smaller cores to be used. A typical high relative permeability torpid core such as the Nanoperm® M-102 of Magnetec GmbH consists of Nanocrystalline Soft Magnetic Alloy and has a relative permeability of 90,000 compared to that of Ferrite which is typically 640. This means that the inductance will be 90,000/640=140 times greater as shown by the equations for both cylindrical and toroidal core wound inductors:

$$L=\mu_0\mu_r N^2 A/l \text{(For a cylindrical core)} \quad \text{(Eq. 5a)}$$

Where L=inductance in henries, $\mu_0$=permeability of free space=$4\pi\times10^{-7}$ H/m;

where $\mu_r$=relative permeability of core material, N=number of turns; and where A=area of cross-section of the coil in square meters ($m^2$), l=length of coil in meters.

$$L=\mu_0\mu_r N^2 r^2/D \text{(For a toroidal core)} \quad \text{(Eq. 5b)}$$

Where r=radius of coil winding in meters, D=overall diameter of core in meters.

This means that the number of turns can also be reduced and hence reduce DC resistance of wire. In turn, thicker wire could be used to reduce DC resistance further. It is also possible to have multiple wires connected and wound in parallel for high frequency due to the 'skin effect' due to the extra space available now. High relative permeability cores also saturate at higher currents. Saturation is when the magnetic flux drops and causes a decrease in the inductance. This particularly prevalent at high frequencies and hence larger sized cores are needed.

However, using high relative permeability cores such Nanoperm® nanocrystalline magnetic alloy or Metglas® amorphous magnetic alloy can prevent high current saturation and decrease losses. To date Metglas® amorphous 2714A alloy has the highest relative permeability which is starting to be introduced into the industry. A typical core made of this material could be MP3210P4AF by Manz Electronic Systeme OHG. With this material, even higher output power is achievable at higher frequency without saturation.

Figure 20A:
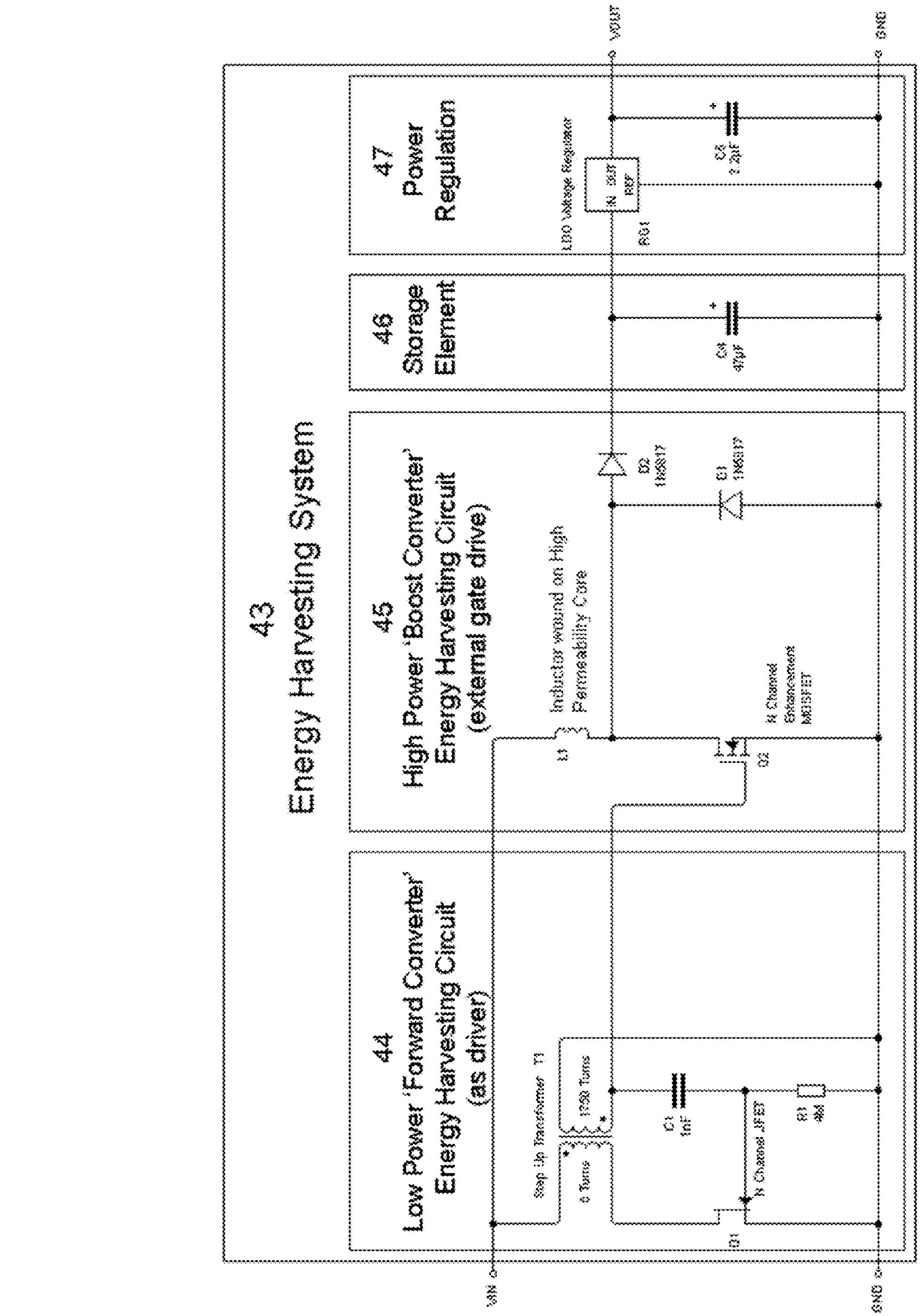
FIG. 20A shows an energy harvesting system comprising of a low power circuit comprising of a step up transformer and a high power circuit comprising of an inductor where the gate of the transistor of high power circuit is driven by the low power circuit.

FIG. 20A shows an energy harvesting system '43' containing a high power boost converter circuit 45' with an inductor, 'L1' wound on a Nanoperm® M-102 high permeability Nanocrystalline Soft Magnetic Alloy core by Magnetec GmbH. It has a relative permeability of 90,000. The inductor 'L1' has 40 windings on SWG 28 copper enameled wire. This gives an inductance 141 mH (milli Henries) and a measured DC resistance of less than 0.1 Ohms. The Low Power Forward Converter '44' serves as an oscillator whose frequency is optimised to meet the charge and discharge times of the inductor 'L1' of the High Power boost converter Circuit '44'

Figure 20B:
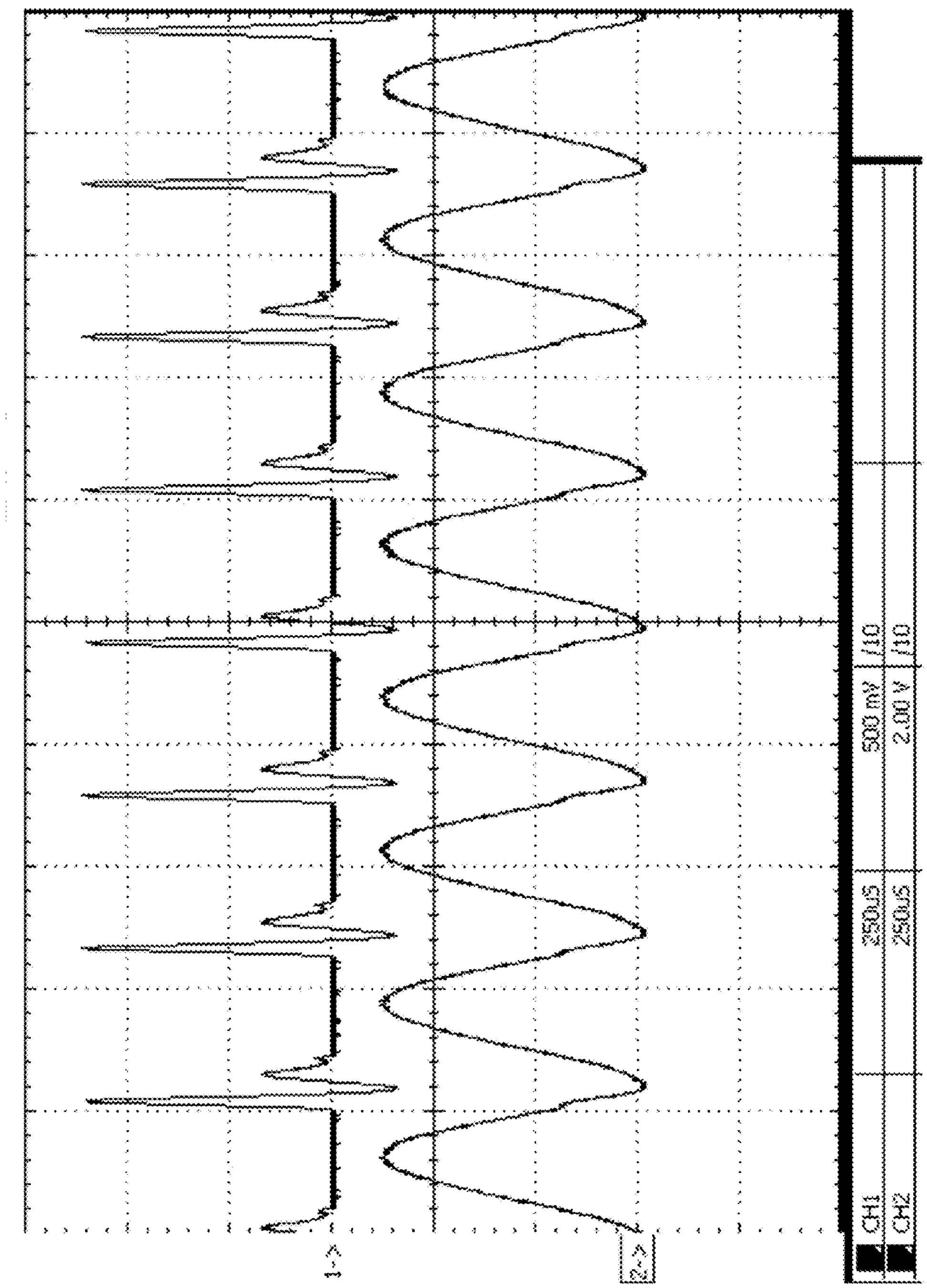
FIG. 20B shows the oscilloscope waveforms of the Energy Harvesting Circuit of FIG. 20A. Comparing the behavior across the inductor 'L1' with the 'Gate' drive of the N Channel Enhancement Mode MOSFET 'Q2'.

FIG. 20B compares the behaviour across the inductor 'L1', waveform '1' with the 'Gate' drive of the N Channel Enhancement Mode MOSFET 'Q2', waveform '2'. It can be observed that the inductor releases its stored energy when the 'Gate' is 'Off' giving pulses of short duration. However, they have a peak voltage of over 1 Volt even with a supply voltage of less than 50 my. This means that it is possible to charge a capacitor via the silicon diode 'D2' whose nominal forward voltage drop is 0.7 Volts. That is, the diode needs more than 0.7 volts to operate. The inductor winding resistance is less than 0.1 ohm and in combination with the low RDS (On) of the N Channel Enhancement Mode MOSFET of 5 mOhms (5 milli Ohms or 0.005 Ohms) means that although the pulse is around 1 Volt, the current is high and hence it is possible to charge large capacitors quickly.

Note that core materials of a higher relative permeability than 90,000 are possible for the described inductor in the boost converter configuration as it does not operate at a resonant frequency but rather it is based on the charge and discharge times of the primary winding inductance which is a factor of the input current. Using Nanoperm® nanocrystalline magnetic alloy or Metglas® amorphous magnetic alloy will also prevent high frequency saturation at high currents. In the present invention it is therefore particularly preferred that the inductor core be of high relative permeability of at least 80,000. Preferred examples are Nanoperm® nanocrystalline magnetic alloy or Metglas® amorphous magnetic alloy. The inductor may still be compact in size for portable or small form factor applications while giving significant power and efficiency gains and enabling the circuit of the present invention to operate effectively for the proposed applications.

Example of a Tested Working Body Heat Powered RF Transmitter

Figure 21A:
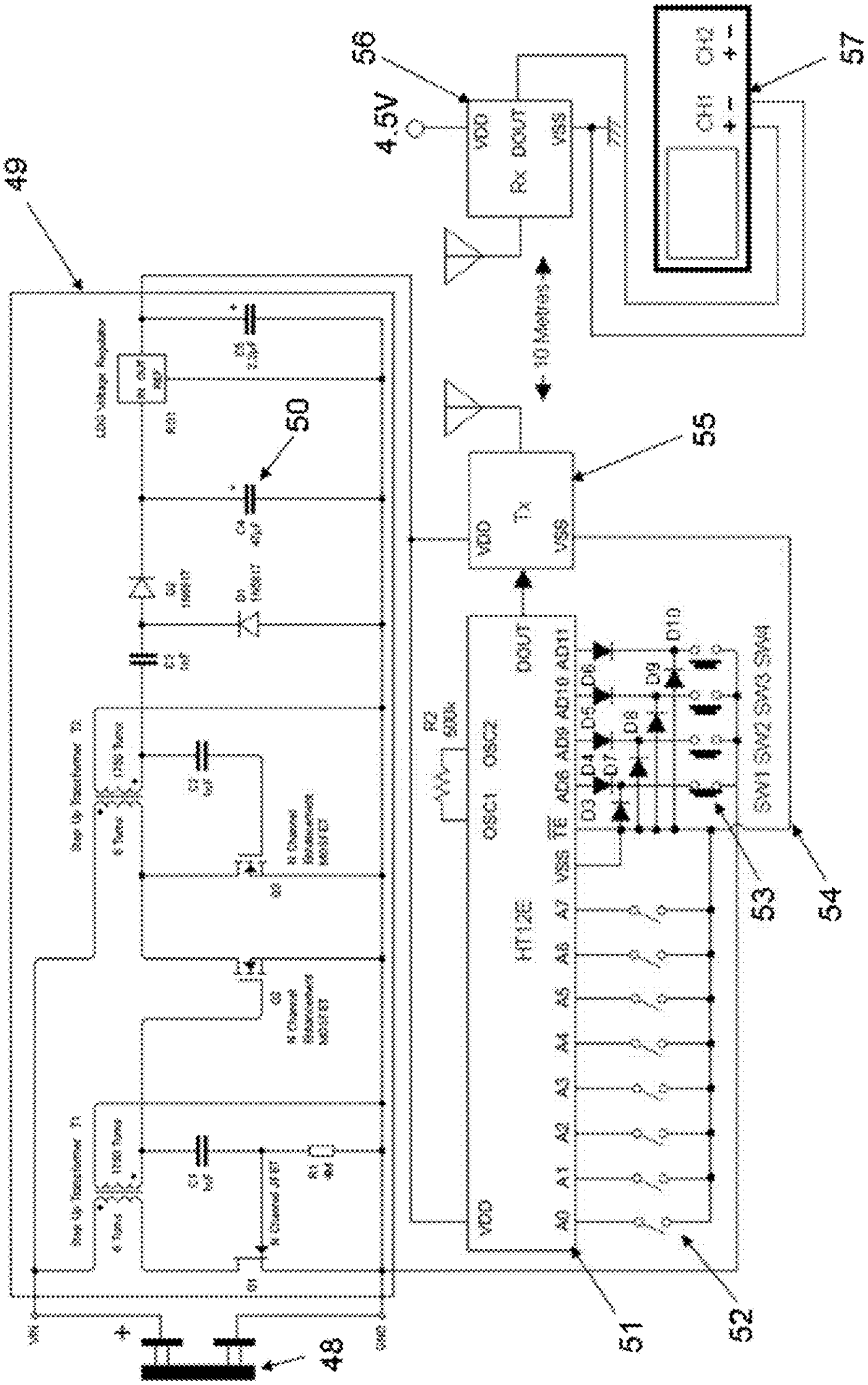
FIG. 21A shows a real working system of a body heat powered RF transmitter. Showing test set with results observed by an oscilloscope connected to a receiver placed 10 meters away from the transmitter.

FIG. 21A shows a real tested body heat powered RF 433 MHz transmitter which can be used as a 4-way remote control or a RFID tag. The complete system is housed in a standard keyfob remote control enclosure. The heat is drawn from a 20 mm×20 mm TEG, '48', giving a voltage output from less than 20 mV to 50 mV. This energy harvesting system. '49', is the automatically starting, self-trigger circuit of FIG. 17A. The circuit charges a 47 μF (micro Farad) capacitor, 50 to above 5 volts which then maintained at 5 volts by the internal voltage regular of '49'. The key components in the energy harvesting system, '49' are 'Q1', the N Channel JFET, part number J106, a standard cheaply available component costing a few pence. The N Channel Enhancement Mode MOSFETs, 'Q2' and 'Q3' have a very low RDS(On) of 9.505 Ohms (5 Milli Ohms) but are standard cheaply available components costing less than one 1 pound sterling.

Figure 6:
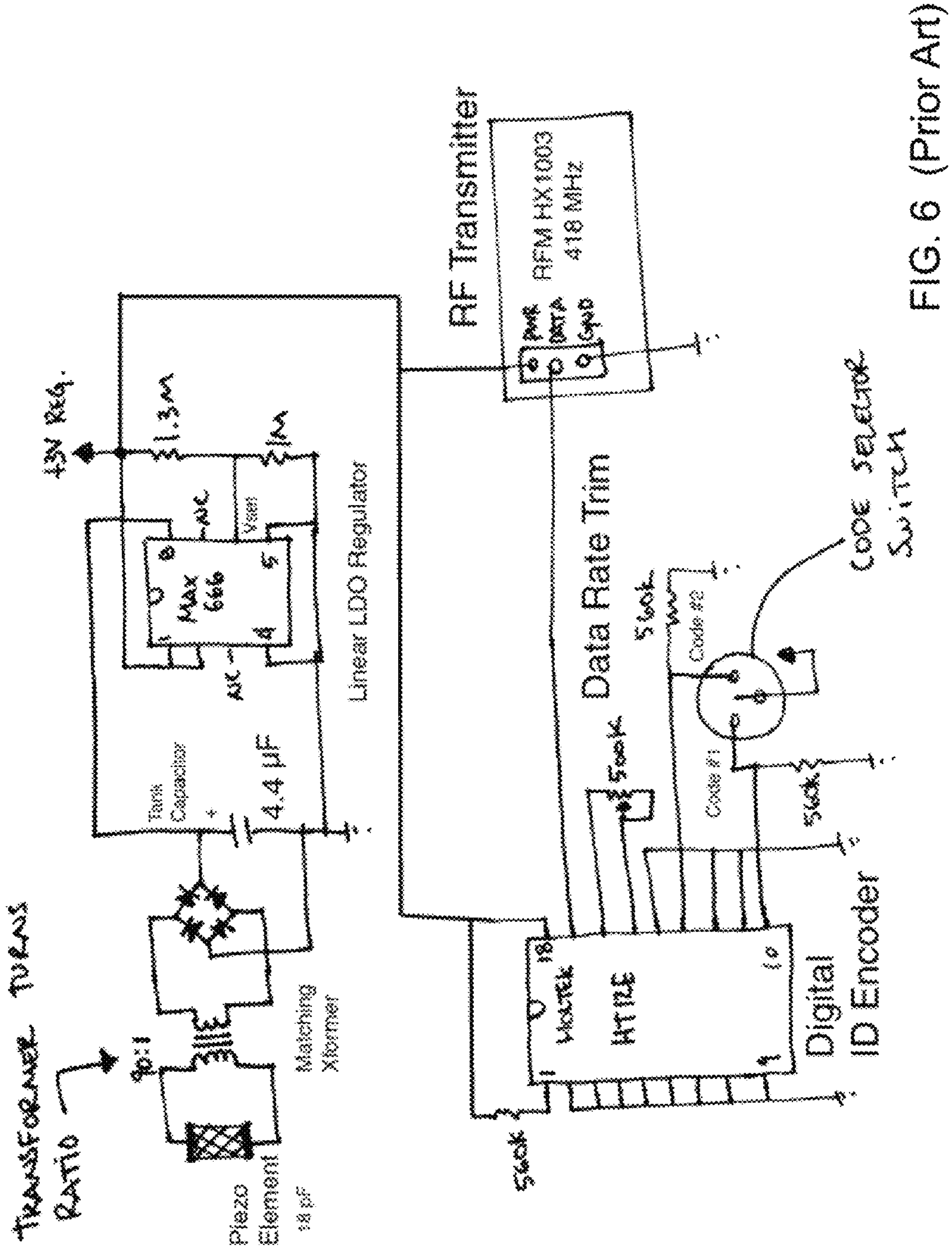
FIG. 6 illustrates a prior art RF transmitter with a piezo electric switch as the energy source for an RF ID tag application.
Figure 7:
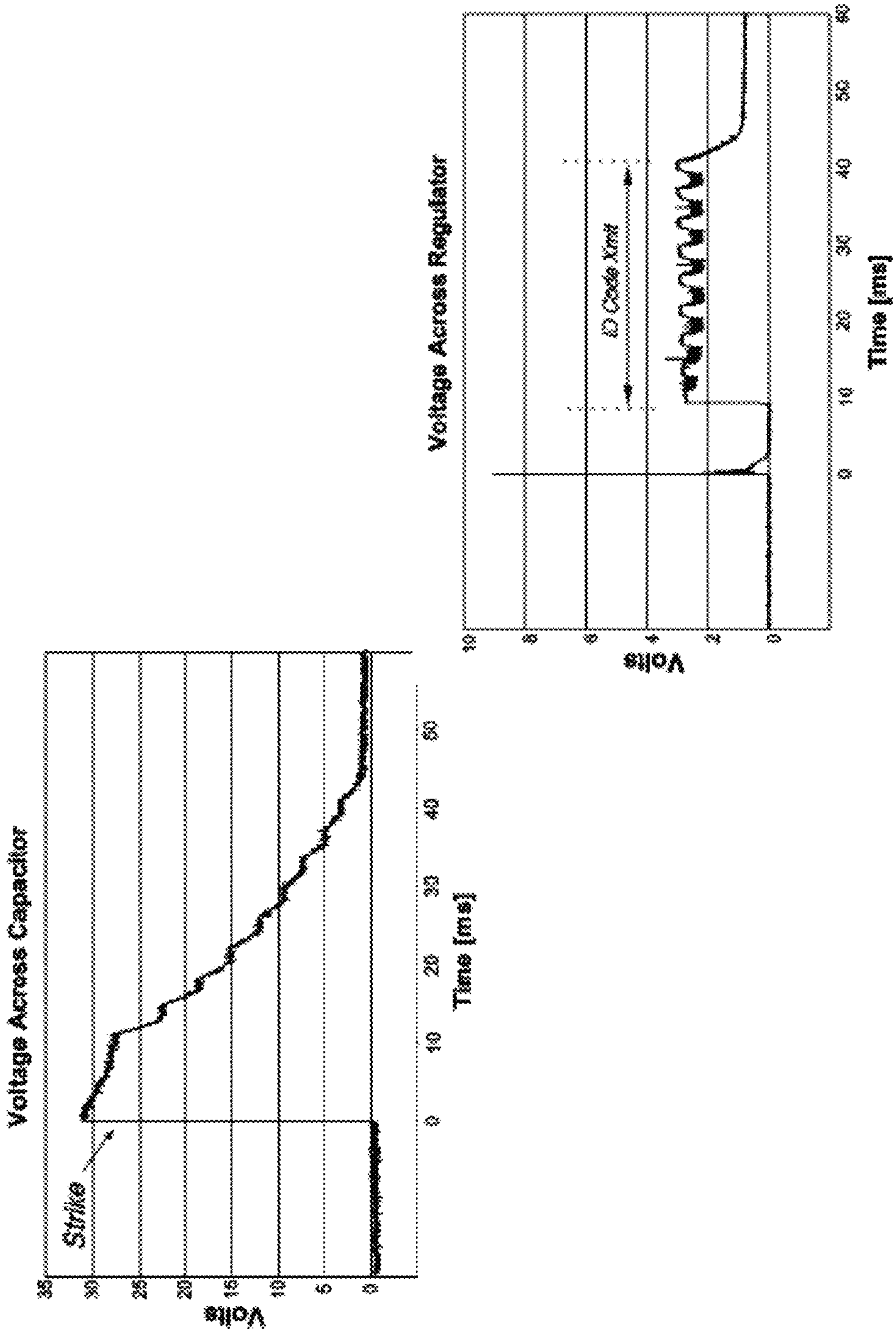
FIG. 7 illustrates the capacitor voltage and transmission output graphs of the piezo switch based RF transmitter described in FIG. 6.

To show the systems capability compared to the wireless switch based system of FIG. 6, the same 12-bit Holtek HT12E encoder '51' is used. The frequency of the encoder is set by R2 which is 500 KOhms giving a frequency of 6 KHz. The encoder has eight address pins, and four pins which can be used either for address or data. In this example, the address state switches, '51' for A0 to A7, are left open, while AD6 to AD11 are pushbuttons, '53' which can be used for a 4-way remote control, SW1 is switched to VSS upon transmission.

The transmitter '55' is a typical keyfob or Remote Keyless Entry (RKE) System RF remote frequency type at 433 MHz, part number AM-RT4-433 by RF Solutions Ltd. A special configuration is made using the diodes, D3 to D10 which means that the VSS, the transmit enable of the encoder '49', and the VSS of the transmitter '55' will not be connected to the GND terminal of the energy harvesting circuit '49' unless any of the switches SW1 to SW2 are depressed. When this happens the VSS rail '54' will be connected to the GND rail of '49'. This means that no power will be drawn from the energy stored in the capacitor '50' until any of the switches SW1 to SW2 are depressed. The storage capacitor '50' also serves as a buffer so that if there is no more heat present on the TEG, '48', data can be transmitted using the energy stored in it.

A 433 MHz receiver '56', part number AM-RTS-433 by RF Solutions Ltd is placed 10 meters away and the waveform observed by an oscilloscope '57'. The receiver '56' is powered by a 4.5 Volt source consisting of three 'AA' 1.5 Volt batteries wired in series.

Figure 21B:
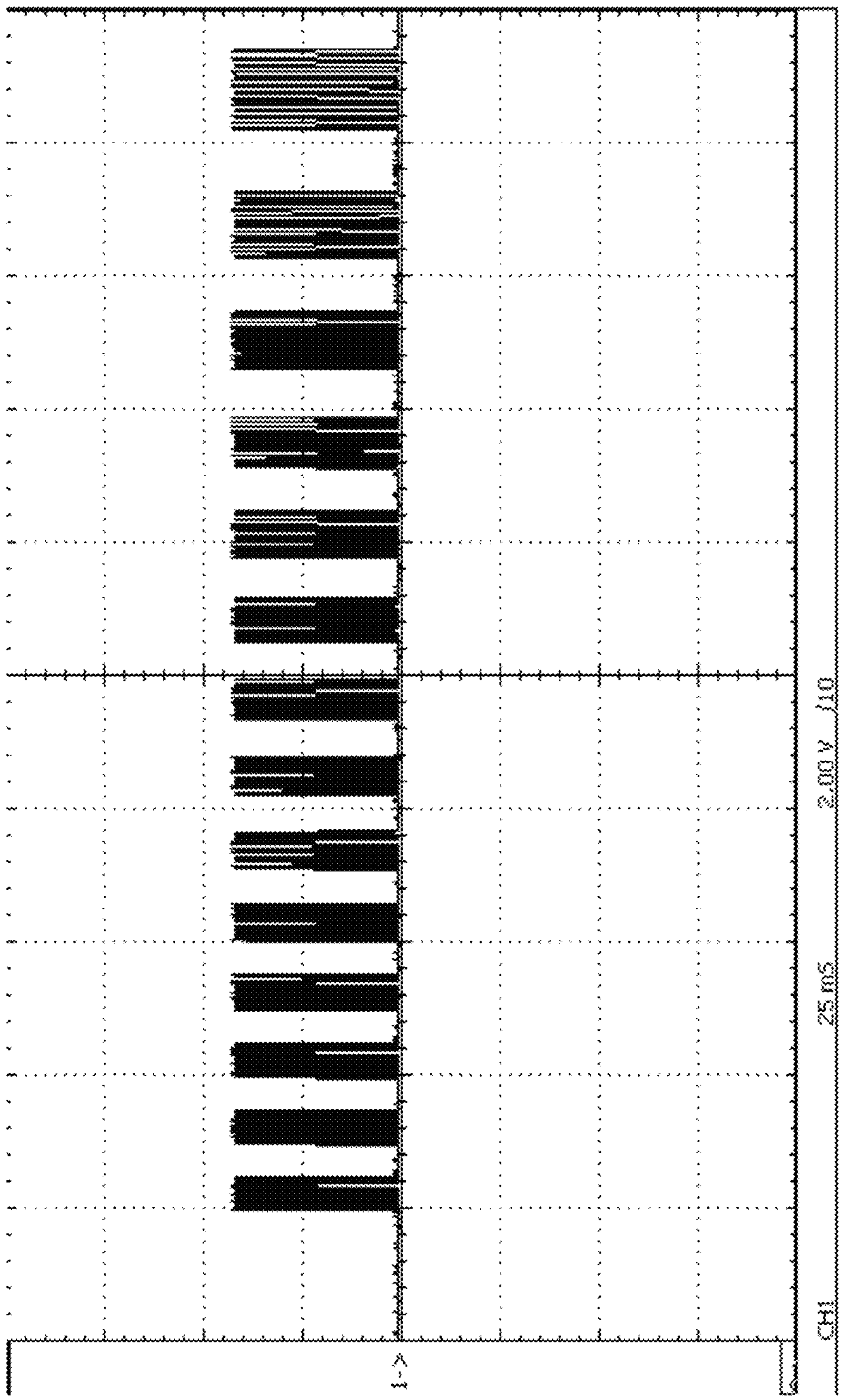
FIG. 21B shows the output waveform of the receiver placed 10 meters away from the transmitter observed by an oscilloscope showing several repeated pulse trains of the code sequence transmitted.
Figure 21C:
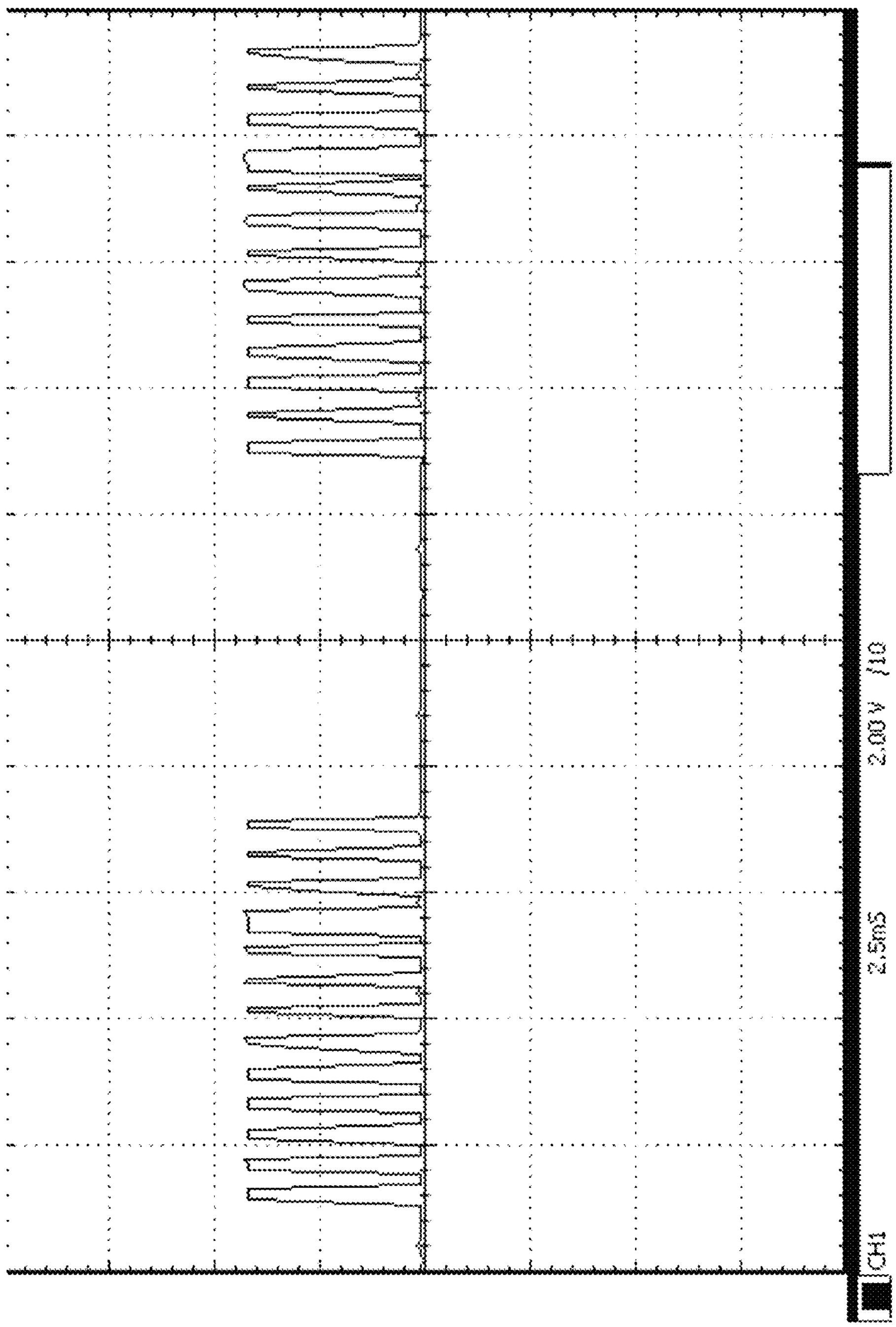
FIG. 21C shows a close up of the output waveform of the receiver placed 10 meters away from the transmitter observed by an oscilloscope showing the pulse code sequence being correctly received.

FIG. 21B shows the transmission when switch 'SW1' is pressed once the storage capacitor '49' is charged to 5 Volts and there is no longer any heat supplied to the TEG '48'. It can be seen that several pulse streams are received even though the storage capacitor '49' is a small value of only 47 pF (micro Farads). A closer observation in FIG. 21C shows that the correct 12-bit sequences have transmitted several times. If heat is continuously available by the user, than the pulse streams would continuously be transmitted as long as the switch 'SW1' was pressed. The range would also be improved to more than 10 meters.

Using a Holtek HR12E encoder will give the user 4096 different combinations based on a 12-bit encryption which may be suitable for standard RF remote control applications. However, as observed in FIGS. 21*b* and 21*c*, as several pulse streams of 12-bits were successfully received, it is possible to develop a much more secure system for an RFID Tag application than the example in FIG. 6 which only allowed a transmission of one pulse stream of 12-bits.

Example of Body Heat Powered Person Location Device

Systems such as Person Location Devices may use GSM (Global Satellite Monitoring) of GPS (Global Positioning System) to locate their position. These systems require a high power and work on the basis of sending a high power burst transmission of their co-ordinates. This could be a pulse of less than one second every few seconds or minutes for example.

To allow the possibility of sending burst transmission using a body heat based power source, the system advantageously has a capacitor and voltage level switch. Here the storage system is charged to a specified voltage to the person location system power requirements. If and only then is power from the storage capacitor is applied to it. The advantage is that the person location system consumes zero power until there is enough power to drive it. This is unlike existing battery powered systems where there is a microprocessor in 'Sleep Mode' which consumes some power until it is awakened to send the burst transmission.

Figure 22A:
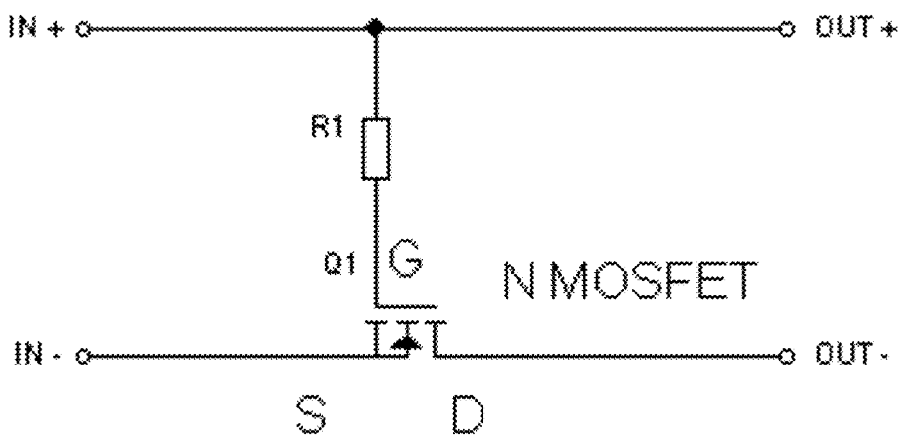
FIG. 22A shows a Voltage Level switch based on an N Channel Enhancement Mode MOSFET.
Figure 22B:
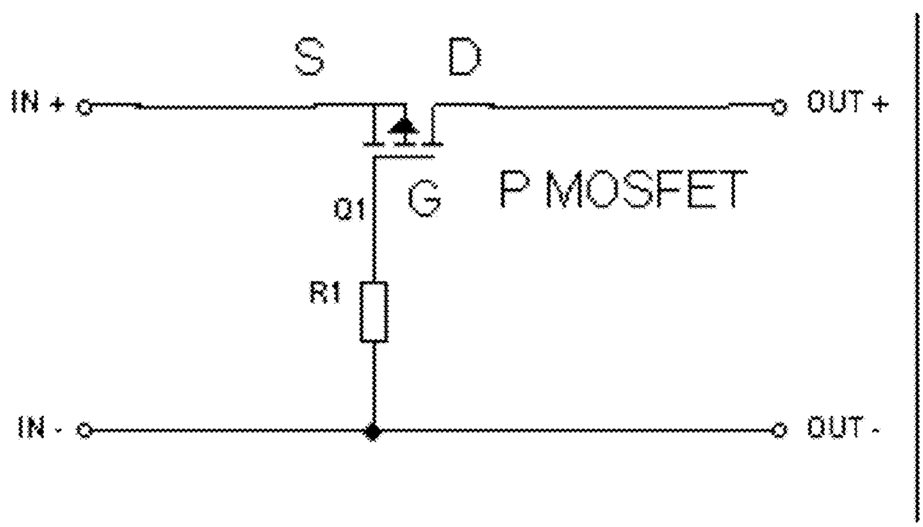
FIG. 22B shows a Voltage Level switch based on a P Channel Enhancement Mode MOSFET.

FIG. 22 shows a Voltage Level switch based on an N Channel Enhancement Mode MOSFET (a), and a P Channel Enhancement Mode MOSFET (b). The MOSFETs are chosen to have a threshold voltage that of the voltage requirements of the person location system.

Figure 23:
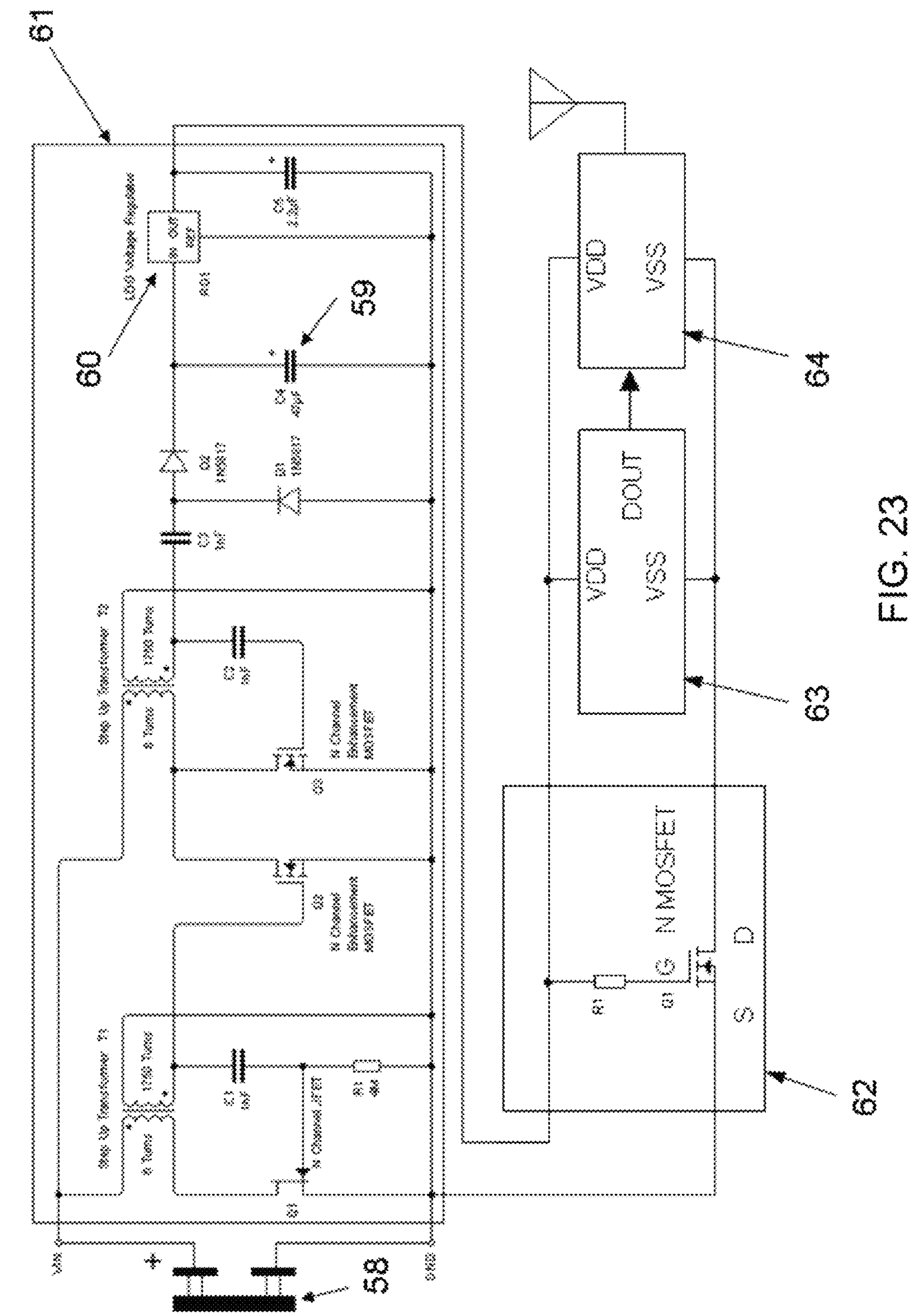
FIG. 23 shows a Body Heat Powered Person Location Device. The complete system can be housed within a wristband type enclosure.

FIG. 23 shows the Body Heat Powered Person Location Device. The complete system can be housed within a wristband type enclosure.

The heat is drawn from a 20 mm×20 mm TEG, '58', giving a voltage output from less than 20 mV to 60 mV. This energy harvesting system, '61', is the automatically starting, self-trigger circuit of FIG. 17A. The circuit charges a capacitor, '59' which is then maintained at a constant voltage by the internal voltage regular '60' to that of the person location system '63' and transmitter '64' system. Generally the transmitter is integrated as part of the person location system as a whole.

Here the storage capacitor '59' is chosen such that it has the energy requirements of the person location system. The voltage level switch '62' then only powers the person location system '63' and transmitter '64' when the desired voltage has been reached by the storage capacitor '59'. The voltage level switch N Channel Enhancement Mode MOSFET has a very low RDS(On) in the order of a few Milli Ohms (typically 0.005 Ohms). The energy stored in a capacitor is given by the following equation:

$$E=\tfrac{1}{2}CV^2 \quad \text{(Eq. 6)}$$

Where E=Energy in Joules, C=Capacitance in Farads, V=Voltage.

Example of a Popular TV Infra-Red Remote Control Powered by Body Heat

Figure 24:
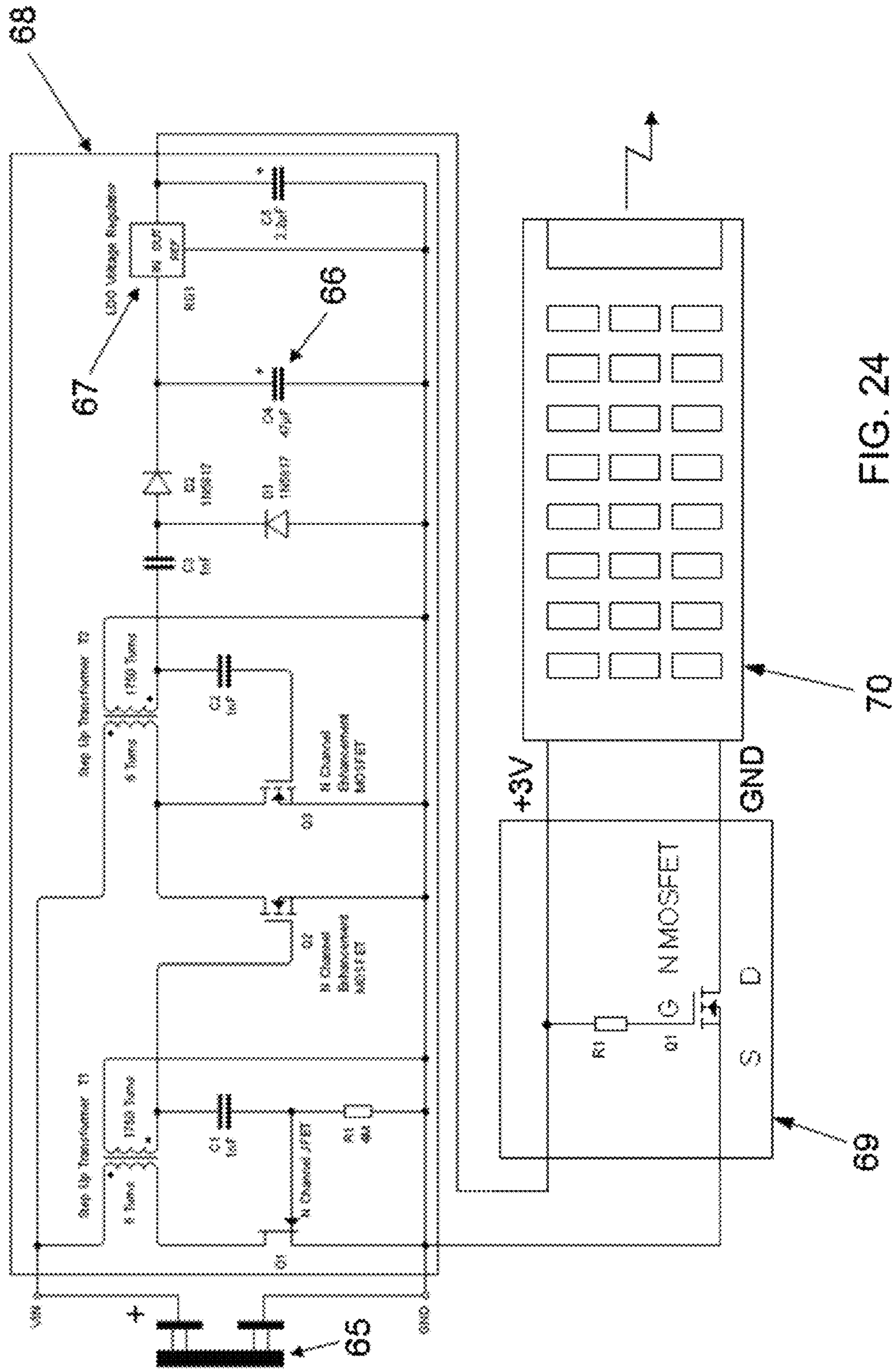
FIG. 24 shows a Body Heat Powered Energy Harvesting System retro fitted into a commercially available infra-Red TV Remote Control. When the user holds the TV remote control unit in their palm, heat is drawn and converted to electricity.

A simple modification to a popular infra-Red TV Remote Control has been made. Here the TV remote control unit normally uses two 1.5 Volt AA batteries to provide it with a 3 Volt supply. FIG. 24 shows the infra-Red TV remote control connected to a preferred embodiment of a body heat powered energy harvesting system '68' and a voltage level switch '69' to provide it with a power source other than the batteries. The complete system can be housed within the battery compartment of the TV remote control. A TEG is then attached to the back of the TV remote control. When the user holds the TV remote control unit in their palm, heat is drawn and converted to electricity.

Here, the heat is drawn from a 20 mm×20 mm TEG, '65', giving a voltage output from less than 20 mV to 50 mV. This energy harvesting system, '68', is the automatically starting, self-trigger circuit of FIG. 17A. The circuit charges a capacitor, '66' which is then maintained at a constant voltage of 3 Volts by the internal voltage regular '67' to that of the infra-Red TV Remote Control '70' supply voltage. Here the storage capacitor '66' is chosen such that it has the energy requirements of the Infra-Red TV Remote Control. Typically, a 47 μF (Micro Farad) capacitor charged to 3 Volts provides enough power to allow the desired signal strength and length of pulse stream to be detected by the TV receiver for 10 meters. The voltage level switch '69' then only powers the Infra-Red TV Remote Control '70' when 3 Volts has been reached by the storage capacitor '66'. The voltage level switch N Channel Enhancement Mode MOSFET '69' has a very low RDS(On) in the order of a few Milli Ohms (typically 0.005 Ohms). Typically, it takes less than a second to charge the 47 μF capacitor to the desired voltage. Once charged, the user does not need to provide heat to the TEG on the back of the remote control unit.

Note that due to the size of the TV remote control unit, it is possible to use larger TEGs. For example a 40 mm×40 mm TEG can provide a typical voltage greater than 50 mV with an internal resistance of 1 Ohm to still provide a high enough power in the proposed energy harvesting system '68' in FIG. 24.

Note also that the 47 μF capacitor storage capacitor '66' used in this example is a conservative value in that it can be used to power the remote control once there is no more heat from the users hand applied to the TEG. If the user is still touching the TEG once the storage capacitor '66' is charged then multiple button presses can be made. It is also possible to use a larger value capacitor for more power and hence a longer range can be obtained.

Example of a Body Heat Powered High Security Transmitter with 60-bit Seed KEELOQ® Cypher Encryption and 4 Billion Identities As a result of the tested results as observed in FIG. 21B and FIG. 21C of the real example of a body heat powered RF transmitter, it can be observed that several repetitions of a 12-bit data stream of the Holtek HT12E encoder can be transmitted at any one time due to the high power output of the energy harvesting system proposed. It is therefore possible to increase the security level by significantly increasing the number of bits of data per transmission and encrypting the data by a Cipher.

The invention therefore advantageously proposes HCS365 KEELOQ® Code Hopping Encoder by Microchip Technology Inc. designed for Remote Keyless Entry (RKE) and secure remote control systems, which incorporates high security and a small package outline.

Keyfob transmitter and RKE systems based on the KEELOQ® Cipher are widely used by popular car manufacturers and secure entry systems. A 60-bit seed KEELOQ® Cipher provides the maximum security level. The length of the transmission eliminates the threat of code scanning and code grabbing access techniques.

The invention advantageously proposes configuring the HCS365 Encoder to a 60-bit seed KEELOQ® Cipher which it is designed to provide for maximum security. This can be used inter alia for the following applications: i) RFID Tag; ii) Car Keyfob Transmitter; and iii) Remote Keyless Entry System (RKE).

FIG. 25 shows an embodiment of a Body Heat Powered RF Transmitter based on the HCS365 KEELOQ® Code Hopping Encoder. A single push button can be used for an RFID Tag or multiple ones 'B0 to B3' for a Keyfob transmitter or RKE system.

The HCS365 KEELOQ® Code Hopping Encoder '76' and the RF transmitter '77' connected to a preferred embodiment of a body heat powered energy harvesting system '74' and a voltage level switch '75' to provide it with a power source other than a coin cell battery. The complete system can be housed within the keyfob enclosure. A TEG is then attached to the back of the enclosure. When the user holds the keyfob in their palm, heat is drawn and converted to electricity.

Here, the heat is drawn from a 20 mm×20 mm TEG, '71', giving a voltage output from less than 20 mV to 50 mV. This energy harvesting system, '74', is the automatically starting, self-trigger circuit of FIG. 17A. The circuit charges a capacitor, '72' which is then maintained at a constant voltage of 3 Volts by the internal voltage regular '73' to that of the HCS365 KEELOQ® Code Hopping Encoder '76' and the AM-RT4-433 by RF Solutions Ltd 433 MHz RE transmitter '77' supply voltage.

Here the storage capacitor '72' is chosen such that it has the energy requirements of the HCS365 KEELOQ® Code Hopping Encoder '76' and the RF transmitter '77'. Typically, a 47 μF (Micro Farad) capacitor charged to 3 Volts provides enough power to allow the desired signal strength and length of pulse stream to be detected by the receiver for 10 meters.

The voltage level switch '75' then only powers the HCS365 KEELOQ® Code Hopping Encoder '76' and the AM-RT4-433 by RF Solutions Ltd 433 MHz RF transmitter '77' when 3 Volts has been reached by the storage capacitor '72'. The voltage level switch N Channel Enhancement Mode MOSFET '75' has a very low RDS(On) in the order of a few Milli Ohms (typically 0.005 Ohms). Typically, it takes less than a second to charge the 47 μF capacitor to the desired voltage. Once charged, the user does not need to provide heat to the TEG on the back of the keyfob remote control unit.

Note that the 47 μF capacitor storage capacitor '72' used in this example is a conservative value in that it can be used to power the RF transmitter once there is no more heat from the users hand, applied to the TEG. If the user is still touching the TEG once the storage capacitor '72' is charged then multiple button presses can be made. It is also possible to use a larger value capacitor for more power and hence a longer range can be obtained and a larger data code word than the one provided by the HCS365 KEELOQ® Code Hopping Encoder '76' for further security.

The HCS365 combines a hopping code generated by a nonlinear encryption algorithm, a serial number, and status bits to create a secure transmission code. The length of the transmission eliminates the threat of code scanning and code grabbing access techniques.

The HCS365 has a built-in small EEPROM (Electrically Erasable Programmable Read-Only Memory) array which is loaded with several parameters before use; most often programmed by the manufacturer at the time of production. The most important of these are: i) A serial number, typically unique for every encoder; ii) A crypt key; and iii) an initial synchronization value.

Figure 25A:
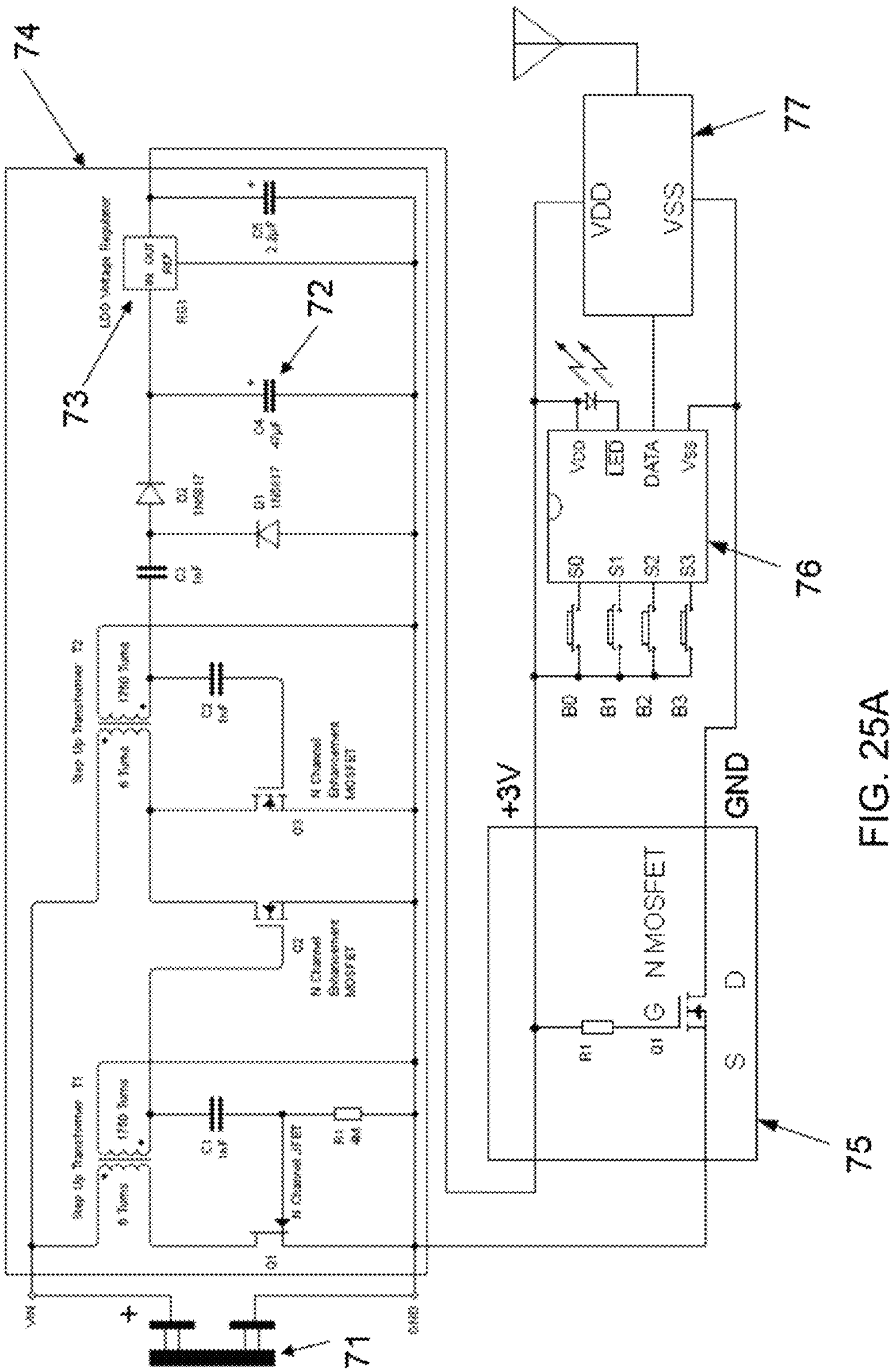
FIG. 25A shows a body heat powered RF transmitter with high security bit Seed KEELOQ® encryption for Remote Keyless Entry (RKE) and RFID systems.
Figure 25B:
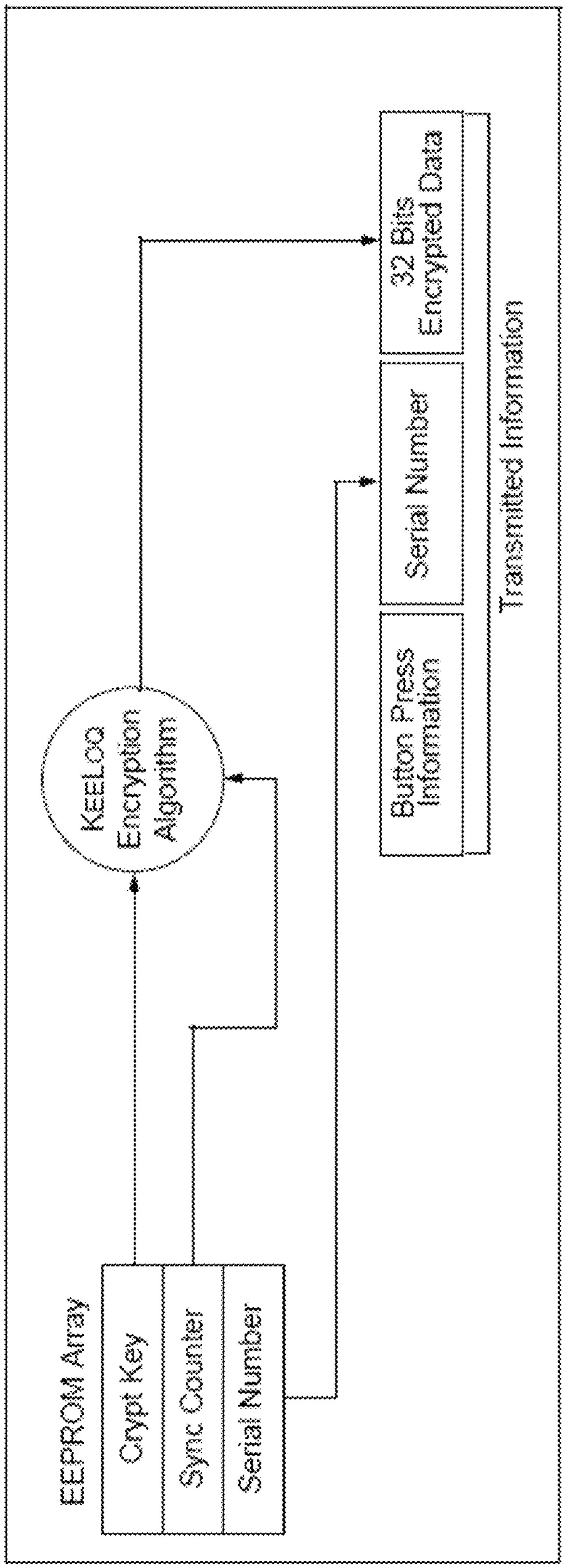
FIG. 25B shows how the transmitted code word is built in the HCS365 KEELOQ® Code Hopping Encoder.

FIG. 25B shows how the key values in EEPROM are used in the encoder. Once the encoder detects a button press, it reads the button inputs and updates the synchronization counter. The synchronization counter and crypt key are input to the encryption algorithm and the output is 32 bits of encrypted information. This data will change with every button press while its value will appear to 'randomly hop around'. Hence, this data is referred to as the hopping portion of the code word.

The 32-bit hopping code is combined with the button information and serial number to form the code word transmitted to the receiver. A receiver may use any type of controller as a decoder. Typically, it is a microcontroller with compatible firmware that allows the decoder to operate in conjunction with a HCS365 based transmitter. A transmitter is first 'learned' by the receiver before its use is allowed in the system. Learning includes calculating the transmitter's appropriate crypt key, decrypting the received hopping code, storing the serial number, storing the synchronization counter value, and storing the crypt key in the EEPROM.

The HC365 encoder can be configured to various code word formats to suit the application by using the four buttons 'B0 to B3' to program the built in EEPROM prior to use. It can provide a data word length giving up to 69-bits per data transmission.

Figure 25C:
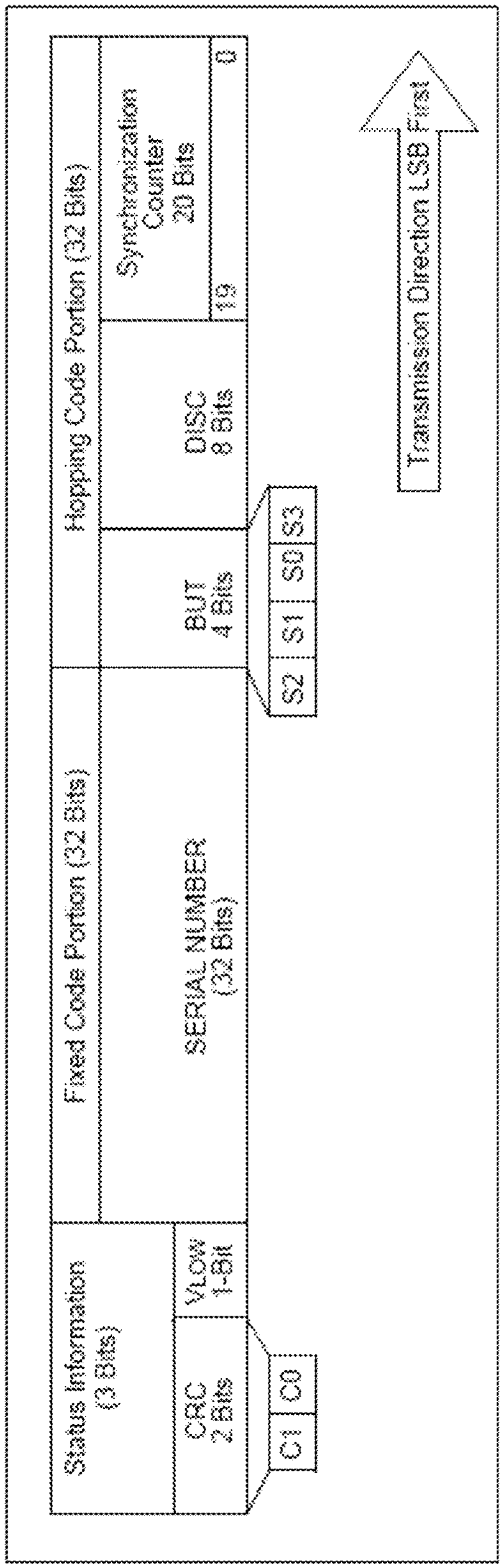
FIG. 25C shows the HCS365 KEELOQ® Code Hopping Encoder configured to a 67-bit data word and provide 4-button operation and a 2-bit serial number for 4 billion identities.
Figure 25D:
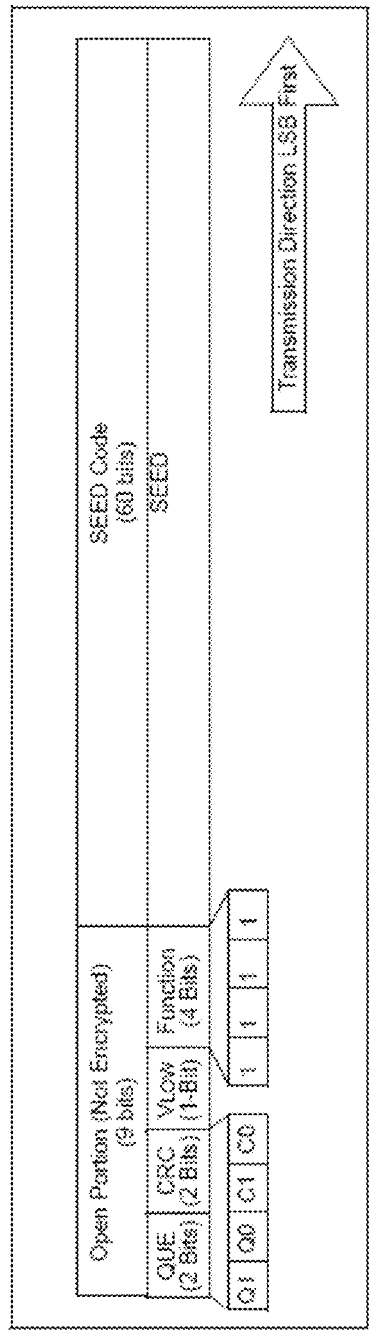
FIG. 25D shows the HCS365 KEELOQ® Code Hopping Encoder configured to a 69-bit data word and a 60-bit seed encrypted cipher for maximum data security during transmission.

FIG. 25C shows a table of a configuration of the HCS365 encoder such that it can provide 32-bits for a serial number of the manufactured part. This means 4 Billion (2 raised to the power of 32) different serial numbers can be programmed within its built in EEPROM. These bits are then transmitted together with a 32-bit KEELOQ® encrypted cipher (which provides the 'code hopping'). The remaining bits are status bits 'CRC' (Cyclic Redundancy Check) to allow a suitable decoder to check the data integrity before processing and 'VLOW' to detect if the battery voltage is lower than a predefined value. In our application the 'VLOW' bit is not required as data will not be transmitted unless the required voltage is available. This is very useful for RFID systems as one could be provided for nearly everyone on the planet.

As mentioned, the invention proposes, for added security, to configure the HCS365 encoder to provide a 60-bit seed KEELOQ® encrypted cipher. This configuration is shown in the table in FIG. 25D. An attack on the security would therefore take 100 days of processing on a dedicated parallel brute force attacking machine before the system might be broken into based the system using a 20 mm×20 mm TEG, '71'.

Here a 69-bit code word is transmitted, where 60-bits are for the Seed code and the remaining 9-bits are for the 4-bit button presses (B0 to B3) and 5-bit status bits. As well as the 'CRC' and 'VLOW' status bits, the 'QUE' bits provide information to the decoder about repeated pressing of the same buttons to instruct the decoder to carry out another function for example. To this end it is possible to provide more functions using a combination of the four buttons (B0 to B3).

If a larger sized TEG is used, such as 40 mm×49 mm a system with a 128-bit or greater key, such as 256-bits could be implemented. The world's most powerful supercomputer operating at 10.51 Pentaflops ($10.51\times10^{15}$ Flops—floating point operations per second) would therefore take $1.02\times10^{18}$ years for a 128-bit system and $3.31\times10^{56}$ years for a 128-bit system. This is based on the assumption that it takes 1000 Flops per combination check. Presently, a 60-bit seed code is sufficient while a 128-bit key is computationally secure against a brute-force attack based on the Landauer limit implied by the laws of physics.

Energy Harvesting Integrated Circuit

The electronics industry is rapidly adopting uses of alternative means to power remote, portable or off grid systems. It has been mentioned in this document that the LIC1308 integrated circuit (IC) by Linear Technology Corporation has been proved very useful for these applications. However, several limitations of this IC have also been identified in this document and possible alternative means of much higher power output have been described by way of the invention.

Figure 26A:
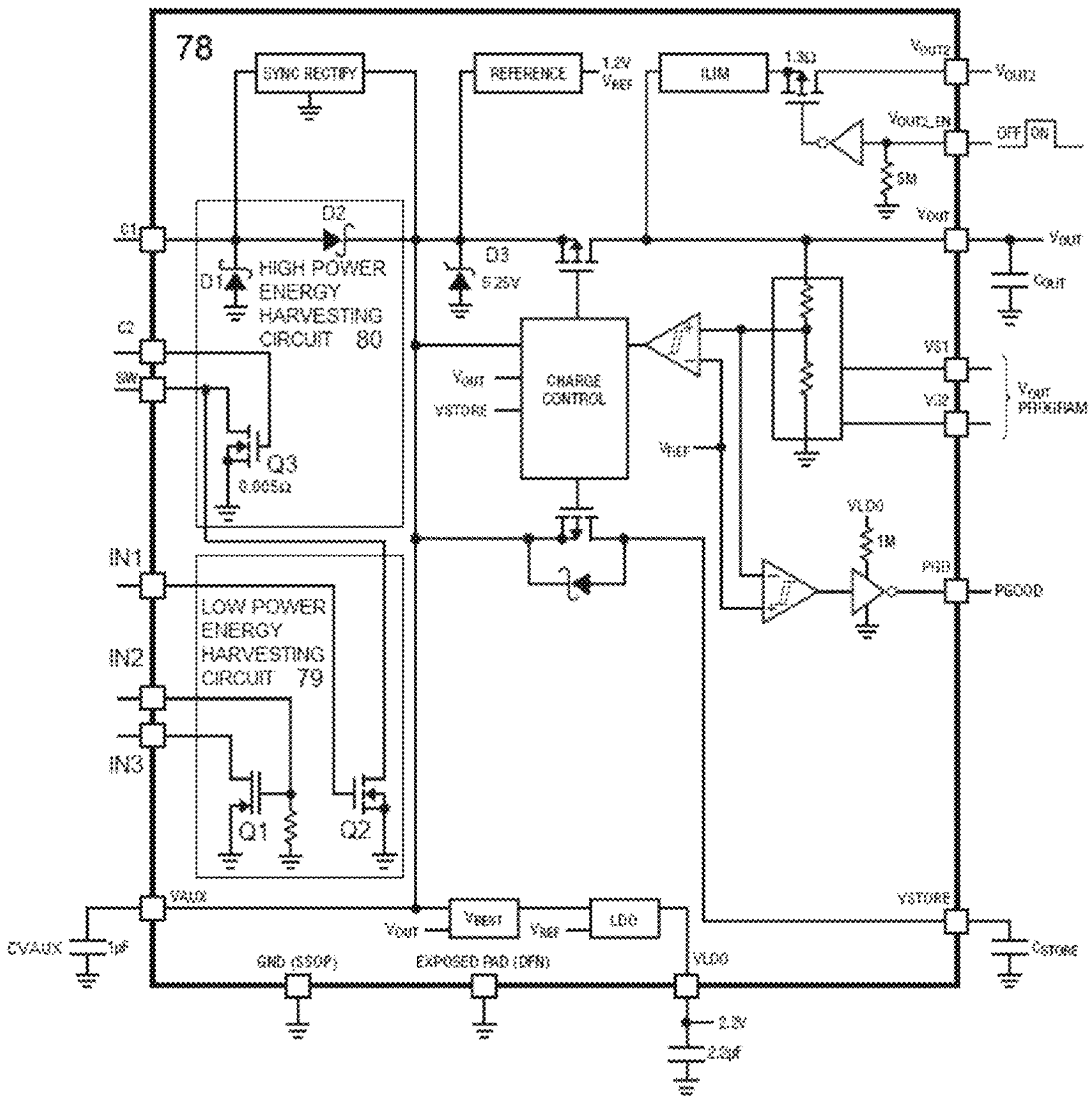
FIG. 26A shows a modified version of the Prior Art. LTC3108 energy harvesting integrated circuit illustrated in FIG. 3 showing integration of low power and high power energy harvesting circuits. Here, only three additional pins, IN1 IN2, and IN3 are required on the device.

To allow existing or possible new customers to adopt a full system IC solution combining the features of voltage regulation and power management already present within the LTC1308 with the significantly higher power and efficiency gains of the proposed energy harvesting system invention described in this document, it is proposed that the invention be fabricated inside an integrated circuit. FIG. 26A, shows one such embodiment based on the modified and much improved LTC1308 IC.

This will allow the following advantages:

- Highly integrated package, only 3 extra pins (IN1, IN2 and IN3) and 5 mm×4 mm package footprint using a 20-pin IFN package
- Providing the same input and output and power management, features as the LTC1308 IC
- Few additional external components
- Significantly more power in tens of magnitude
- Additional topologies can be used such as Flyback and Boost Converter as well as Self and Gate Triggered Forward Converter designs already proposed in this document based on application and power output requirements
- Lends itself to pocket sized electronic systems powered by energy harvesting means with power capability that was previously not possible Overview FIG. 26A shows the IC, '78' containing Low Power '79' and a High Power Energy Harvesting System '80' blocks. The existing 0.5 Ohm RDS ON N Channel Depletion Mode MOSFET is replaced with a 0.005 Ohm (5 milli Ohms) RDS ON N Channel Enhancement Mode MOSFET, 'Q3' and in combination with the rectification circuit 'D1' and 'D2' form the High Power Energy Harvesting System '80'. The Low Power Energy Harvesting System '79' comprises of a N Channel JFET or an N Channel Depletion Mode MOSFET 'Q1' and an N Channel Enhancement Mode MOSFET 'Q2' which is ideally the same as 'Q3'. 'Q1' forms the basis of an oscillator circuit, which turns 'Q2' 'ON' to merely switch the High Power Energy Harvesting '80' if used in a Forward Converter configuration. 'Q2' is not required if used for a Flyback or Boost Converter configuration as will be explained.

The energy harvested from the High Power Energy Harvesting System '80' is stored in the capacitor 'CVAUX'. The 'SYNC RECTIFY' block removes the 0.7 Volt voltage drop of diode 'Q2' during rectification once the capacitor 'CVAUX' reaches 2 Volts and the rectified voltage is limited to 5.25 V by the zener diode 'D3'. The rest of the IC relates to power management, voltage regulation and interfacing to various systems. Additional storage means such as capacitors and supercapacitors and for control and monitoring such as connection to a microcontroller if required.

Note that typical 0.005 Ohm (5 milli Ohms) RDS ON N Channel Enhancement Mode MOSFETs can switch about 100 Amps and hence require heatsinking when switching such high current loads. However, for the energy harvesting application, such currents are not present and are usually less that 1 Amp. However as it can switch 100 Amps, it will be significantly more efficient at switching 1 Amp and at these currents, a heatsink is not required and therefore the device can be fabricated within an integrated circuit. Here, the MOSFET is used for its low RDS ON feature rather than its 100 Amp current capability.

Today, Enhancement Mode MOSFETs with and RDS ON as low as of 0.0005 Ohms (0.5 milli Ohms) are available with capabilities of switching several hundred amps. It is also possible to integrate such a device in the proposed integrated circuit described in FIG. 26A for our application. Devices with 0.005 Ohms (5 milli Ohms) RDS ON are already available in abundance and are very cheap (cost less than 1 pound sterling) while meeting the proposed requirements of the invention.

However, due to the lack of the need for a large metal area for heatsinking, the cost in integrating it as part of the integrated circuit is reduced to a few pence sterling as well as the area. Therefore it is ideally suited for the proposed integrated circuit described in FIG. 26A.

Proposed IC in Self Triggered Forward Converter Configuration

Figure 26B:
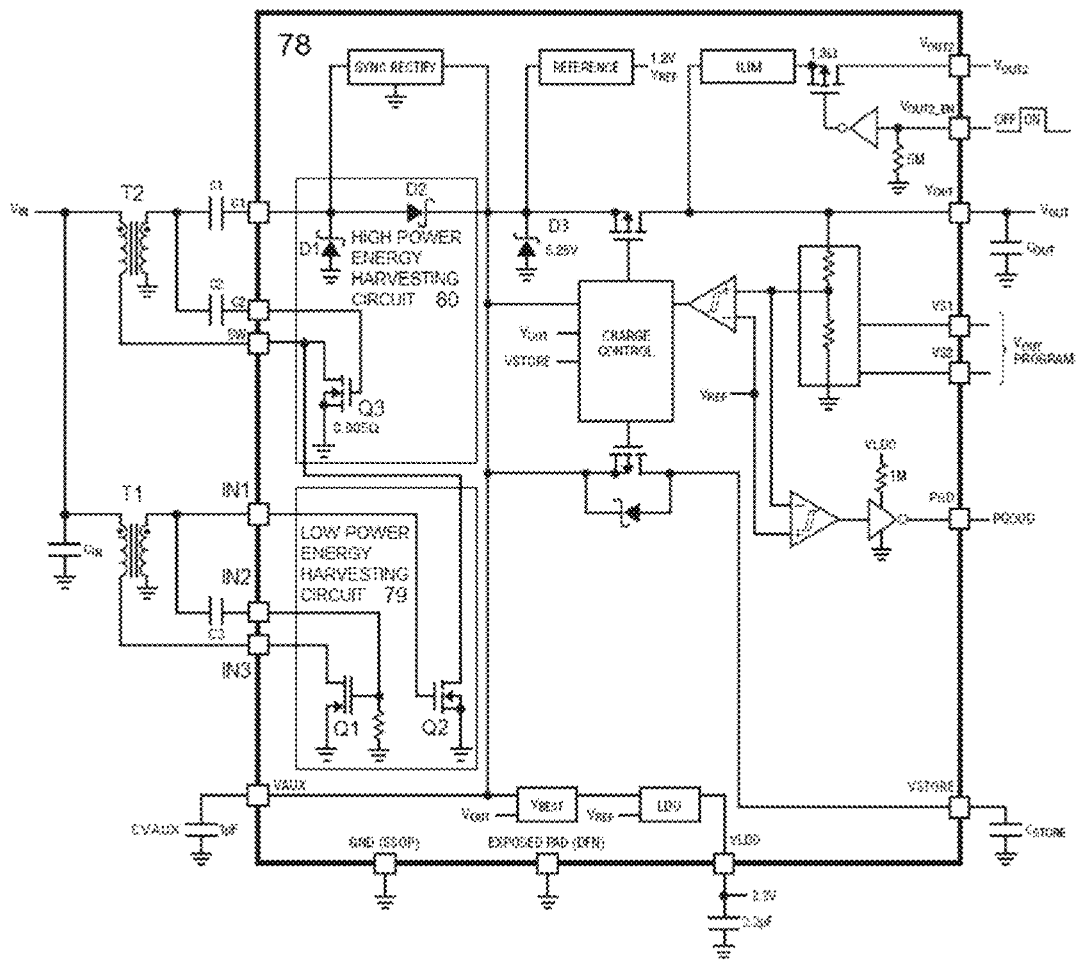
FIG. 26B shows a Self-Triggered Forward Converter Energy Harvesting System based on the proposed integrated circuit of FIG. 26A.

FIG. 26B shows the integrated Circuit (IC) '78' configured as a Self-Triggered Forward Converter which forms the same circuit as the preferred energy harvesting circuit as described in FIG. 17*a*.

The Low Power Energy Harvesting Circuit '79' takes advantage of a Depletion Mode FET (always 'ON') together with the advantage of the high input impedance of FETs in general.

'Q1' is an N Channel JFET or a N Channel Depletion Mode MOSFET. For the purpose of this example, it is a 'J106' JFET and hence its specification is used to describe the system operation. Also, for this example, the photoflash disposable camera step-up transformers described in FIG. 17A are used for 'T1' and 'T2'.

At zero volts 'Q1' is On and allows a small amount of current through its Drain and Source terminals causing the input source voltage to be presented across the primary winding (6 Turns) of the step-up transformer 'T1'. This in turn will be boosted by 291.66 (1750/6) times and switch the gate of the JFET off by a negative voltage swing equaling its Turn Off voltage of −2 Volts to 6 Volts.

The circuit will then oscillate by way of a sinusoidal waveform swing of +/−6 Volts. The capacitor 'C2' forms part of a resonant tank circuit between the inductance of the transformer 'T1' secondary windings, and the input Gate Source capacitance of the N Channel JFET. This is to allow the oscillating frequency to be towards the self-oscillating frequency of the transformer 'T1' to allow into perform at its optimum.

This is a low power circuit as the N Channel JFET used is a J106 which has an RDS(On) of 6 Ohms and hence although the voltage swings between −6 and 6 Volts, it is of a low current. However, this will be sufficient to turn on the High Power Energy Harvesting Circuit '80' by way of the N Channel Enhancement Mode MOSFET, 'Q2' which has an RDS(On) of 0.005 Ohms and a 'Turn On' voltage of 2 Volts but a very high impedance of tens of millions of ohms which makes it very easy to drive. This will be done instantaneously, which is the moment the voltage to the gate of 'Q2' is above 2 Volts. At this point the input voltage will be presented at the primary of transformer 'T2' and boosted by 291.66 (1750/6) times and switch the N Channel Enhancement Mode MOSFET 'Q3' on which is the same specification as 'Q2', The transformer 'T2' and the N Channel Enhancement Mode MOSFET 'Q3' then form a self-oscillating circuit operating at resonant frequency similar to FIGS. 16A and 16B. As the RDS(On) of 'Q3' is very low at 0.005 Ohms and the N Channel JFET 'Q1' has high RDS (On) of 6 Ohms, once 'Q3' turns on, it forms a short circuit effect across N Channel JFET 'Q1'. Therefore, the power will now be transferred to the high power energy harvesting circuit from the input voltage source and charge the storage element very quickly. In this case less than 1 second to charge the capacitor 'CVAUX' with an input voltage 'VIN' of less than 20 mV (0.02 Volts).

'C1' is a de-coupling capacitor and together with 'D1' make the sinusoidal waveform from being centered on the zero volts axis to make the waveform positive only. 'D2' then acts as a rectifier charging the capacitor 'CVAUX' on the positive peaks of the waveform. Note that the capacitor 'C4' shown in FIG. 17A was 47 uF so capacitor 'CVAUX' at 1 uF of FIG. 27B will charge significantly more quickly.

The 'SYNC RECTIFY' block removes the 0.7 Volt voltage drop of diode 'D2' during rectification once the capacitor 'CVAUX' reaches 2 Volts and the rectified voltage is limited to 5.25 V by the zener diode 'D3'. The main storage element is 'COUT' which is terminated at the 'VOUT' pin which is charged once 'CVAUX' reaches 2 volts. 'COUT' will be kept regulated at the users desired voltage by connecting pins 'VS1' and 'VS2' to either 'GND' or 'VAUX'.

The rest of the IC relates to power management, voltage regulation and interfacing to various systems, additional storage means such as capacitors and supercapacitors and for control and monitoring such as connection to a microcontroller if required.

Proposed IC in Gate Triggered Forward Converter Configuration

Figure 26C:
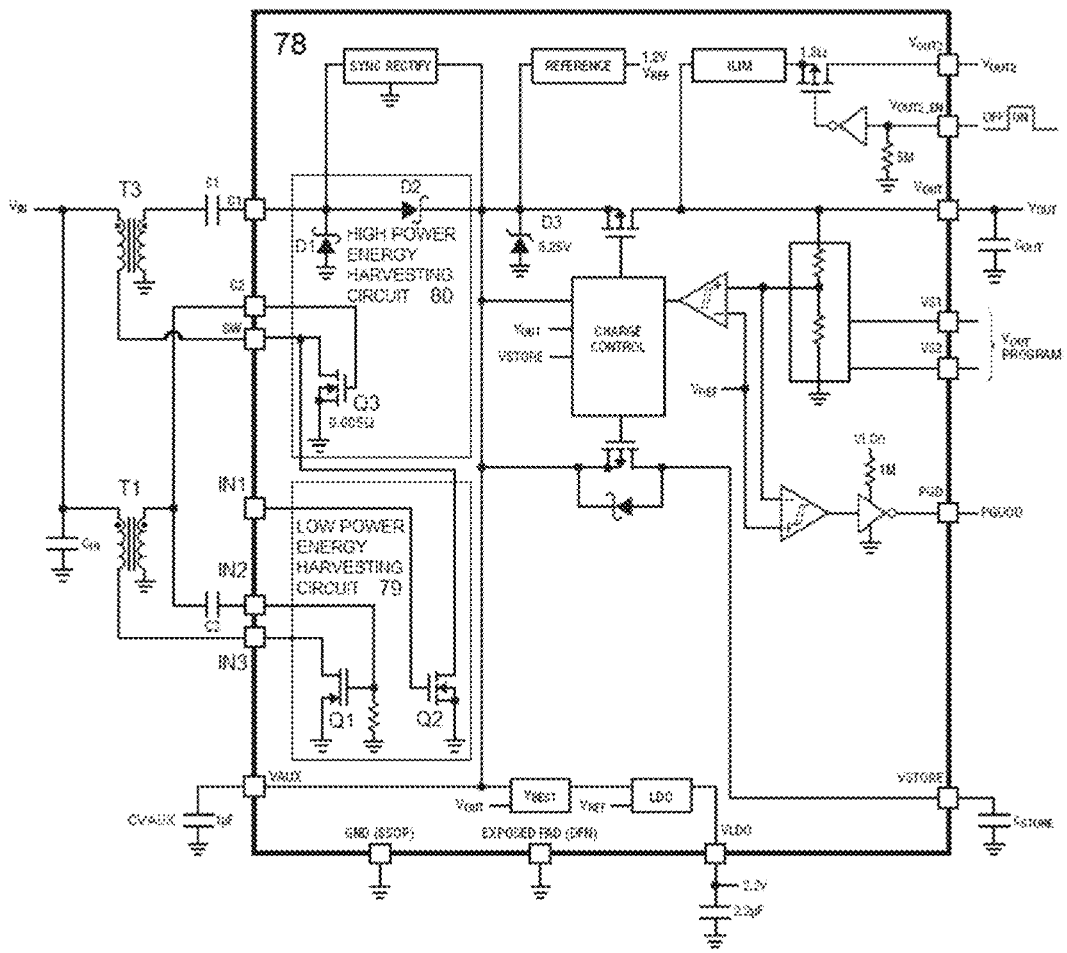
FIG. 26C shows a Gate-Triggered Forward Converter Energy Harvesting System based on the proposed integrated circuit of FIG. 26A.

FIG. 26C shows the Integrated Circuit (IC) '78' configured as a Gate Triggered Forward Converter configuration which forms the same circuit as the preferred energy harvesting circuit as described in FIG. 18.

Operation is similar to that described in FIG. 26B, however, the Low Power Energy Harvesting Circuit '79' creates pulses to switch the N Channel Enhancement Mode MOSFET 'Q3' 'ON' and 'OFF' in the High Power Energy Harvesting Circuit '80'. The secondary windings of transformer 'T3' step the input voltage 'VIN' up by 291.66 (1750/6) and charge the storage element 'CVAUX'. The rest of the operation is as described for FIG. 26B.

Here there is no resonant tank circuit between the secondary of the transformer 'T3' and the Gate Source of the N Channel Enhancement Mode MOSFET 'Q3' (unlike FIGS. 16A, 16B, 17 and 26B). Instead, the Low Power Energy Harvesting Circuit '79' frequency output is set to that of the resonant frequency of the transformer 'T3' in the High Power Energy Harvesting Circuit '80'.

This is to allow the use of a very wide range of transformers 'T3' to be used in the High Power Energy Harvesting system '80'. Hence the system can still operate at the transformer 'T3' resonant frequency for optimum power output.

As mentioned in more detail in the 'External Gate Triggered Forward Converter' section of this document, in the present invention it is particularly preferred that the step up transformer cores in the forward converter circuits are of high relative permeability. Hence, it is particularly preferred that the step up transformer cores are of high relative permeability when implemented with the following proposed Integrated Circuit (IC) forward converter configurations: i) A high relative permeability between 5000 to 20.000 is particularly preferred for the Low Power Energy Harvesting Circuits '79' in FIG. 26B and FIG. 26C and the 'Self Triggered' High Power Energy Harvesting Circuit '80' of FIG. 26B: and ii) A high relative permeability of 20.000 is particularly preferred for the 'External Gate. Triggered' High Power Energy Harvesting Circuit '35' of FIG. 18. Preferred examples of high permeability materials are Nanoperm® nanocrystailine magnetic alloy or Metglas® amorphous magnetic alloy. These transformers may still be the same size as the disposible camera transformer allowing a versatile small form factor while giving significant power and efficiency gains and enabling the circuit of the present invention to operate effectively for the proposed applications.

Proposed IC in Flyback Converter Configuration

Figure 26D:
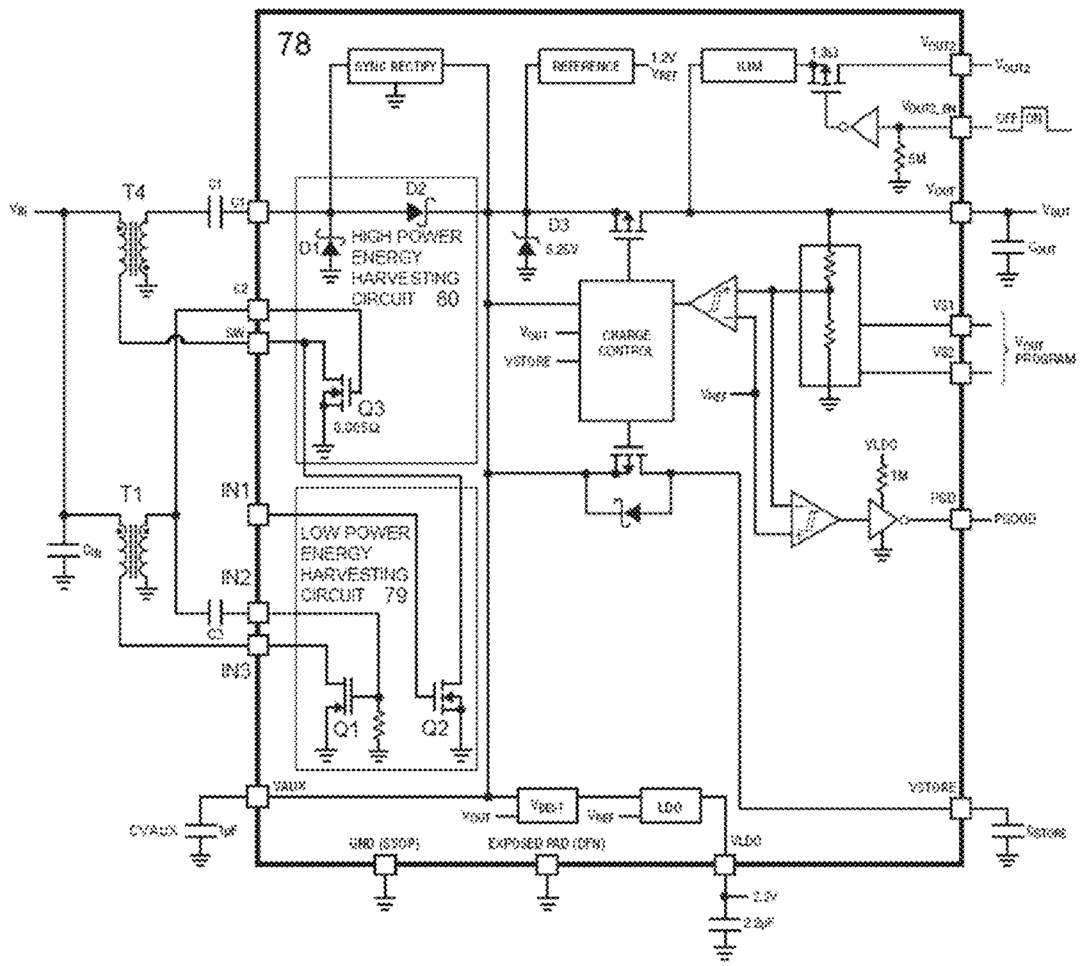
FIG. 26D shows a Flyback Converter Energy Harvesting System based on the proposed integrated circuit of FIG. 26A.

FIG. 26D shows the Integrated Circuit (IC) '78' configured as a Flyback Converter which forms the same circuit as the preferred energy harvesting circuit as described in FIG. 19A.

Operation is similar to that described in FIG. 19A. The Low Power Energy Harvesting Circuit '79' creates pulses to switch the N Channel Enhancement Mode MOSFET 'Q3' 'ON' and 'OFF' in the High Power Energy Harvesting Circuit '80'. The black dots on the transformer 'T4' shows the starting of the windings. Here you will notice the actual polarities between primary and secondary are reversed relative to 'GND' which is opposite to that of 'T1'. When the gate to 'Q3' is high, the primary side of the transformer 'T4', which is essentially a coupled inductor is charged. When the gate of 'Q3' goes low, the energy from the primary side is released (Back-EMF). At this point, the secondary windings step this voltage up and charge the storage element 'CVAUX'. The rest of the operation is as described for FIG. 26B.

To sum rise:

- The output of the Low Power Energy Harvesting System '79' and the High Power Energy Harvesting System circuit '80' are not 'High' at the same time but rather during opposite times hence less drain on the input power supply
- The Back-EMF generated is a factor of the current as well as the inductance of the primary side of the flyback transformer 'T4', hence a low voltage high current source such as a TEG together with the low RDS(On) of 0.005 Ohms of N Channel Enhancement Mode MOSFET 'Q3' are advantageous even at very low voltages
- Due to the high primary current, high voltage peaks are possible with a low number of secondary transformer windings for the flyback transformer 'T3'
- A reduced number of secondary windings means the output current \mil be high and hence a high output power is possible As mentioned in more detail in the 'Flyback Converter' section of this document, in the present invention it is particularly preferred that the flyback transformer cores are of high relative permeability.

In the present invention it is therefore particularly preferred that the core of the flyback transformer 'T4' be of high relative permeability, i.e. at least 20.000 when implemented with the proposed Integrated Circuit (IC) 'Flyback Converter' configuration in FIG. 26D. Preferred examples are Nanoperm® nanocrystalline magnetic alloy or Metglas® amorphous magnetic alloy. These transformers may still be the same size as the disposable camera transformer allowing a versatile small form factor while giving significant power and efficiency gains and enabling the circuit of the present invention to operate effectively for the proposed applications. Note that core materials of a higher relative permeability than 20,000 are possible for the transformer in the flyback converter configuration as it does not operate at a resonant frequency but rather it is based on the charge and discharge times of the primary winding inductance which is a factor of the input current. Using Nanoperm® nanocrystailine magnetic alloy or Metglas® amorphous magnetic alloy will also prevent high frequency saturation at high currents.

Proposed IC in Boost Converter Configuration

A boost converter is a simplified flyback converter whereby only an inductor is used and there is no step up of the voltage. So the behaviour of operation is the same as FIG. 26D without the secondary transformer windings of 'T4'. As there are no secondary windings, the current remains the same (that is, it is not stepped down).

Like the boost converter configuration of FIG. 20A, it is possible to get high current and the required voltages without a step up transformer or flyback transformer in the proposed invention by using a high inductance inductor with low DC resistance.

Figure 26E:
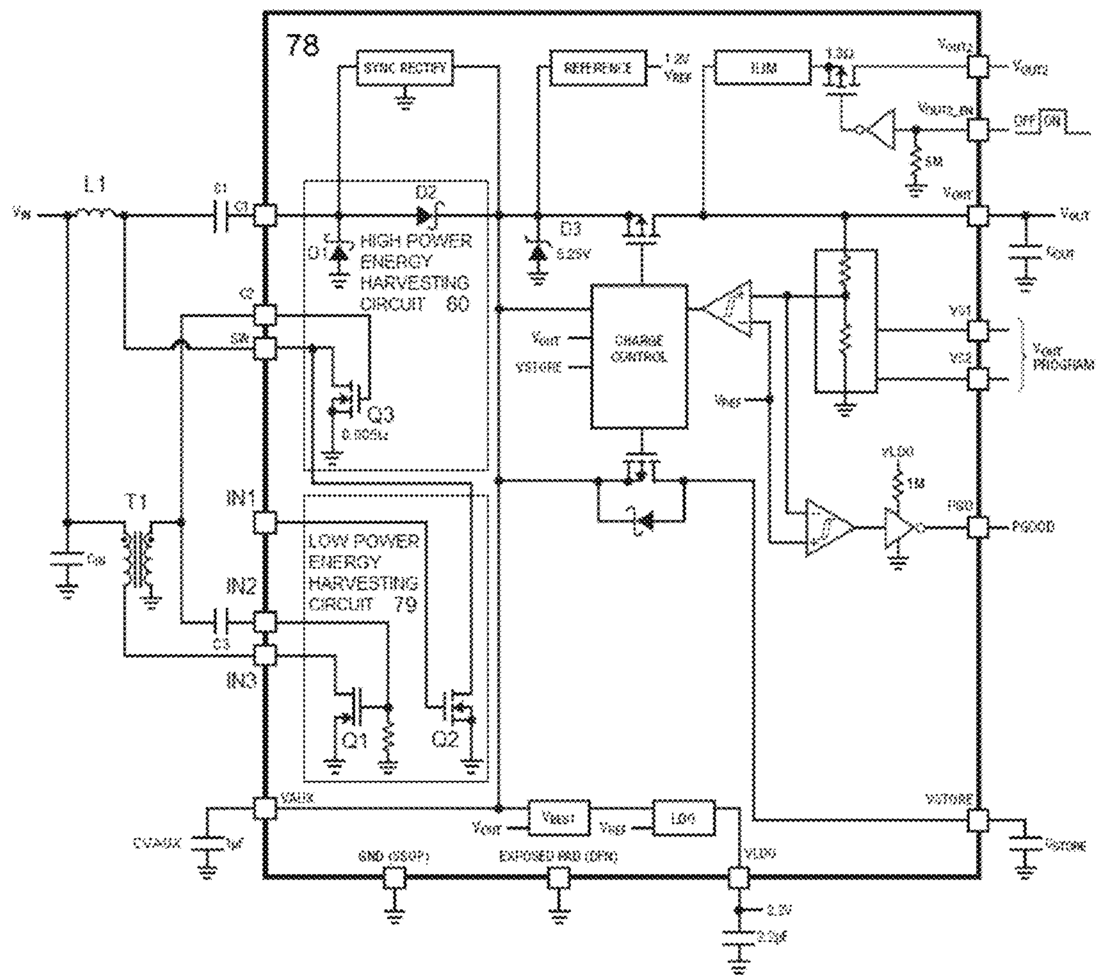
FIG. 26E shows a Boost Converter Energy Harvesting System based on the proposed integrated circuit of FIG. 26A.

FIG. 26E shows the Integrated Circuit (IC) '78' comprising the High Power Energy Harvesting Circuit '80' configured as a boost converter with an inductor, 'L1'. The inductor, 'L1' is again wound on a Nanoperm® nanocrystalline magnetic alloy high relative permeability core of 90,000. Operation is similar to that described in FIG. 26D. The Low Power Energy Harvesting System '79' creates pulses to switch the N Channel Enhancement Mode MOSFET 'Q3' 'ON' and 'OFF' in the High Power Energy Harvesting System '80'. However, when the gate to 'Q3' is high, the inductor 'L1' is charged. When the gate of 'Q3' goes low, the inductor 'L1' is released (Back-EMF) and charge the storage element 'CVAUX'. The rest of the operation is as described for FIG. 26B. At this point, the secondary windings step this voltage up and charge the storage element 'CVAUX'. The rest of the operation is as described for FIG. 26B.

To summarize: i) The Back-EMF generated is a factor of the current as well as the inductance of the inductor 'L1', hence a low voltage high current source such as a TEG together with the low RDS(On) of 0.005 Ohms of the N Channel Enhancement Mode MOSFET 'Q3' are advantageous even at very low voltages; ii) A high relative permeability core will provide: High inductance with a low number of turns and therefore high Back-EMF. Lower saturation at high current, and Lower saturation at high frequency Thick wires for the windings can be used due to the reduced number of turns to reduce DC resistance or multiple wires in parallel for high frequency due to 'skin effect'. Output power is high due to higher frequency capability, high current and voltages above the threshold voltage (0.7 Volts or more) of conventional semiconductor devices. As mentioned in more detail in the 'Boost Converter' section of this document, in the present invention it is particularly preferred that the cores are of high relative permeability. In the present invention it is therefore particularly preferred that the core of the inductor 'L1' be of high relative permeability, i.e. at least 80,000 when implemented with the proposed Integrated Circuit (IC) 'Boost Converter' configuration in FIG. 26E. The inductor may still be compact in size for portable or small form factor applications while giving significant power and efficiency gains and enabling the circuit of the present invention to operate effectively for the proposed applications. Preferred examples are Nanoperm® nanocrystailine magnetic alloy or Metglas® amorphous magnetic alloy.

Example of a Body Heat Powered Wireless Health Monitoring System

Like the person location system example of FIG. 23, here a body heat powered wireless health monitor requires that various vital signs of a patient are transmitted to medical staff at a regular rate.

To allow the possibility of sending burst transmission using a body heat based power source, the system advantageously has a capacitor and voltage level switch. Here the storage system is charged to a specified voltage to the Wireless Health Monitor power requirements. If and only then is power from the storage capacitor is applied to it. The advantage is that the Wireless Health Monitor consumes zero power until there is enough power to drive it. This is unlike existing battery powered systems where there is a microprocessor in 'Sleep Mode' which consumes some power until it is awakened to send the burst transmission. The voltage level switch comprises a MOSFET chosen to have a threshold voltage that of the voltage requirements of the Body Heat Powered Wireless Health Monitor.

Figure 32:
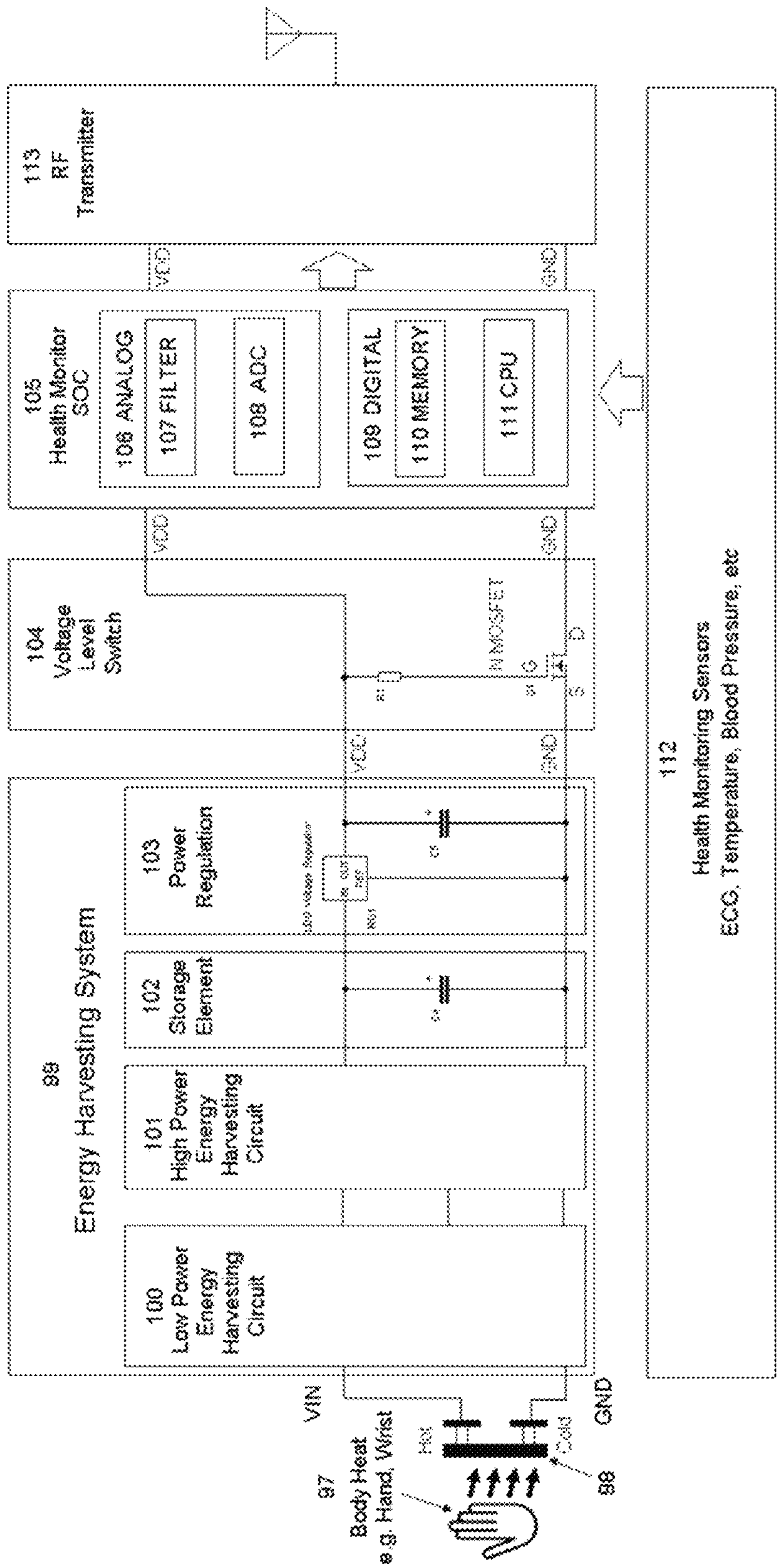
FIG. 32 shows an example of a Body Heat Powered Wireless Patient Health Monitor to measure vital signs such as EGG, body temperature and blood pressure. The device can be worn on the patients wrist or integrated into clothing.

FIG. 32 shows the Body Heat Powered Wireless Health Monitor. The heat is drawn from a 20 mm×20 mm TEG, '98', giving a voltage output from less than 20 mV to 50 mV. This energy harvesting system, '99', can be the automatically starting, self-trigger circuit of FIG. 17A, FIG. 19A or FIG. 20A and further minimisation is obtained by using the proposed Integrated circuit of FIG. 26A.

The complete system can be housed within a wristband type enclosure as the Health Monitor System On Chip (SOC) '105' package size is less than 10 mm×10 mm. The various sensors '112' are placed around the body and a lead connected to it via a small connector.

The circuit charges a capacitor, '102' which is then maintained at a constant voltage by the internal voltage regular '103' to that of the Health Monitor System On Chip (SOC) '105' and transmitter '113' system.

Here the storage capacitor '102' is chosen such that it has the energy requirements of the complete Wireless Health Monitoring system. The voltage level switch '104' then only powers the Wireless Health Monitoring system '105' and transmitter '113' when the desired voltage has been reached by the storage capacitor '102'. The voltage level switch '104' comprises an N Channel Enhancement Mode MOSFET and has a very low RDS(On) in the order of a few Milli Ohms (typically 0.005 Ohms) to deliver a high current output.

Observing the blocks within the Health Monitor System, the power requirements are shown in Table 1. The digital section '109' also contains a 128-bit KEELOQ® Code Hopping Encoder which is vital for patient security.

TABLE 1

Power requirements of various blocks of the Wireless Health Monitor

| Block | | Power |
|---|---|---|
| System On Chip (SOC) | Analog | 0.1 mW |
| | Digital | 1 mW |
| RF Transmitter | | 6.72 mW |
| Total | | 7.73 mW |

The highest frequency of data from the sensors is 250 Hz and is sampled at twice the frequency, 500 Hz, by the 10-bit ADC (Analog to Digital Converter) '108' of the Health Monitor SOC '105' in FIG. 32. With a total power requirement of 7.73 mW referring to Eq. 6 again below, for the energy stored in a capacitor, we can determine the value of the capacitor based on the rate of time required to track the patient's health:

$$E=\tfrac{1}{2}CV^2 \quad \text{(Eq. 6)}$$

Where E=Energy in Joules, C=Capacitance in Farads, V=Voltage.

Referring to Eq.1 for power, it can be re-written in terms of the rate of energy per second;

$$P=VI=\text{Number of Joules Per Second}$$

A popular ISM (industrial, scientific and medical) band RF transmitter of 433 MHz consumes an average of 3.2 mA (5 milli Amps or 0.0032 Amps) with a supply voltage 2.1 Volts giving the 6.72 mW power figure. The rest of the Health Monitor SOC require a lower voltage, down to 1 Volt and much lower power. Re-arranging Eq. 6 for the Capacitance we get the following:

$$C=2\times E/V^2$$

With an average voltage of 2.5 Volts we get:

$$C=2\times 0.00773/2.5\times 2.5=2473.6\text{ uF}$$

This is the total capacitance for a full one second of data transmission.

The ADC '108' can sample 10 thousand bits per second (10 kbps) at very lithe power as it is within the Analog block '106' and the RF transmitter '113' can also transmit 10 kbps. The digital section '109' also contains a 128-bit KEELOQ® Code Hopping Encoder which is vital for patient security so 128 bits of every transmission are required for security require very little power. However it is required that the patient can be monitored every minute and not every second. Therefore, a smaller capacitor can be used to ensure the full 10 thousand bits are transmitted with a minute (60 seconds) while recharging several times between transmissions. A 220 uF (micro Farads) capacitor charged to 2.5 Volts in 5 seconds meets this requirement. Where 2473.6/220=11.24 charged cycles with a 60 second period at 5.33 seconds each. Using the energy harvesting systems of FIGS. 17A, 19*a* and 20*a*, it is possible to meet this requirement the charge time requirements of the 220 μF capacitor.

Figure 27A:
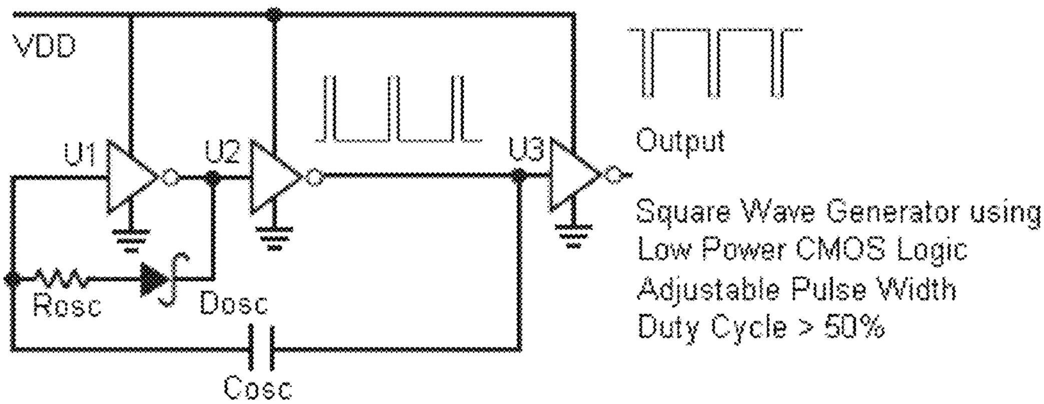
FIG. 27A shows a Square Wave Generator using CMOS logic gates with adjustable Pulse Width and Duty Cycle >50%.
Figure 27B:
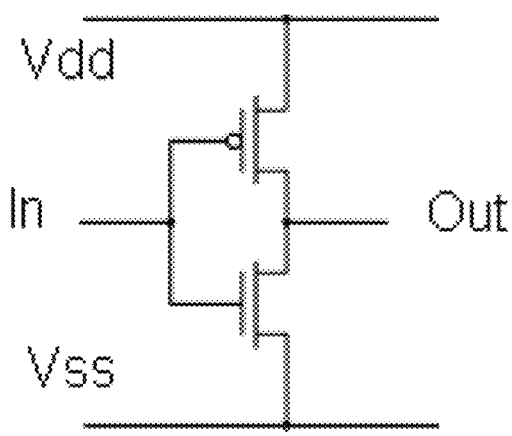
FIG. 27B shows a CMOS Inverter consisting a P and an N Channel Enhancement Mode MOSFET which have a high input impedance and low gate capacitance and are easy to drive.

Optimised Square Wave Gate Triggering for Flyback and Boost Converter Embodiment of the Energy Harvesting Systems Maximum power output can be obtained if the low RDS(ON) Enhancement Field Effect MOSFET is driven by a square wave with at least a 50% duty cycle. So ideally, a PWM (Pulse Width Modulation) system is used. The square wave shape and longer pulse duration enables the inductor current to be ramped up faster and to be charged for longer each cycle thus providing high current and thus higher power output. However, square wave generators with variable pulse widths of >50% can be complex and consume too much power for such a low voltage energy harvesting system with a body heat system where the available voltage is less than 0.1 Volts, typically 20 mV to 50 mV and 0.2 Ohms DC resistance from a Peltier element that is 20 mm×20 mm. However, a simple PWM with variable duty cycle grater that 50% can be implemented using low power CMOS logic gates. One such example is based on a Hex 4069 integrated circuit which contains six logic inverters as shown in FIG. 27A. Resistor 'Rosc' and capacitor 'Cosc' to provide the duty cycle and frequency. The diode 'Dosc' is biased such that the output of the second inverter provides a duty cycle less than 50%. The third inverter 'U3' inverts this to generate the square wave with a duty cycle greater than 50%. The CMOS Inverter consists of P and N Channel Enhancement Mode MOSFETs which have a high input impedance and low gate capacitance and are easy to drive. This is shown in FIG. 27B.

The Hex 4069 inverter can easily be driven by the Low Power Energy Harvesting Circuit and only a 2.2 μF (micro Farads) capacitor is needed to maintain a clean stable 3 Volts when a 20 mm×20 mm TEG with 0.2 Ohms DC resistance delivers 20 mV to 25 mV by body heat. Additional inverters can be used in parallel to provide higher drive capability (such as the three remaining out of the six in the package. The Square Wave Generator of FIG. 27A could therefore provide a 3 Volt Peak to Peak output with sufficient current to drive the low RDS(ON) 0.005 Ohm N Channel Enhancement Mode MOSFET of the preferred embodiment.

Figure 28:
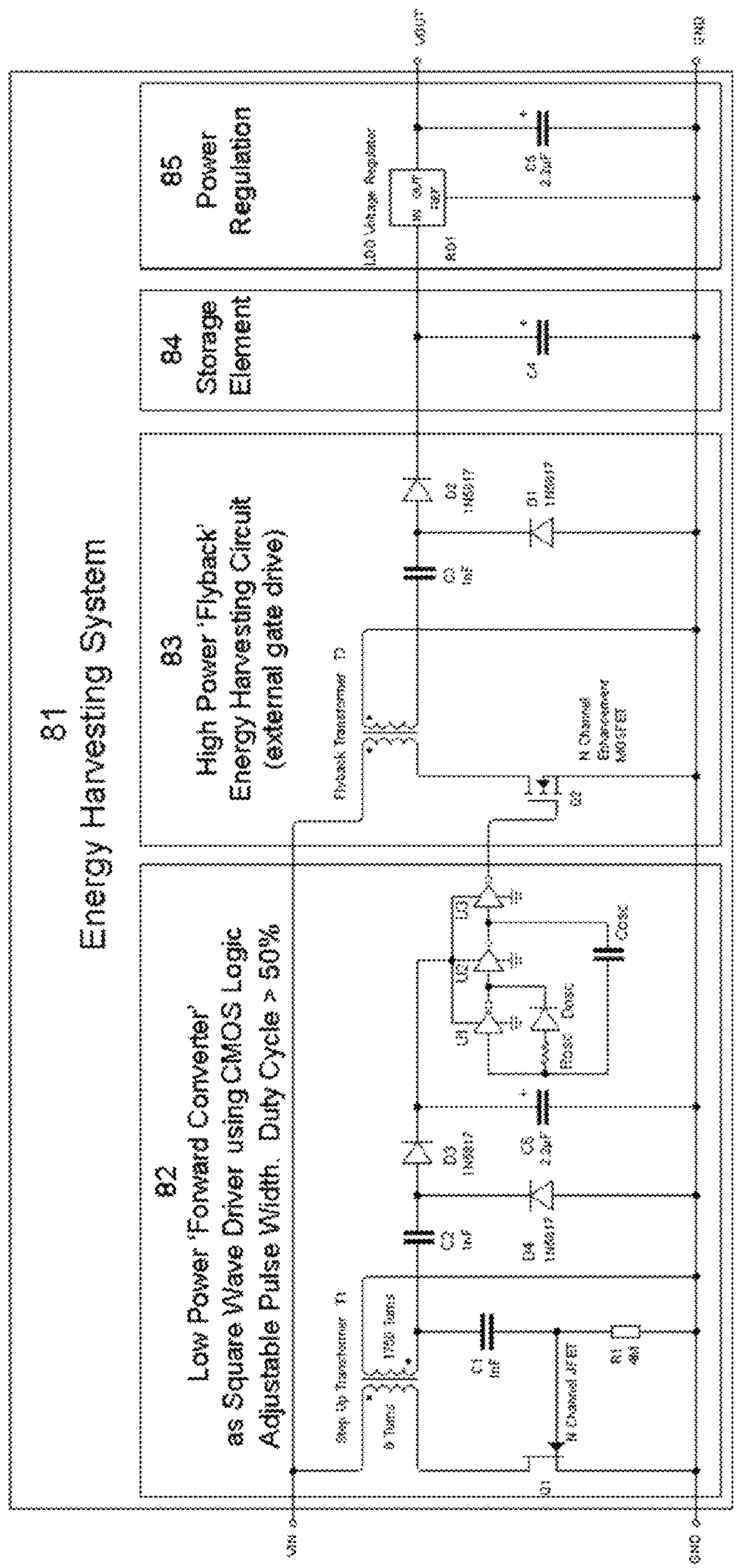
FIG. 28 shows a Square Wave triggered Flyback Converter Energy Harvesting System of based on a modified version of FIG. 19A. Here, the Low Power Energy Harvesting Circuit powers CMOS logic gates with adjustable Pulse Width and Duty Cycle >50% to provide the gate pulses to the High Power Energy Harvesting Circuit.
Figure 29:
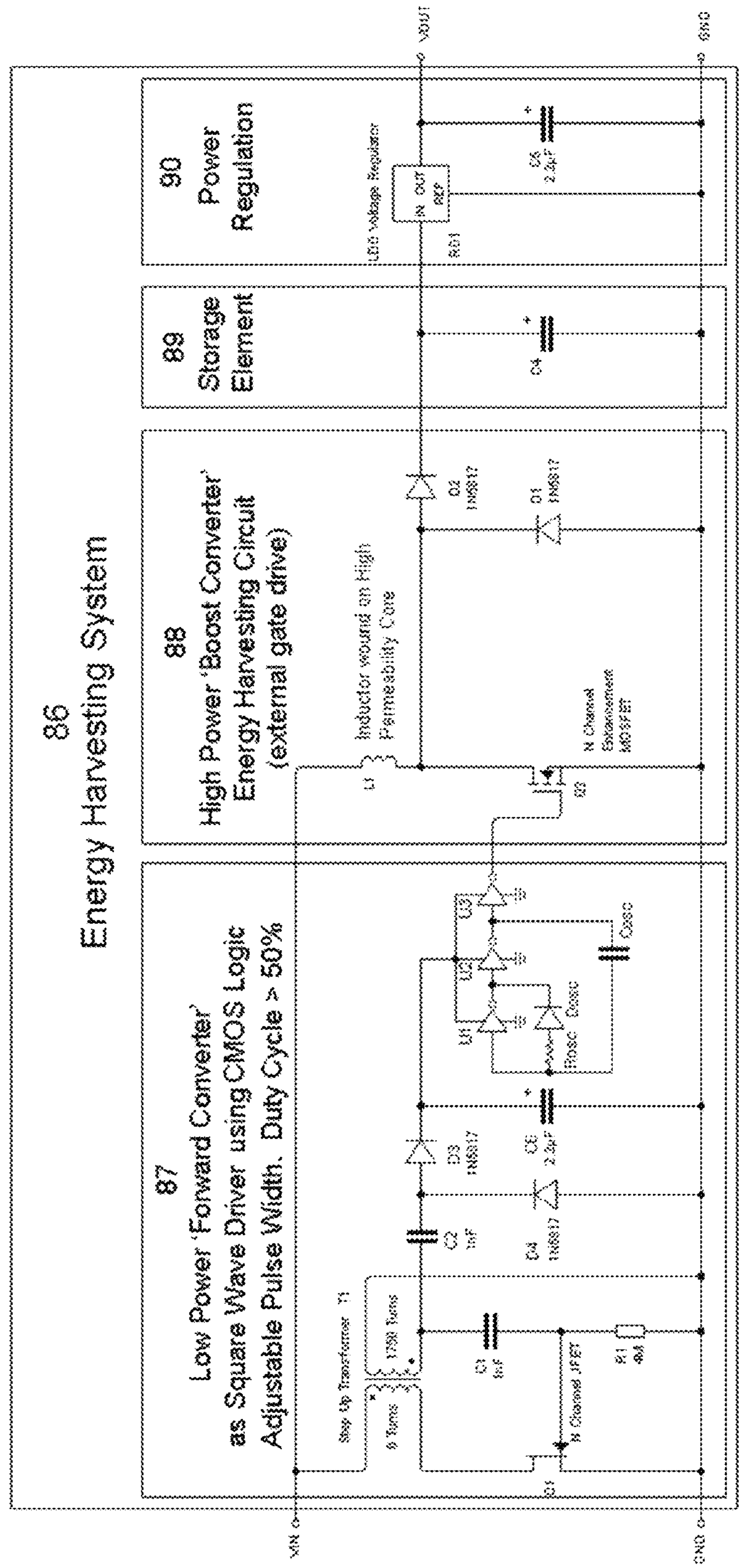
FIG. 29 shows a square wave triggered Boost Converter Energy Harvesting System of based on a modified version of FIG. 20A. Here, the Low Power Energy Harvesting Circuit powers CMOS logic gates with adjustable Pulse Width and Duty Cycle >50% to provide the gate pulses to the High Power Energy Harvesting Circuit.

FIG. 28 shows a Square Wave triggered Flyback Converter Energy Harvesting System of based on a modified version of FIG. 19A. Here, the Low Power Energy Harvesting Circuit powers CMOS logic gates with adjustable Pulse Width and Duty Cycle >50% to provide the gate pulses to the High Power Energy Harvesting Circuit;

FIG. 29 shows a square wave triggered Boost Converter Energy Harvesting System of based on a modified version of FIG. 20A. Here, the Low Power Energy Harvesting Circuit powers CMOS logic gates with adjustable Pulse Width and Duty Cycle >50% to provide the gate pulses to the High Power Energy Harvesting Circuit.

Optimised Square Wave Gate Triggering for Flyback and Boost Converter Embodiments of the Proposed Energy Harvesting Integrated Circuit The CMOS logic gates in FIG. 27A are ideal for Integrated Circuit (IC) applications and are easily integrated within the proposed integrated Circuit of FIG. 26A.

Figure 30:
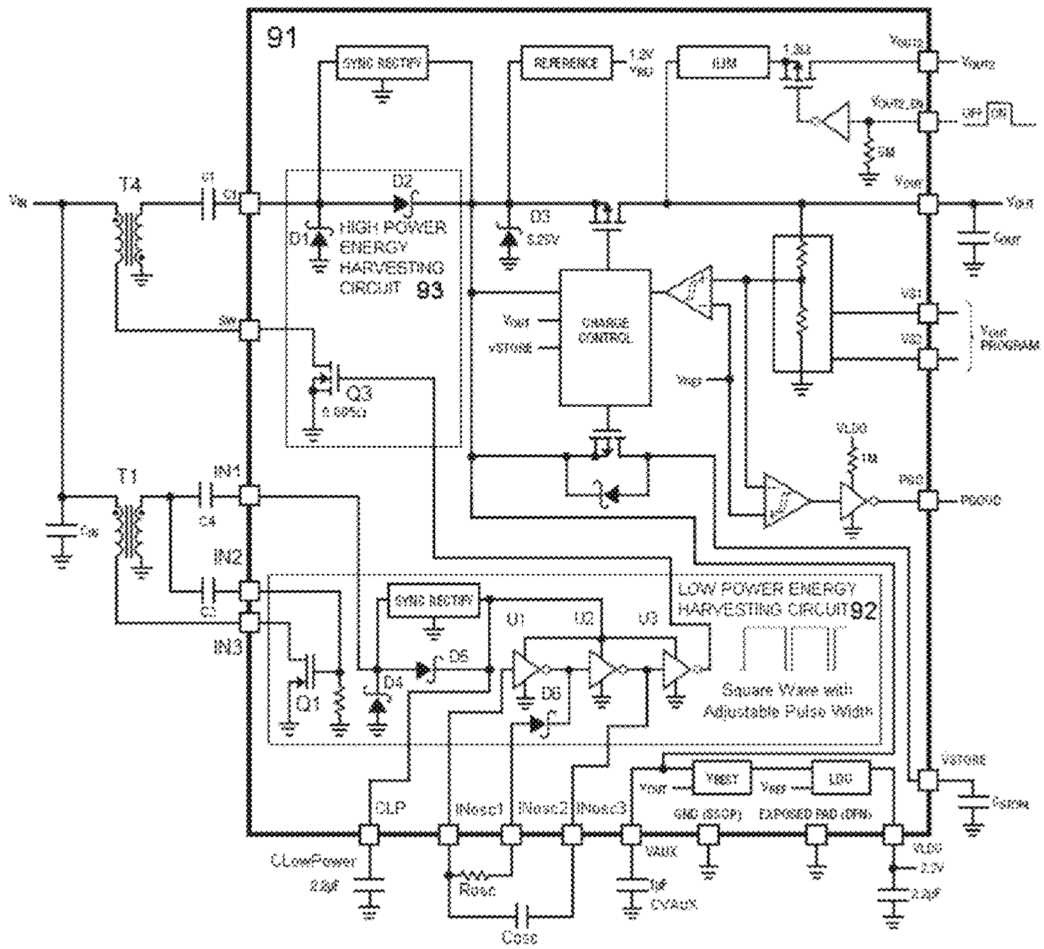
FIG. 30 shows a Square Wave triggered Flyback Converter Energy Harvesting System based on a modified version of the proposed Integrated Circuit of FIG. 26A. Here, the Low Power Energy Harvesting Circuit powers CMOS logic gates with adjustable Pulse Width and Duty Cycle >50% to provide the gate pulses to the High Power Energy Harvesting Circuit.
Figure 31:
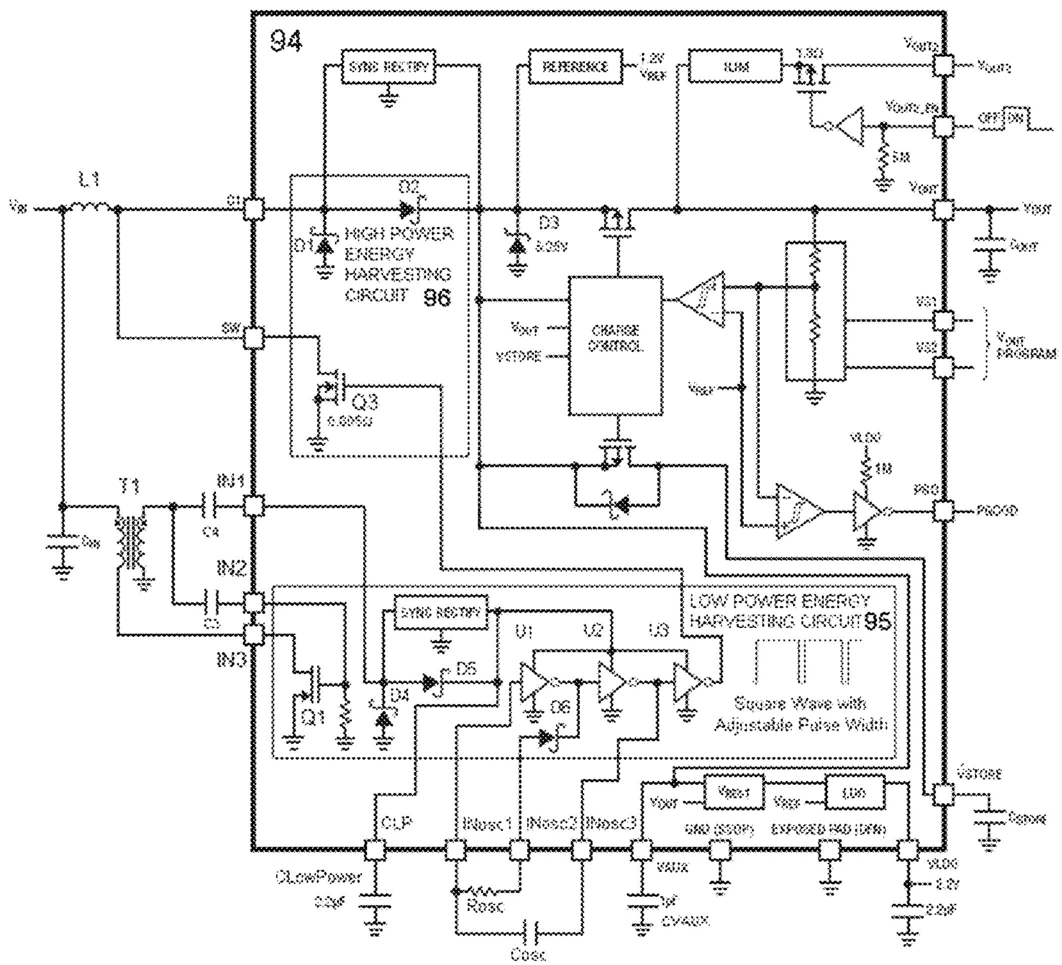
FIG. 31 shows a Square Wave triggered Boost Converter Energy Harvesting System based on a modified version of the proposed integrated Circuit of FIG. 26A. Here, the Low Power Energy Harvesting Circuit powers CMOS logic gates with adjustable Pulse Width and Duty Cycle >50% to provide the gate pulses to the High Power Energy Harvesting Circuit.

FIG. 30 shows a Square Wave triggered Flyback Converter Energy Harvesting System based on a modified version of the proposed integrated Circuit of FIG. 26A. Here, the Low Power Energy Harvesting Circuit '92' powers CMOS logic gates with adjustable Pulse Width and Duty Cycle >50% to provide the gate pulses to the High Power Energy Harvesting Circuit '93';

FIG. 31 shows a Square Wave triggered Boost Converter Energy Harvesting System based on a modified version of the proposed integrated Circuit of FIG. 26A. Here, the Low Power Energy Harvesting Circuit '95' powers CMOS logic gates with adjustable Pulse Width and Duty Cycle >50% to provide the gate pulses to the High Power Energy Harvesting Circuit '96';

FIGS. 30 and 31 show that an additional four pins are used: 'CLP' is for a small 2.2 μF (micro Farads) capacitor 'CLowPower' to provide a stable DC from the Low Power Energy Harvesting Circuit '92' to power the square wave generator. 'INosc1', 'INosc2' and 'INosc3' provide inputs for the resistor 'Rosc' and capacitor 'Cosc' to provide the duty cycle and frequency. The proposed energy harvesting IC of FIG. 26A is implemented in a 16-pin DFN package of footprint 5 mm×4 mm. With the additional four pins, the proposed IC with the gate triggered square wave of FIGS. 30 and 31 can be implemented in a 20-pin DFN package with a footprint of than 5.5 mm×4 mm.

Improving Power Output at Very Low Input Voltages Using Supercapacitors

To improve the power output further at such low voltages below 0.1 Volts and typically 20 mV to 25 mV, a supercapacitor can be used as a power reserve. The main purpose would to prevent voltage drop (when the system is loaded, the voltage will drop below 20 mV and the energy harvesting system will no longer operated. Supercapacitors, unlike batteries have a very high power density for their size. This means they have very low ESR (Electrical Series Resistance) For example, a good 10 Farad, 2.7 Volts capacitor has an ESR as low as 0.034 Ohms (34 mOhms). It has a length of 30 mm and diameter of 8 mm. This means that the short circuit current would be 1 Amp if it was discharged having a voltage of only 34 mV.

Referring to Eq. 4 again below, it can be seen the impact of the current in combination of the inductance can make to the back EMF voltage of the inductor:

$$V=LdI/dt \quad \text{(Eq. 4)}$$

Where V=the Back-EMF generated in Volts, L=inductance. I=Current, t=duration of time when power is removed from the inductor.

Particularly useful in combination with High Permeability Cores for the Flyback transformer and inductor. This also makes it ideal for use with various types of Peltier elements whose series resistance is higher than desired.

Using the Variable Duty Cycle Square Wave Generator to trigger a Flyback Converter or Boost Converter in combination with a supercapacitor terminated in parallel to the Peltier element the power gains can therefore be clearly seen. For example, using the preferred circuit of FIG. 29, Square Wave Triggered Boost Converter Energy Harvesting System, '86' a 10 Farad capacitor with 0.034 Ohms ESR charged using the Peltier which was then disconnected when the desired voltage was reached.

An Enhancement MOSFET 'Q2' of 0.005 Ohms RDS (ON) within the High Power Energy Harvesting Circuit '88' was used together with an inductor 'L1' with a low DC resistance of 0.01 Ohms. This gives a total DC resistance of:

$$R(\text{Supercapacitor})+R(\text{MOSFET})+R(\text{Inductor})=0.034+0.005+0.01=0.04 \text{ Ohms}$$

Allowing for circuit track resistance, this gives a total of 0.05 Ohms.

With this set up, various capacitors 'C4' were charged in the storage element '89' of FIG. 29 with the Power Regulator '90' disconnected. Tests were conducted to see what the initial voltage of the 10 Farad supercapacitor needed to be to charge the storage capacitors 1 second while maintaining a final voltage of at least 20 mV. The following results were obtained as shown in Table 2.

TABLE 2

Various capacitors charged using the Square Wave Triggered Boost Converter Energy Harvesting System of FIG. 29 with only a Supercapacitor terminated at the input.

| Storage Capacitor Value (μF) | Storage Capacitor Voltage (Volts) | Storage Capacitor Charge Time (Seconds) | 10 Farad Supercapacitor Initial Voltage (mV) | 10 Farad Supercapacitor Final Voltage (mV) |
|---|---|---|---|---|
| 100 μF | 2 Volts | 1 Second | 25 mV | 20 mV |
| | 4 Volts | 1 Second | 40 mV | 30 mV |
| 220 μF | 1.5 Volts | 1 Second | 25 mV | 20 mV |
| | 2.8 Volts | 1 Second | 40 mV | 30 mV |
| 470 μF | 1 Volt | 1 Second | 25 mV | 20 mV |
| | 2 Volts | 1 Second | 40 mV | 30 mV |
| | 3 Volts | 1 Second | 50 mV | 35 mV |
| 1000 μF | 1 Volt | 1 Second | 30 mV | 20 mV |
| | 1.5 Volts | 1 Second | 40 mV | 25 mV |
| | 1.8 Volts | 1 Second | 50 mV | 35 mV |

Body Heat Generated Power Source for Portable Electrical Equipment

It can be observed that the Body Heat Powered Square Wave Triggered Boost Converter Energy Harvesting System of FIG. 28 and in particular in combination with Supercapacitor terminated at the input provides high power outputs which allow the system to be used in applications further than the scope of wireless transmitters.

Figure 33:
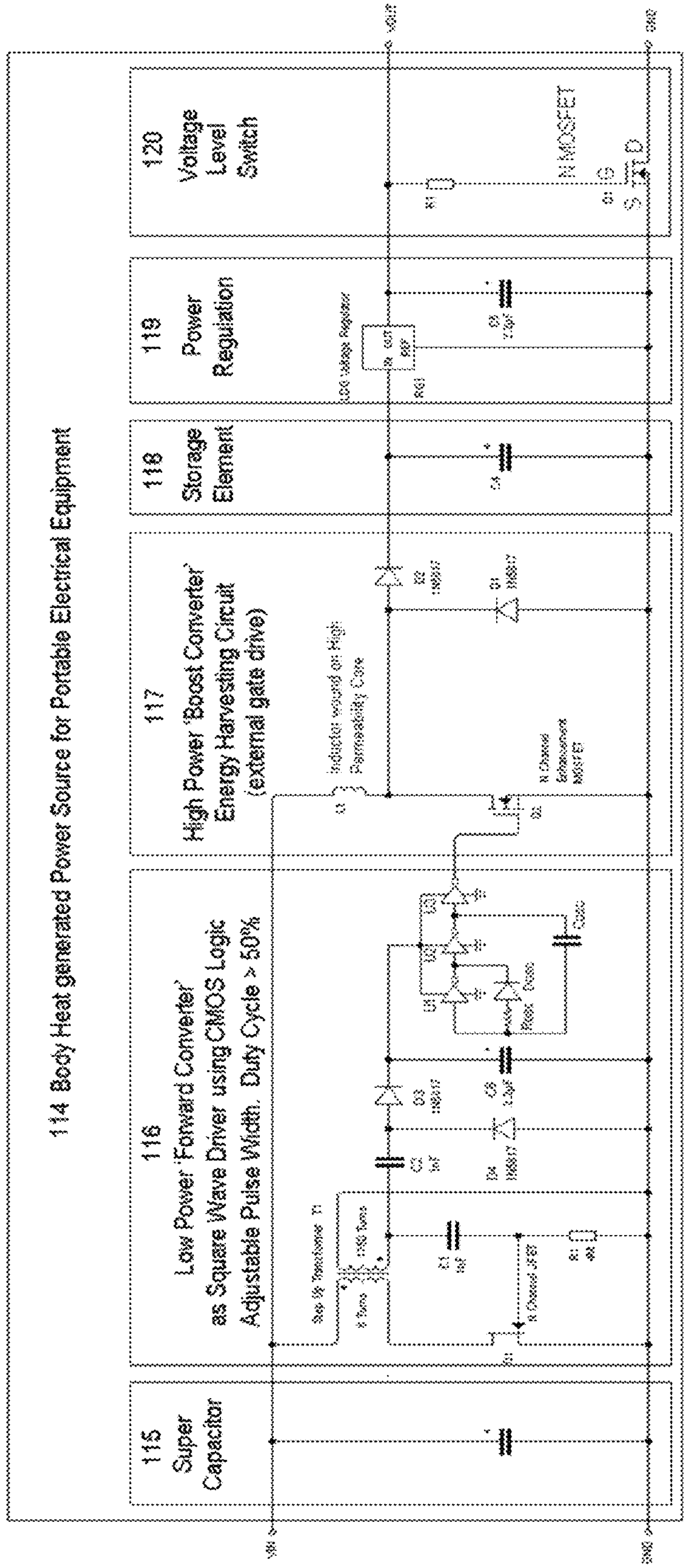
FIG. 33 shows a complete system of a Body Heat Generated Power Source for Portable Electrical Equipment.

FIG. 33 shows a complete system of a Body Heat Generated Power Source for Portable Electrical Equipment '114' based on Square Wave Triggered Boost Converter Energy Harvesting System. Here, the Low Power Energy Harvesting Circuit '116' provides the means to generate the square wave with >60% duty cycle to drive the N Channel Enhancement MOSFET 'Q2' in the High Power Boost Converter Energy Harvesting Circuit '117' which drives a low DC resistance Inductor 'L1' would on a high relative permeability core. The system is supplemented with a supercapacitor '115' terminated at the input in parallel to the TEG to provide a high current capability. The Storage Element '118' comprises a capacitor 'C4' is chosen such that it has the energy requirements of the portable electrical device to be directly powered or at a burst rate for wireless data transmission at a required interval. Alternatively, can charge a portable electrical device based on the minimum charge current. The Voltage Level Switch in '120' comprises a MOSFET chosen to have a threshold voltage that of the voltage requirements of the portable electrical device to be powered or charged.

Applications can include hand held portable electrical equipment such as a torch, which can also be worn on the head with the heat source from the forehead, or to charge a mobile phone or directly power a MP3 player. Such a device the size of a mobile phone could allow 10 TEGs, each 20 mm×20 mm and 0.2 Ohms. The system can be supplemented with a supercapacitor terminated to each TEG. A larger supercapacitor could be used or several 10 Farad ones each with an ESR of 0.034 Ohms. The device can also be integrated within the portable electrical appliance it is powering, particularly advantageously when implemented using the proposed Integrated Circuit as in FIG. 29 with the proposed high permeability core material transformer and inductor.

While embodiments of the invention have been illustrated and described, it is not intended that these embodiments illustrate and describe all possible forms of the invention. Rather, the words used in the specification are words of description rather than limitation, and it is understood that various changes may be made without departing from the scope of the invention.

It will be apparent to those skilled in the art that various modifications, combinations and variations can be made in the present invention without departing from the spirit or scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. A body heat powered wireless transmitter that comprises:

a wireless transmitter;

a Thermo Electric Generator to harness a user's body heat and convert the body heat to electrical energy; and an energy harvesting system to process the electrical energy to power the wireless transmitter to send data via wireless signal, wherein the energy harvesting system comprises a low power energy harvesting circuit and a high power energy harvesting circuit, wherein the Thermo Electric Generator is connected to and provides power to the energy harvesting system, the low power energy harvesting circuit is independent of the high power energy harvesting circuit and operates at a power level that is at least ten times lower than the high power energy harvesting circuit, the low power energy harvesting circuit output drives or triggers the high power energy harvesting circuit to deliver the electrical energy as output power to the wireless transmitter to send data, the high power energy harvesting circuit comprising one or more Enhancement Mode Metal Oxide Semiconductor Field Effect Transistors that have an RDSon of 0.1 ohms or less to operate with 20 milliVolts DC or less from the Thermo Electric Generator, whereby the output of the high power energy harvesting circuit powers the wireless transmitter from the user's body heat.

2. The body heat powered wireless transmitter as claimed in claim 1, wherein the low power energy harvesting circuit comprises:

one or more Depletion Mode Field Effect Transistors;

one or more Enhancement Mode Metal Oxide Semiconductor Field Effect Transistors; and one or more step up transformers:

wherein the one or more Depletion Mode Field Effect Transistor and one or more step up transformer form an oscillator that is tuned to a resonant frequency of the transformer wherein the output is used as either of the following while maintaining resonance:

i) to directly drive or trigger the High Power Energy Harvesting Circuit; or ii) as an internal Forward Converter which first charges a capacitor to provide at least 1 Volt Direct Current to power an internal Square Wave Generator which then drives or triggers the High Power Energy Harvesting Circuit.

3. The body heat powered wireless transmitter as claimed in claim 2, wherein the low power energy harvesting circuit comprises a transformer or inductor where the core material is nanocrystalline or amorphous magnetic alloy of a high relative permeability of at least 5000.

4. The body heat powered wireless transmitter as claimed in claim 1, wherein the high power energy harvesting circuit comprises one or more Enhancement Mode Metal Oxide Semiconductor Field Effect Transistors whose gate inputs are switched or triggered by the low power energy harvesting circuit.

5. The body heat powered wireless transmitter as claimed in claim 1, wherein the high power energy harvesting circuit comprises one or more of the following:

a) a Step up transformer;

b) a Flyback transformer; and c) an Inductor.

6. The body heat powered wireless transmitter as claimed in claim 5, wherein the high power energy harvesting circuit comprises a transformer or inductor where the core material is nanocrystalline or amorphous magnetic alloy of a high relative permeability of at least 5000.

7. The body heat powered wireless transmitter as claimed in claim 6, wherein the processing system is selected from the group comprising:

a. RF Remote Control System;

b. Keyfob Remote Control System;

c. Remote Keyless Entry (RKE) System;

d. Infra-Red Remote Control System;

e. RF ID Tag;

f. A Person Location System;

g. A Wireless Data Capture System;

h. A Wireless Health Monitoring System.

8. The body heat powered wireless transmitter as claimed in claim 1, wherein the body heat powered wireless transmitter comprises a processing system and a transmitter of a wireless signal the processing system and transmitter are powered by the output from the High Power Energy Harvesting Circuit.

9. The body heat powered wireless transmitter as claimed in claim 8, wherein the processing system comprises a Code Hopping Encoder of at least a 60-bit seed encrypted cipher.

10. The body heat powered wireless transmitter as claimed in claim 9, wherein the high power energy harvesting circuit comprises one or more Enhancement Mode Metal Oxide Semiconductor Field Effect Transistors that is switched by the Low Power Energy Harvesting Circuit.

11. The body heat powered wireless transmitter as claimed in claim 1, wherein the energy harvesting system comprises an Integrated Circuit comprising: one or more low power energy harvesting circuits; and one or more high power energy harvesting circuits.

12. The body heat powered wireless transmitter as claimed in claim 11, wherein the low power energy harvesting circuit comprises:

one or more Depletion Mode Field Effect Transistors;

a device being combined with an external step-up transformer to form an oscillator tuned to a Self Resonant Frequency of the step up transformer.

13. The body heat powered wireless transmitter as claimed in claim 1, wherein the energy harvesting system comprises a Peltier Module as the Thermo Electric Generator to harness body heat and convert it to electrical energy, the Thermo Electric Generator being of 0.5 Ohms internal resistance or less and a small size, of between 20 mm squared to 40 mm squared.

14. The body heat powered wireless transmitter as claimed in claim 1, further comprising a wearable band or garment which incorporates the Thermo Electric Generator arranged to hold it against the user's body.

15. The body heat powered wireless transmitter as claimed in claim 1, wherein a supercapacitor is terminated in parallel to the Thermo Electric Generator to provide a means to deliver power to the High Power Energy Harvesting Circuit at 20 milliVolts DC or less.

16. A portable body heat powered energy harvesting device that comprises:

a Thermo Electric Generator to harness a user's body heat and convert the body heat to electrical energy; and an energy harvesting system to process the electrical energy to charge or directly power a portable electrical appliance, wherein the energy harvesting system comprises a low power energy harvesting circuit and a high power energy harvesting circuit, wherein the Thermo Electric Generator is connected to the energy harvesting system to power it, the low power energy harvesting circuit is independent of the high power energy harvesting circuit and operates at a power level that is at least ten times lower than the high power energy harvesting circuit, the low power energy harvesting circuit output drives or triggers the high power energy harvesting circuit to deliver the electrical energy as output power to a wireless transmitter to send data, the high power energy harvesting circuit comprising one or more Enhancement Mode Metal Oxide Semiconductor Field Effect Transistors that have an RDSon of 0.1 ohms or less to operate with 20 milliVolts DC or less from the Thermo Electric Generator, whereby the output of the high power energy harvesting circuit powers or charges the portable electrical appliance.

* * * * *